(12) United States Patent
Gong et al.

(10) Patent No.: US 12,543,456 B2
(45) Date of Patent: Feb. 3, 2026

(54) DISPLAY PANEL AND METHOD FOR MANUFACTURING THE SAME, DISPLAY APPARATUS, AND TILED DISPLAY APPARATUS

(71) Applicant: BOE TECHNOLOGY GROUP CO., LTD., Beijing (CN)

(72) Inventors: Linhui Gong, Beijing (CN); Chao Liu, Beijing (CN); Haiwei Sun, Beijing (CN); Chuhang Wang, Beijing (CN); Lili Wang, Beijing (CN); Chaoyang Wang, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 576 days.

(21) Appl. No.: 17/926,791

(22) PCT Filed: Aug. 6, 2021

(86) PCT No.: PCT/CN2021/111259
§ 371 (c)(1),
(2) Date: Nov. 21, 2022

(87) PCT Pub. No.: WO2022/062723
PCT Pub. Date: Mar. 31, 2022

(65) Prior Publication Data
US 2023/0207733 A1    Jun. 29, 2023

(30) Foreign Application Priority Data

Sep. 24, 2020 (CN) .......................... 202011020278.7

(51) Int. Cl.
*H10K 59/131* (2023.01)
*G09F 9/302* (2006.01)
(Continued)

(52) U.S. Cl.
CPC ......... *H10K 59/131* (2023.02); *G09F 9/3026* (2013.01); *G09F 9/33* (2013.01);
(Continued)

(58) Field of Classification Search
CPC .... H10K 59/131; H10H 20/01; H10H 20/857; H10H 20/8312; G09F 9/3026; G09F 9/33; H01L 25/0753
See application file for complete search history.

(56) References Cited

U.S. PATENT DOCUMENTS

2019/0305073 A1   10/2019   Chen et al.
2020/0135126 A1   4/2020    Yokoyama et al.
(Continued)

FOREIGN PATENT DOCUMENTS

CN       102723445 A      10/2012
CN       106887468    *   6/2017
(Continued)

OTHER PUBLICATIONS

Extended European Search Report for corresponding EP Application No. 21871100.0, dated Jan. 5, 2024, 9 pages.
(Continued)

*Primary Examiner* — Mary Ellen Bowman
(74) *Attorney, Agent, or Firm* — Dority & Manning, P.A.

(57) ABSTRACT

A display panel includes a backplane, a plurality of light-emitting devices, a plurality of first electrodes, and a plurality of connection leads. The backplane includes a first main surface, a second main surface and a plurality of side surfaces, and at least one side surface is a selected side surface. The plurality of light-emitting devices and the plurality of first electrodes are disposed on the second main surface. The plurality of connection leads are disposed at least on the first main surface and the selected side surface. Each connection lead includes a first portion on the first
(Continued)

main surface and a second portion on the selected side surface, and a ratio of a thickness of the first portion to a thickness of the second portion is in a range of 0.6 and 1.6. Each connection lead is electrically connected to a first electrode.

20 Claims, 27 Drawing Sheets

(51) Int. Cl.
  *G09F 9/33* (2006.01)
  *H01L 25/075* (2006.01)
  *H10H 20/01* (2025.01)
  *H10H 20/831* (2025.01)
  *H10H 20/857* (2025.01)

(52) U.S. Cl.
  CPC ......... *H01L 25/0753* (2013.01); *H10H 20/01* (2025.01); *H10H 20/8312* (2025.01); *H10H 20/857* (2025.01); *H10H 20/032* (2025.01); *H10H 20/0364* (2025.01)

(56) References Cited

U.S. PATENT DOCUMENTS

| | | | | |
|---|---|---|---|---|
| 2020/0163246 A1* | 5/2020 | Yueh | .................. | G09G 3/32 |
| 2020/0201392 A1 | 6/2020 | Yu et al. | | |
| 2020/0271979 A1* | 8/2020 | Roh | .................. | G02F 1/13452 |
| 2020/0372850 A1* | 11/2020 | He | .................. | G06F 1/16 |
| 2021/0296394 A1 | 9/2021 | Meng et al. | | |
| 2021/0399185 A1* | 12/2021 | Liu | .................. | G02F 1/1345 |
| 2023/0147186 A1 | 5/2023 | Hsu et al. | | |

FOREIGN PATENT DOCUMENTS

| | | | |
|---|---|---|---|
| CN | 106887468 | A | 6/2017 |
| CN | 107799550 | * | 3/2018 |
| CN | 108267903 | * | 7/2018 |
| CN | 108957878 | A | 12/2018 |
| CN | 110503898 | A | 11/2019 |
| CN | 20978710 | * | 12/2019 |
| CN | 209728710 | U | 12/2019 |
| CN | 110928004 | A | 3/2020 |
| CN | 212256800 | U | 12/2020 |
| EP | 3343274 | A2 | 7/2018 |
| JP | 2014157400 | A | 8/2014 |

OTHER PUBLICATIONS

Decision of Reexamination (with English translation) received in corresponding Taiwan Application No. 109146322, dated Sep. 21, 2022, 6 pages.
Decision of Rejection (with English translation) received in corresponding Taiwan Application No. 109146322, dated Mar. 18, 2022, 8 pages.
International Search Report and Written Opinion (with English translation) received in corresponding Application No. PCT/CN2021/111259, dated Nov. 11, 2021, 18 pages.
Office Action (with English translation) received in corresponding Taiwan Application No. 109146322, dated Nov. 2, 2021, 24 pages.

* cited by examiner

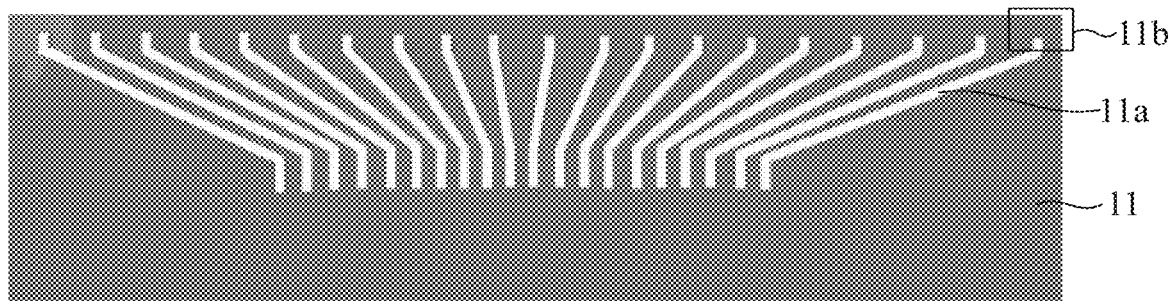

FIG. 21B

```
┌─────────────────────────────────────────────┐
│ Provide a flexible mask on the first main   │
│ surface and the selected side surface of    │
│ the backplane, the flexible mask being      │
│ configured to expose regions of the first   │
│ main surface and the selected side surface  │
│ of the backplane where the plurality of     │
│ connection leads need to be disposed        │
└─────────────────────────────────────────────┘ — S4-1
                     ↓
┌─────────────────────────────────────────────┐
│ Deposit metal on the first main surface and │
│ selected side surface of the backplane to   │
│ form a metal layer                          │
└─────────────────────────────────────────────┘ — S4-2
                     ↓
┌─────────────────────────────────────────────┐
│ Remove the flexible mask to form the        │
│ plurality of connection leads; each         │
│ connection lead in the formed plurality of  │
│ connection leads passing through the first  │
│ transition sub-surface and the side         │
│ sub-surface of the selected side surface in │
│ sequence from the first main surface of the │
│ backplane to be electrically connected to   │
│ the first electrode in the plurality of     │
│ first electrodes                            │
└─────────────────────────────────────────────┘ — S4-3
```

FIG. 22

DISPLAY PANEL AND METHOD FOR MANUFACTURING THE SAME, DISPLAY APPARATUS, AND TILED DISPLAY APPARATUS

CROSS-REFERENCE TO RELATED APPLICATIONS

This application is a national phase entry under 35 USC 371 of International Patent Application No. PCT/CN2021/111259, filed on Aug. 6, 2021, which claims priority to Chinese Patent Application No. 202011020278.7, filed on Sep. 24, 2020, which are incorporated herein by reference in their entirety.

TECHNICAL FIELD

The present disclosure relates to the field of display technologies, and in particular, to a display panel and a method for manufacturing the same, a display apparatus and a tiled display apparatus.

BACKGROUND

A mini organic light-emitting diode (mini OLED) display apparatus has advantages of high brightness, clear display pictures and low power consumption, and has a good application prospect. It may be applied in a large-scale tiled display apparatus, and a size of a seam in the tiled display apparatus is a major factor affecting the display effect. Therefore, a display apparatus with a narrow bezel becomes one of development trends.

SUMMARY

In an aspect, a display panel is provided. The display panel includes a backplane, a plurality of light-emitting devices, a plurality of first electrodes and a plurality of connection leads. The backplane includes a first main surface and a second main surface that are opposite to each other, and a plurality of side surfaces each connecting the first main surface and the second main surface. At least one side surface in the plurality of side surfaces is a selected side surface.

The plurality of light-emitting devices are disposed on the second main surface of the backplane. The plurality of first electrodes are disposed on the second main surface of the backplane. The plurality of first electrodes are closer to the selected side surface than the plurality of light-emitting devices, and the plurality of first electrodes are electrically connected to the plurality of light-emitting devices. The plurality of connection leads are disposed at least on the first main surface and the selected side surface of the backplane. Each connection lead in the plurality of connection leads includes a first portion located on the first main surface and a second portion located on the selected side surface, and a ratio of a thickness of the first portion to a thickness of the second portion is in a range of 0.6 to 1.6, inclusive. The connection lead passes through the selected side surface from the first main surface to be electrically connected to a first electrode in the plurality of first electrodes.

In some embodiments, the selected side surface includes a side sub-surface substantially perpendicular to the first main surface and the second main surface, and a first transition sub-surface connecting the first main surface and the side sub-surface. In a cross-section of the backplane perpendicular to the first main surface and perpendicular to an edge of the backplane where the side sub-surface is located, an included angle between a tangent at any point on the first transition sub-surface and the first main surface is greater than 90°, and another included angle between the tangent at any point on the first transition sub-surface and the side sub-surface is greater than 90°. The connection lead passes through the first transition sub-surface and the side sub-surface of the selected side surface in sequence from the first main surface to be electrically connected to the first electrode in the plurality of first electrodes.

In some embodiments, an end of the first electrode proximate to the selected side surface is substantially flush with a side edge of the second main surface proximate to the selected side surface. The connection lead passes through the first transition sub-surface and the side sub-surface of the selected side surface in sequence from the first main surface, and extends to the side edge of the second main surface proximate to the selected side surface to be electrically connected to the first electrode.

In some embodiments, an end of the first electrode proximate to the selected side surface and a side edge of the second main surface proximate to the selected side surface have a distance therebetween. The connection lead further includes a third portion located on the second main surface, and a ratio of a thickness of the third portion to a thickness of the second portion is in a range of 0.6 to 1.6, inclusive. The connection lead passes through the first transition sub-surface and the side sub-surface of the selected side surface in sequence from the first main surface, and extends to the second main surface to be electrically connected to the first electrode.

In some embodiments, the selected side surface further includes a second transition sub-surface connecting the side sub-surface and the second main surface. In the cross-section of the backplane perpendicular to the first main surface and perpendicular to the edge of the backplane where the side sub-surface is located, an included angle between a tangent at any point on the second transition sub-surface and the second main surface is greater than 90°, and an included angle between a tangent at any point on the second transition sub-surface and the side sub-surface is greater than 90°. The connection lead passes through the first transition sub-surface, the side sub-surface and the second transition sub-surface of the selected side surface in sequence from the first main surface to be electrically connected to the first electrode.

In some embodiments, the first transition sub-surface is a plane surface or a curved surface. In a case where the selected side surface further includes a second transition sub-surface, the second transition sub-surface is another plane surface or another curved surface.

In some embodiments, the display panel further includes a plurality of second electrodes disposed on the first main surface. Each connection lead in the plurality of connection leads is electrically connected to a second electrode in the plurality of second electrodes.

In some embodiments, orthographic projections, on the first main surface, of a first electrode and a second electrode that are electrically connected to a same connection lead at least partially overlap.

In some embodiments, the first main surface of the backplane has a bonding region. Portions of the plurality of connection leads located on the first main surface extend to the bonding region.

In some embodiments, a length of the bonding region is substantially equal to a length of a side edge of the first main surface proximate to the selected side surface. In a direction from the side edge of the first main surface proximate to the selected side surface to the bonding region, the portions of the plurality of connection leads located on the first main surface extend to the bonding region. Alternatively, the length of the bonding region is less than the length of the side edge of the first main surface proximate to the selected side surface. In the direction from the side edge of the first main surface proximate to the selected side surface to the bonding region, the portions of the plurality of connection leads located on the first main surface converge on the bonding region.

In some embodiments, the display panel further includes a plurality of signal lines disposed on the second main surface of the backplane. The plurality of first electrodes are electrically connected to the plurality of light-emitting devices through the plurality of signal lines. A width of the first electrode is substantially same as a width of a signal line electrically connected thereto. In a case where the connection lead further includes a third portion located on the second main surface, a width of the third portion is substantially same as a width of a signal line electrically connected thereto.

In some embodiments, a width of the first portion of the connection lead is substantially same as the width of the third portion of the connection lead. A width of the second portion of the connection lead is greater than the width of the first portion of the connection lead and greater than the width of the third portion of the connection lead.

In some embodiments, the at least one side surface as the selected side surface includes at least two side surfaces as selected side surfaces. Portions of at least part of the plurality of connection leads located on a same selected side surface are arranged at equal intervals in a direction parallel to an edge of the backplane where a side sub-surface of the same selected side surface is located. A distance between two adjacent connection leads in connection leads located on a selected side surface in the at least two side surfaces is different from another distance between two adjacent connection leads in connection leads located on another selected side surface in the at least two side surfaces.

In some embodiments, the plurality of connection leads are formed through a laser etching process, and the display panel further includes an energy absorbing film. The energy absorbing film is disposed between the backplane and the plurality of connection leads.

In some embodiments, a material of the energy absorbing film includes at least one of tin dioxide and zinc oxide.

In some embodiments, each connection lead in the plurality of connection leads includes a first buffer conductive pattern, a main conductive pattern and a second buffer conductive pattern that are sequentially stacked, and the first buffer conductive pattern is closer to the backplane than the main conductive pattern. Adhesion between the first buffer conductive pattern and the backplane is greater than adhesion between the main conductive pattern and the backplane. Oxidation resistance of the second buffer conductive pattern is greater than oxidation resistance of the main conductive pattern.

In some embodiments, a material of the first buffer conductive pattern is same as a material of the second buffer conductive pattern, and the material of the first buffer conductive pattern and the material of the second buffer conductive pattern each include at least one of titanium, germanium, molybdenum and molybdenum-niobium ahoy.

In some embodiments, the display panel further includes a first protective adhesive layer, the first protective adhesive layer covers the plurality of connection leads.

In some embodiments, the display panel further includes a second protective adhesive layer disposed on a side of the plurality of light-emitting devices facing away from the backplane. The second protective adhesive layer covers the plurality of light-emitting devices and the plurality of first electrodes, and fills gap regions between the plurality of light-emitting devices and the plurality of first electrodes.

In another aspect, a display apparatus is provided. The display apparatus includes the display panel as described in the above aspect, and a driver chip. The driver chip is disposed on the first main surface of the backplane of the display panel, and the driver chip is electrically connected to the plurality of first electrodes in the display panel through the plurality of connection leads in the display panel.

In some embodiments, in a case where the display panel further includes a plurality of second electrodes disposed on the first main surface, and each connection lead in the plurality of connection leads is electrically connected to a second electrode in the plurality of second electrodes, the driver chip is electrically connected to the plurality of second electrodes. Alternatively, the driver chip is electrically connected to a portion of each of the plurality of connection leads located on the first main surface of the backplane.

In yet another aspect, a tiled display apparatus is provided. The tiled display apparatus includes a plurality of display apparatuses as described above, and the plurality of display apparatuses are tiled together.

In yet another aspect, a method for manufacturing a display panel is provided. The method includes following steps. An initial backplane is provided, the initial backplane includes a first main surface and a second main surface that are opposite to each other, and a plurality of side faces each connecting the first main surface and the second main surface, and the plurality of side faces are substantially perpendicular to the first main surface and the second main surface. A plurality of first electrodes are formed on the second main surface of the initial backplane, the plurality of first electrodes are proximate to at least one side face in the plurality of side faces, and the at least one side face is a selected side surface.

A boundary portion between the first main surface and the selected side face of the initial backplane is processed to make the boundary portion form a first transition sub-surface, so as to obtain a backplane. The backplane includes the first main surface and the second main surface, and a plurality of side surfaces each connecting the first main surface and the second main surface, the plurality of side surfaces are formed by the plurality of side faces, and at least one side surface formed by the selected side face in the plurality of side surfaces is a selected side surface. The selected side surface includes the side sub-surface substantially perpendicular to the first main surface and the second main surface, and the first transition sub-surface connecting the first main surface and the side sub-surface. In a cross-section of the backplane perpendicular to the first main surface and perpendicular to an edge of the backplane where the side sub-surface is located, an included angle between a tangent at any point on the first transition sub-surface and the first main surface is greater than 90°, and an included angle between a tangent at any point on the first transition sub-surface and the side sub-surface is greater than 90°.

A plurality of connection leads are formed at least on the first main surface and the selected side surface of the backplane. Each connection lead in the plurality of connection leads includes a first portion located on the first main surface and a second portion located on the selected side surface, and a ratio of a thickness of the first portion to a thickness of the second portion is in a range of 0.6 to 1.6, inclusive. The connection lead passes through the first transition sub-surface and the side sub-surface of the selected side surface in sequence from the first main surface to be electrically connected to a first electrode in the plurality of first electrodes.

In some embodiments, forming the plurality of connection leads at least on the first main surface and the side surface of the backplane, includes:

forming a metal layer at least on the first main surface and the selected side surface of the backplane, the metal layer being in contact with the plurality of first electrodes; and patterning the metal layer to form the plurality of connection leads.

In some embodiments, the plurality of connection leads include portions located on the selected side surface of the backplane and portions located on the first main surface of the backplane. Forming the plurality of connection leads at least on the first main surface and the selected side surface of the backplane includes:

forming a metal layer on the selected side surface of the backplane; patterning the metal layer to obtain the portions of the plurality of connection leads located on the selected side surface of the backplane;

providing a mask on the first main surface of the backplane, the mask being configured to expose regions of the first main surface of the backplane where the plurality of connection leads need to be disposed; depositing metal on the first main surface of the backplane to form another metal layer; and removing the mask to form the portions of the plurality of connection leads located on the first main surface of the backplane, so as to obtain the plurality of connection leads, the portions of the plurality of connection leads located on the first main surface of the backplane being electrically connected to the portions of the plurality of connection leads located on the selected side surface of the backplane.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method, and an actual timing of a signal involved in the embodiments of the present disclosure.

FIG. 21B is a diagram showing a structure of another mask used in a method for manufacturing a display panel, in accordance with some embodiments of the present disclosure;

FIG. 22 is a flow diagram of yet another method for manufacturing a display panel, in accordance with some embodiments of the present disclosure;

DETAILED DESCRIPTION

Figure 1:
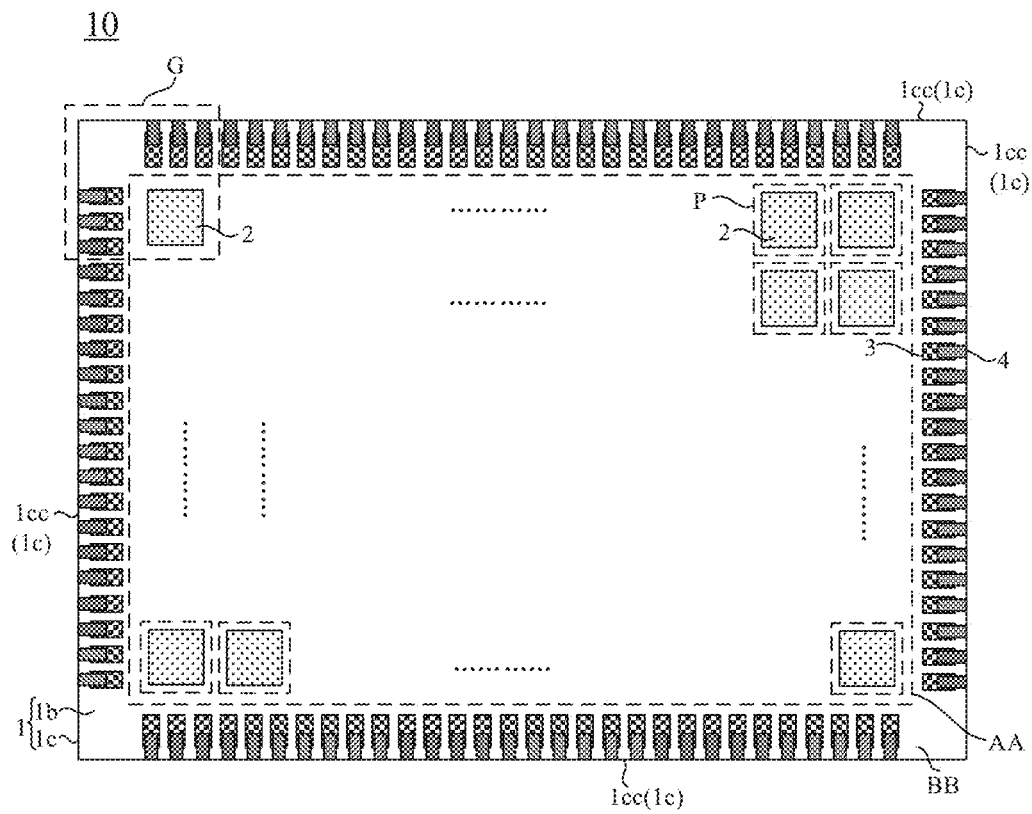
FIG. 1 is a diagram showing a front structure of a display panel, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein indicates an open and inclusive expression, which does not exclude devices that are applicable to or configured to perform additional tasks or steps.

In addition, the phase "based on" as used herein is meant to be open and inclusive, since a process, step, calculation or other action that is "based on" one or more of the stated conditions or values may, in practice, be based on additional conditions or values other than those stated.

The term "about" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of a measurement system).

Exemplary embodiments are described herein with reference to sectional views and/or plan views as idealized exemplary accompanying drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Thus, the regions shown in the accompanying drawings are schematic in nature, and their shapes are not intended to show actual shapes of regions in a device, and are not intended to limit the scope of the exemplary embodiments.

A display apparatus includes a display panel and a driver chip. The driver chip is a driver integrated circuit (IC) for driving the display panel for display. The driver chip includes, for example, gate driver circuit(s), source driver circuit(s), a timing controller, and a power supply circuit. The driver chip is electrically connected to the display panel, and is configured to output corresponding signals to control the display panel for display.

In some embodiments, the display panel includes a display region and a peripheral region that is located on at least one side of the display region. The peripheral region includes a bonding region, and the driver chip is bonded to the display panel in the bonding region. That is to say, the bonding region is disposed on a display surface (a front face) of the display panel, the driver chip is bonded to the front face of the display panel, and an area of the peripheral region of the display panel cannot be reduced. As a result, the display apparatus has a wide bezel, so that an ultra-narrow bezel cannot be realized, and a screen-to-body ratio of the display apparatus cannot increase, either.

In sight of this, some embodiments of the present disclosure provide a display panel, a display apparatus, and a tiled display apparatus. By arranging a plurality of connection leads each connecting two opposite main surfaces of a backplane in the display panel, the bonding region may be transferred to a non-display surface (a back face) of the display panel, and the driver chip is bonded to the back face of the display panel. As a result, the area of the peripheral region of the display panel may be reduced, the bezel of the display apparatus may become small, and further a width of a seam of the tiled display apparatus to which the display apparatus is applied may be reduced, thereby realizing seamless tiling and improving display quality.

The display panel, the display apparatus and the tiled display apparatus provided by the embodiments of the present disclosure will be introduced below.

Figure 2A:
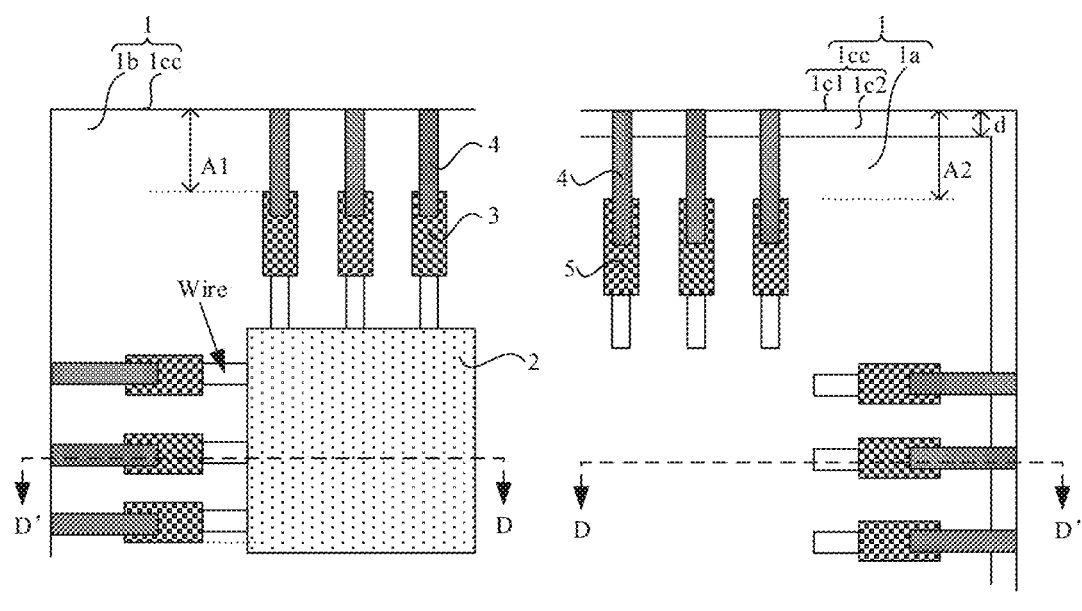
FIG. 2A is enlarged views of a front face and a back face of a region G of the display panel shown in FIG. 1.

In the embodiments of the present disclosure, FIGS. 1, 3, 11A and 11B are diagrams each showing a planar structure of a display panel 10, part (a) in FIG. 2A is an enlarged view of a front face of a region G of the display panel shown in FIG. 1, and part (b) in FIG. 2A is an enlarged view of a back face of the region G of the display panel shown in FIG. 1. FIGS. 5A, 7A, 8A, 9A and 9B are each a cross-sectional view of a display panel 10 taken along the section line DD' in FIG. 2A. For convenience of description for a structure of a backplane 1, structures of a first electrode 3, a light-emitting device 2, a connection lead 4 and the like in the display panel in FIG. 5A are removed to obtain the backplane 1 shown in FIGS. 4A to 4C.

Some embodiments of the present disclosure provide a display panel 10. As shown in FIGS. 1, 3, 11A and 11B, the display panel 10 includes a display region AA (also referred to as an active area (AA) or an effective display region) and a peripheral region BB located on at least one side of the display region AA.

In the display panel 10, the display region AA is provided with a plurality of pixels P' and a plurality of signal lines therein, and the plurality of signal lines are electrically connected to the plurality of pixels. For example, each pixel includes sub-pixels P of at least three colors, and the sub-pixels P of colors include at least a sub-pixel of a first color, a sub-pixel of a second color and a sub-pixel of a third color. The first color, the second color and the third color are three primary colors (e.g., red, green and blue).

As shown in FIGS. 1 to 3 and 5A, in some embodiments, the display panel 10 includes the backplane 1, a plurality of light-emitting devices 2, a plurality of first electrodes 3 and the plurality of connection leads 4.

Figure 3:
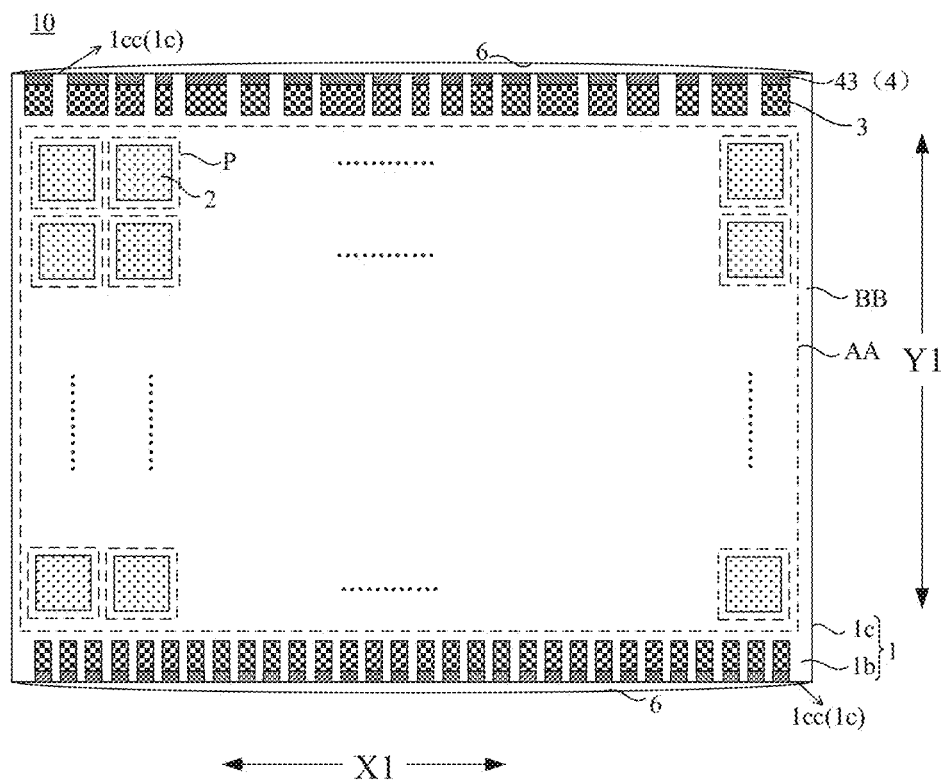
FIG. 3 is a diagram showing a front structure of another display panel, in accordance with some embodiments of the present disclosure.
Figure 4A:
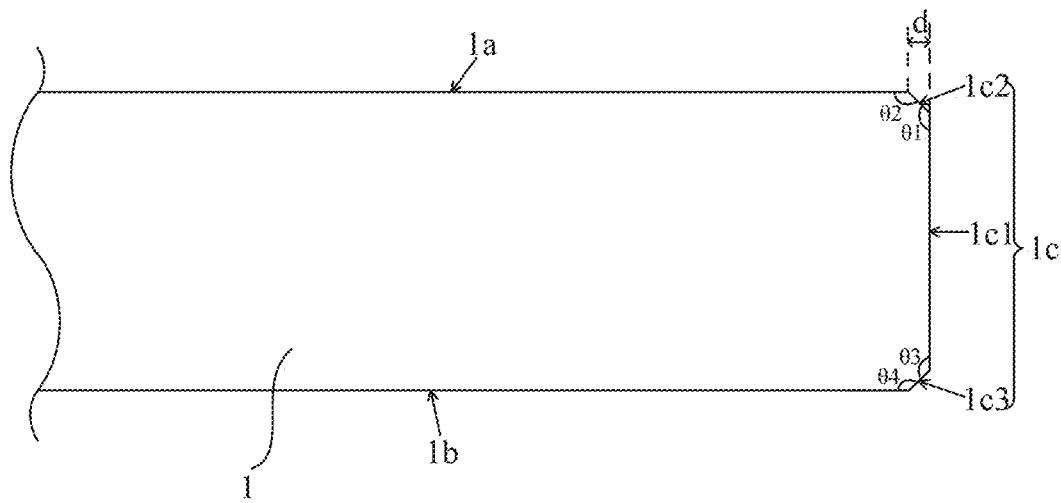
FIG. 4A is a diagram showing a structure of a backplane in a display panel, in accordance with some embodiments of the present disclosure.
Figure 4B:
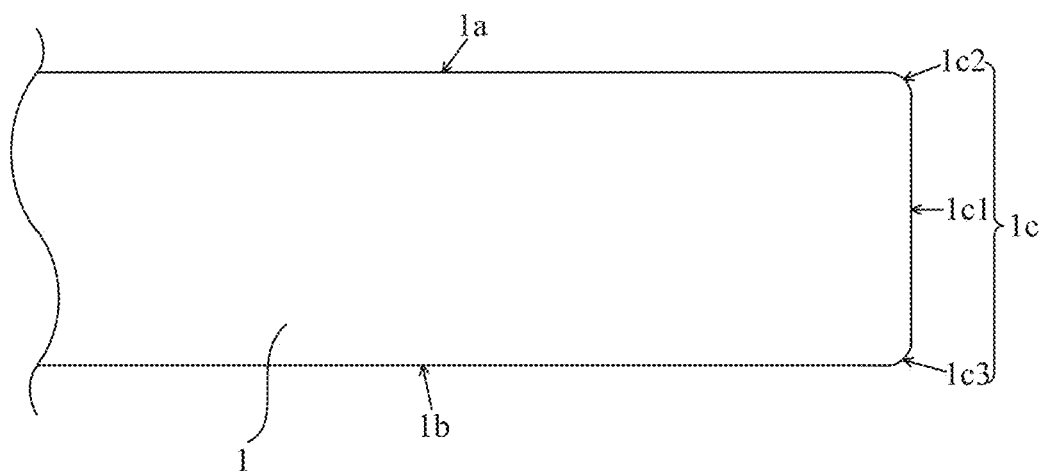
FIG. 4B is a diagram showing a structure of another backplane in another display panel, in accordance with some embodiments of the present disclosure.
Figure 4C:
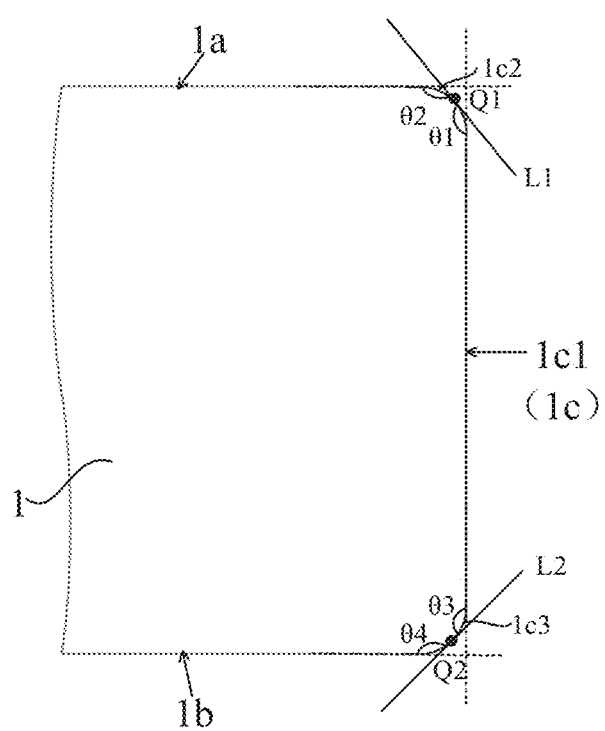
FIG. 4C is a schematic diagram of an included angle of a backplane in a display panel, in accordance with some embodiments of the present disclosure.
Figure 5A:
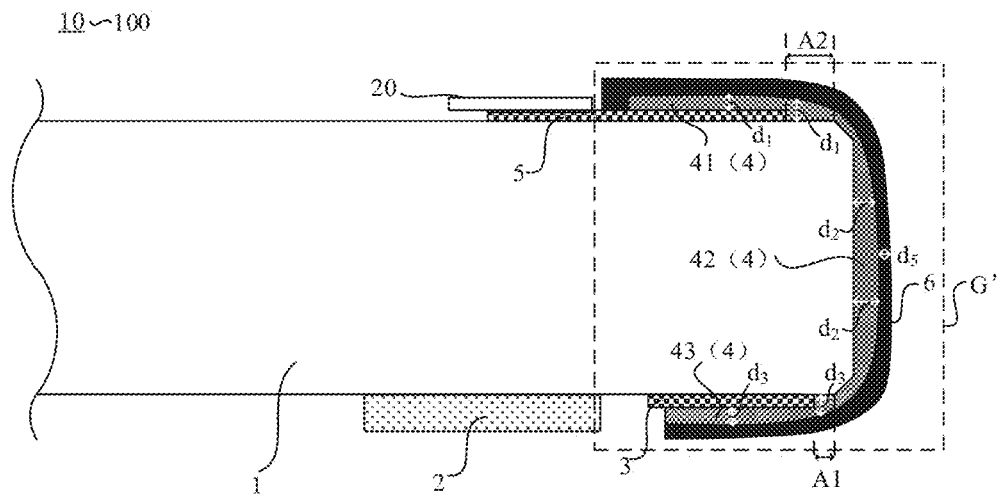
FIG. 5A is a cross-sectional view showing a structure of a display panel, in accordance with some embodiments of the present disclosure.

Referring to FIGS. 4A to 4C, the backplane 1 includes a first main surface 1a and a second main surface 1b that are opposite to each other, and a plurality of side surfaces 1c each connecting the first main surface 1a and the second main surface 1b. At least one side surface 1c in the plurality of side surfaces 1c is a selected side surface 1cc. As shown in FIGS. 1 and 3, the first main surface 1a and the second main surface 1b of the backplane 1 are each in a shape of, for example, a rectangle, and the backplane 1 includes four side surfaces 1c.

For example, the backplane 1 includes a substrate and a driving circuit layer disposed on a side of the substrate. The substrate may be made of a rigid material such as glass, quartz, or plastic. The driving circuit layer includes, for example, structures such as thin film transistors (TFTs) and the above plurality of signal lines. The driving circuit layer is coupled to the plurality of light-emitting devices 2, and configured to drive the plurality of light-emitting devices 2 to emit light.

As shown in FIGS. 1, 3 and 5A, the plurality of light-emitting devices 2 are disposed on the second main surface 1b of the backplane 1. The light-emitting devices 2 include, but are not limited to organic light-emitting diodes (OLEDs), mini light-emitting diodes (mini LEDs) and micro light-emitting diodes (micro LEDs). For example, each sub-pixel P includes at least one light-emitting device 2.

The plurality of first electrodes 3 are disposed on the second main surface 1b of the backplane 1. The plurality of first electrodes 3 are closer to the selected side surface 1cc than the plurality of light-emitting devices 2, and the plurality of first electrodes 3 are electrically connected to the plurality of light-emitting devices 2. For example, the plurality of light-emitting devices 2 are disposed in the display region AA of the display panel 10, and the plurality of first electrodes 3 are disposed in the peripheral region BB of the display panel 10. The plurality of first electrodes 3 are electrically connected to the plurality of light-emitting devices 2 through the driving circuit layer.

For example, as shown in FIGS. 1 and 3, the plurality of first electrodes 3 are disposed at a position of the second main surface 1b proximate to the selected side surface 1cc. That is to say, the plurality of first electrodes 3 are closer to a side edge, in four side edges of the first main surface 1a, connected to the selected side surface 1cc.

Figure 5B:
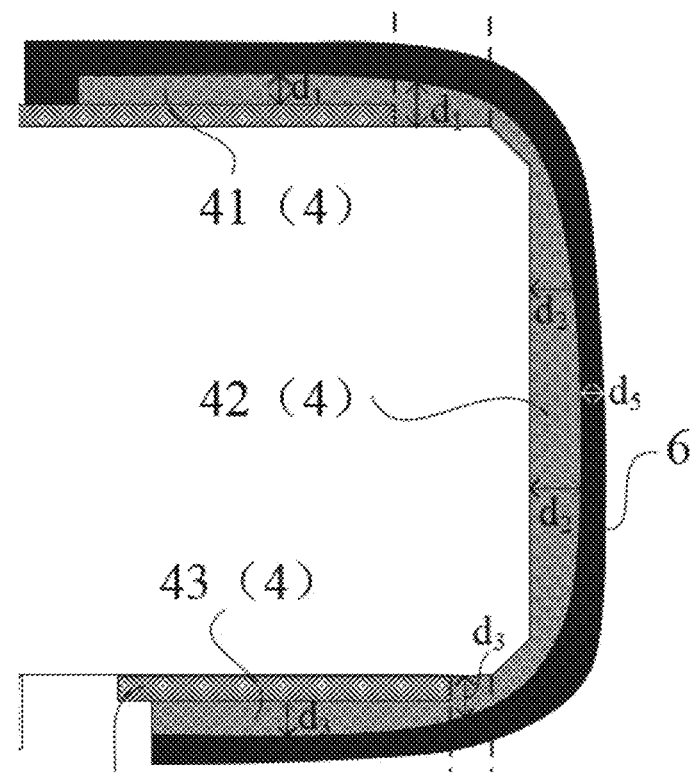
FIG. 5B is an enlarged view of a region G' of the display panel shown in FIG. 5A.
Figure 6:
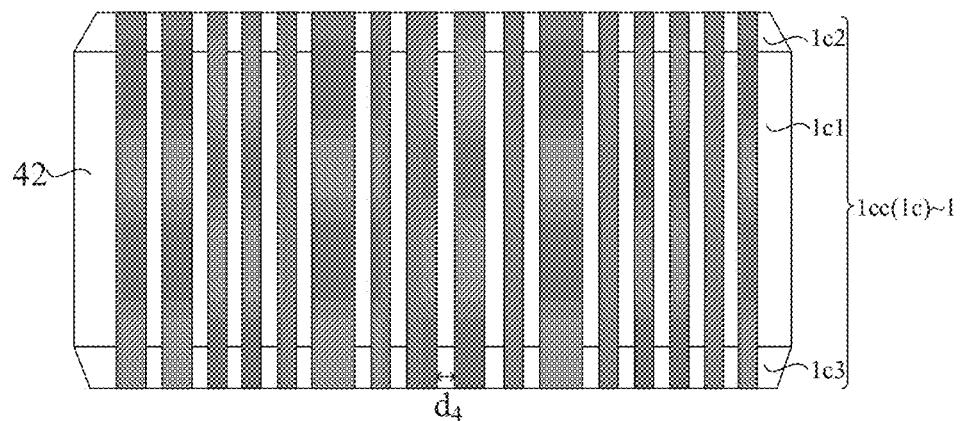
FIG. 6 is a diagram showing a structure of a side surface of the display panel shown in FIG. 5A.

As shown in FIGS. 5A to 6, the plurality of connection leads 4 are disposed at least on the first main surface 1a and the selected side surface 1cc of the backplane 1. Each connection lead 4 in the plurality of connection leads 4 includes at least a first portion 41 located on the first main surface 1a and a second portion 42 located on the selected side surface 1cc. A ratio of a thickness $d_1$ of the first portion 41 to a thickness $d_2$ of the second portion 42 is in a range of 0.6 to 1.6, inclusive. Each connection lead passes through the selected side surface 1cc from the first main surface 1a to be electrically connected to a first electrode 3 in the plurality of first electrodes 3.

As shown in FIG. 5B, the first portion 41 is a portion of the connection lead 4 located on the first main surface 1a. The first portion 41 includes a portion of the connection lead 4 in direct contact with the first main surface 1a. In a case where there is an overlapping portion between the connection lead 4 and a second electrode 5 used for achieving electrical connection with the driver chip or a flexible printed circuit, the first portion 41 further includes a portion on a surface of the second electrode 5 away from the first main surface 1a. The thickness $d_1$ of the first portion 41 refers to a dimension of the first portion 41 in a direction perpendicular to the first main surface 1a. For example, the thickness $d_1$ of the first portion 41 may be a thickness at any position of the first portion 41. For example, FIG. 5B illustrates thicknesses $d_1$ of two positions of the first portion 41. The second portion 42 is a portion of the connection lead 4 located on the selected side surface 1cc. The thickness $d_2$ of the second portion 42 refers to a dimension of the second portion 42 in a direction perpendicular to a side sub-surface 1c1 of the selected side surface 1cc. For example, the thickness $d_2$ of the second portion 42 may be a thickness at any position of the second portion 42. For example, FIG. 5B illustrates thicknesses $d_2$ of two positions of the second portion 42.

The ratio of the thickness $d_1$ of the first portion 41 of each connection lead 4 to the thickness $d_2$ of the second portion 42 of each connection lead 4 is in the range of 0.6 to 1.6, inclusive. In some embodiments, the thickness $d_2$ of the second portion 42 may be greater than the thickness $d_1$ of the first portion 41, and a difference between the thickness $d_2$ of the second portion 42 and the thickness $d_1$ of the first portion 41 is in a certain range. It will be noted that, for each connection lead 4, a ratio of the thickness $d_1$ at any position of the first portion 41 to the thickness $d_2$ at any position of the second portion 42 is in the above range. For example, a radio of a minimum thickness $d_1$ of the first portion 41 to a maximum thickness $d_2$ of the second portion 42 is 0.6. In this way, the uniformity of a film thickness of the connection lead 4 may be ensured, so that the difference between the thickness of the first portion 41 of the connection lead 4 and the thickness of the second portion 42 of the connection lead 4 is small, thereby improving connection stability of the plurality of connection leads, and realizing effective signal transmission.

For example, the ratio of the thickness $d_1$ of the first portion 41 of each connection lead 4 to the thickness $d_2$ of the second portion 42 of each connection lead 4 may be 0.6, 0.8, 0.9, 1.1, or the like. For example, the thickness $d_2$ of the second portion 42 is greater than or equal to 900 nm and less than or equal to 1100 nm, and the thickness $d_1$ of the first portion 41 is greater than or equal to 660 nm and less than 900 nm. For example, the thickness $d_2$ of the second portion 42 is 1100 nm, and the thickness $d_1$ of the first portion 41 is 660 nm. Alternatively, the thickness $d_2$ of the second portion 42 is 1020 nm, and the thickness $d_1$ of the first portion 41 is 816 nm. Alternatively, the thickness $d_2$ of the second portion 42 is 1000 nm, and the thickness $d_1$ of the first portion 41 is 850 nm.

The number of the plurality of connection leads 4 is equal to that of the plurality of first electrodes 3. Each connection lead 4 passes through the selected side surface 1cc from the first main surface 1a to be electrically connected to a first electrode 3, so that the first electrode 3 extends to the first main surface 1a opposite to the second main surface 1b from the second main surface 1b of the backplane 1.

In the display panel 10 provided by some embodiments of the present disclosure, the plurality of connection leads 4 are arranged at least on the first main surface 1a and the selected side surface 1cc of the backplane 1, and the plurality of connection leads 4 are used to lead the plurality of first electrodes 3 located on the second main surface 1b of the backplane 1 to the first main surface 1a of the backplane 1, so that the bonding region of the driver chip may be transferred to the first main surface 1a of the backplane 1 (i.e., the back face of the display panel 10), and the plurality of first electrodes 3 may be electrically connected to the driver chip or the flexible printed circuit of the display apparatus 100 to which the display panel 10 belongs through the plurality of connection leads 4. In this way, there is no need to arrange the bonding region at a border of the display panel 10, and the bezel of the display panel 10 may be reduced. Since the side surface of the display panel 10 only has structures such as the plurality of connection leads 4, a thickness of the structures disposed on the side surface 1c of the display panel 10 is small (e.g., the thickness is in a range of 1 μm to 4 μm), so that the display panel 10 with an ultra-narrow bezel may be obtained. In addition, since the ratio of the thickness $d_1$ of the first portion 41 of each connection lead 4 to the thickness $d_2$ of the second portion 42 of each connection lead 4 is in the range of 0.6 to 1.6, inclusive, the uniformity of the film thickness of the plurality of connection leads 4 may be ensured, and the effective signal transmission may be realized.

In some embodiments, referring to FIGS. 4A to 4C, at least one side surface 1c in the plurality of side surfaces 1c of the backplane 1 is the selected side surface 1cc. The selected side surface 1cc includes a side sub-surface 1c1 perpendicular to or substantially perpendicular to the first main surface 1a and the second main surface 1b, and a first transition sub-surface 1c2 connecting the first main surface 1a and the side sub-surface 1c1.

The embodiments of the present disclosure do not limit structures of other side surfaces 1c in the plurality of side surfaces 1c. For example, as shown in FIG. 1, the four side surfaces 1c of the backplane 1 are all selected side surfaces 1cc. As shown in FIG. 3, two side surfaces 1c (two side surfaces 1c proximate to the plurality of first electrodes 3 in FIG. 3) in the four side surfaces 1c of the backplane 1 are the selected side surfaces 1cc, and structures of the other two side surfaces 1c are not limited.

In a cross section of the backplane 1 perpendicular to the first main surface is and perpendicular to an edge of the backplane where the side sub-surface 1c1 is located, as shown in FIGS. 4A to 4C, an included angle θ2 between a tangent L1 at any point Q1 on the first transition sub-surface 1c2 and the first main surface 1a is greater than 90°, and an included angle θ1 between the tangent L1 at any point Q1 on the first transition sub-surface 1c2 and the side sub-surface 1c1 is greater than 90°.

Figure 2B:
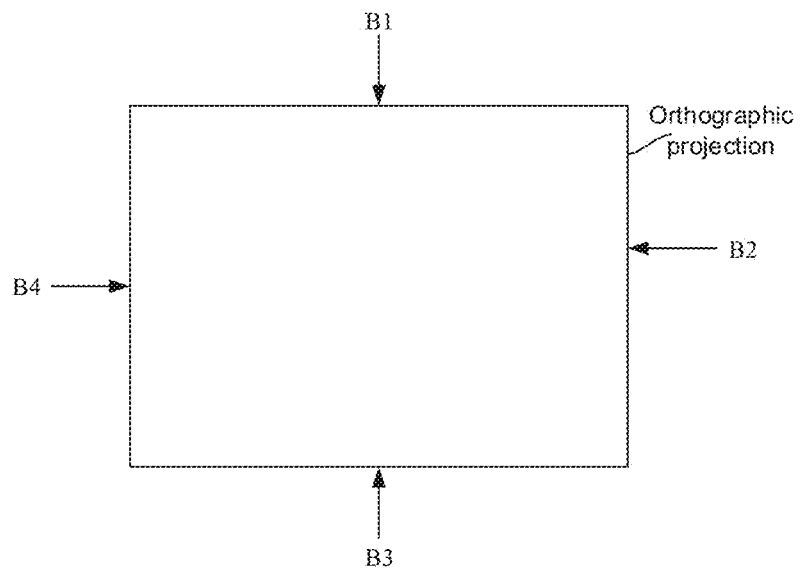
FIG. 2B is a schematic diagram of an orthographic projection of a backplane of the display panel shown in FIG. 1 on a first main surface of the backplane.

It will be noted that, the edge of the backplane refers to an edge of an orthographic projection of the backplane 1 on a plane where the first main surface 1a or the second main surface 1b is located. For example, FIG. 2B shows an orthographic projection of the backplane 1 shown in FIG. 1 on the plane where the first main surface 1a of the backplane 1 is located, and the orthographic projection includes four edges B1, B2, B3 and B4. For the edge of the backplane 1 which includes the first transition sub-surface 1c2, the edge of the backplane 1 refers to an orthographic projection of an edge where the side sub-surface 1c1 of the selected side surface 1cc of the backplane 1 and the first transition sub-surface 1c2 thereof are adjoined on the plane where the first main surface 1a or the second main surface 1b is located. For example, FIGS. 4A to 4C are each a schematic diagram of the backplane 1 in a cross-sectional view (FIG. 5A) of the display panel 10 taken along the section line DD' in FIG. 2A. It can be seen that the edge of the backplane where the side sub-surface 1c1 of the backplane 1 in FIGS. 4A to 4C is located is the edge B4, and the cross section of the backplane 1 perpendicular to the first main surface 1a and perpendicular to the edge (the edge B4) of the backplane where the side sub-surface 1c1 is located is the cross section shown in FIGS. 4A to 4C.

In the embodiments of the present disclosure, as shown in FIGS. 4A to 4C, the included angle θ2 between the tangent at any point on the first transition sub-surface 1c2 and the first main surface 1a and the included angle θ1 between the tangent at any point on the first transition sub-surface 1c2 and the side sub-surface 1c1 each refer to an included angle toward the inside of the backplane 1.

In the backplane 1, the included angle between the tangent at any point on the first transition sub-surface 1c2 of the backplane 1 and the first main surface 1a is greater than 90°, and the included angle between the tangent at any point on the first transition sub-surface 1c2 and the side sub-surface 1c1 is greater than 90°. Therefore, the first main surface 1a can smoothly transition from the first transition sub-surface 1c2 to the side sub-surface 1c1, or the side sub-surface 1c1 can smoothly transition from the first transition sub-surface 1c2 to the first main surface 1a. As a result, the plurality of connection leads 4 are disposed on the first main surface 1a, the first transition sub-surface 1c2 and the side sub-surface 1c1 of the backplane 1, and each connection lead 4 is subjected to small stress at a corner, so that a problem of line breakage caused by an excessive stress concentration may be alleviated. In this way, the plurality of connection leads 4 are not prone to be broken at the corner, which may ensure that the plurality of connection leads 4 can stably connect the two opposite main surfaces of the backplane 1, thereby enhancing reliability of the display panel 10.

In some embodiments, as shown in FIGS. 4A to 4C, on a basis of including the first transition sub-surface 1c2 and the side sub-surface 1c1 the selected side surface 1cc in the plurality of side surfaces 1c further includes a second transition sub-surface 1c3. The second transition sub-surface 1c3 connects the side sub-surface 1c1 and the second main surface 1b.

In the cross section of the backplane 1 perpendicular to the first main surface 1a and perpendicular to the edge of the backplane where the side sub-surface 1c1 is located, as shown in FIGS. 4A to 4C, an included angle θ4 between a tangent L2 at any point Q2 on the second transition sub-surface 1c3 and the second main surface 1b is greater than 90°, and an included angle θ3 between the tangent L2 at any point Q2 on the second transition sub-surface 1c3 and the side sub-surface 1c1 is greater than 90°. Here, the included angle between the tangent at any point on the second transition sub-surface 1c3 and the second main surface 1b and the included angle between the tangent at any point on the second transition sub-surface 1c3 and the side sub-surface 1c1 each refer to an included angle toward the inside of the backplane 1.

As shown in FIG. 5A, each connection lead 4 passes through the first transition sub-surface 1c2, the side sub-surface 1c1 and the second transition sub-surface 1c3 in sequence from the first main surface 1a to be electrically connected to the first electrode 3.

The included angle θ4 between the tangent at any point on the second transition sub-surface 1c3 and the second main surface 1b is greater than 90°, and the included angle θ3 between the tangent at any point on the second transition sub-surface 1c3 and the side sub-surface 1c1 is greater than 90°. Therefore, the second main surface 1b can smoothly transition from the second transition sub-surface 1c3 to the side sub-surface 1c1, or the side sub-surface 1c1 can smoothly transition from the second transition sub-surface 1c3 to the second main surface 1b. The plurality of connection leads 4 are disposed on the first main surface 1a, the first transition sub-surface 1c2, the side sub-surface 1c1 and the second transition sub-surface 1c3 of the backplane 1, and each connection lead 4 is subjected to small stress at the corner, so that the problem of line breakage caused by the excessive stress concentration may be alleviated. In this way, the plurality of connection leads 4 are not prone to be broken at the corner, which may further ensure that the plurality of connection leads 4 can stably connect the two opposite main surfaces of the backplane 1, thereby enhancing the reliability of the display panel 10.

In some embodiments, as shown in FIGS. 4A to 4C, the first transition sub-surface 1c2 included in the selected side surface 1cc is a plane surface or a curved surface. In a case where the selected side surface 1cc further includes the second transition sub-surface 1c3, the second transition sub-surface 1c3 is a plane surface or a curved surface.

In a case where the first transition sub-surface 102 and the second transition sub-surface 1c3 are plane surfaces, the first transition sub-surface 1c2 is referred to as a chamfer of the first main surface 1a and the side sub-surface 1c1, and the second transition sub-surface 1c3 is referred to as a chamfer of the second main surface 1b and the side sub-surface 1c1. For example, as shown in FIG. 4A, a width d of the chamfer is 30 um, and accuracy of the chamfer is controlled in a range of 20 um to 30 um, inclusive. For example, the width d of the chamfer is in a range of 10 um to 50 um, inclusive (i.e., 30 um±20 um). The included angle θ2 between the first transition sub-surface 1c2 and the first main surface 1a is greater than 90°, and θ2 is, for example, 135°. The included angle θ1 between the first transition sub-surface 1c2 and the side sub-surface 1c1 is greater than 90°, and θ1 is, for example, 135°. The included angle θ4 between the second transition sub-surface 1c3 and the second main surface 1b is greater than 90°, and θ4 is, for example, 135°. The included angle θ3 between the second transition sub-surface 1c3 and the side sub-surface 1c1 is greater than 90°, and θ3 is, for example, 135°.

In a case where the first transition sub-surface 1c2 and the second transition sub-surface 1c3 are curved surfaces, the first transition sub-surface 1c2 is referred to as a fillet of the first main surface 1a and the side sub-surface 1c1 and the second transition sub-surface 1c3 is referred to as a fillet of the second main surface 1b and the side sub-surface 1c1. For example, as shown in FIGS. 4B and 4C, a tangent is drawn at a point in a middle of the first transition sub-surface 1c2 (the curved surface), and the included angle θ2 between the tangent and the first main surface 1a is 135°, and the included angle θ1 between the tangent and the side sub-surface 1c1 is 135°. A tangent is drawn at a point in a middle of the second transition sub-surface 1c3 (the curved surface), and the included angle θ4 between the tangent and the second main surface 1b is 135°, and the included angle θ3 between the tangent and the side sub-surface 1c1 is 135°. The plurality of connection leads 4 are disposed on the curved surfaces, which may further disperse the stress and avoid the problem of line breakage caused by the excessive stress concentration.

In some embodiments, at least one side surface 1c in the plurality of side surfaces 1c of the backplane 1 includes the first transition sub-surface 1c2 and the side sub-surface 1c1 (or further includes a second transition sub-surface 1c3). The at least one side surface 1c is the selected side surface 1cc, and the plurality of connection leads 4 are disposed on the selected side surface 1cc. The other side surfaces may each only include, for example, a side sub-surface 1c1, and the side sub-surface 1c1 is perpendicular to or substantially perpendicular to the first main surface 1a and the second main surface 1b.

For example, as shown in FIG. 1, the four side surfaces 1c of the backplane 1 are all the selected side surfaces 1cc. Each selected side surface 1cc includes the first transition sub-surface 1c2 and the side sub-surface 1c1. Alternatively, each selected side surface 1cc includes the first transition sub-surface 1c2 and the side sub-surface 1c1, and further includes the second transition sub-surface 1c3. The plurality of first electrodes 3 are distributed at positions of the second main surface 1b proximate to four side edges of the second main surface 1b. For example, the positions of the second main surface 1b of the backplane 1 proximate to the four side edges of the second main surface 1b are each provided with multiple first electrodes 3. The plurality of connection leads 4 are connected to the plurality of first electrodes in one-to-one correspondence, and are disposed on the four side surfaces 1c of the backplane 1. Each connection lead 4 passes through the first transition sub-surface 1c2 and the side sub-surface 1c1 of the selected side surface 1cc in sequence from the first main surface 1a to be electrically connected to the first electrode 3 in the plurality of first electrodes 3.

For example, as shown in FIG. 3, the two side surfaces 1c in the four side surfaces 1c of the backplane 1 are the selected side surfaces 1cc. For example, the two side surfaces are two opposite side surfaces. Each selected side surface 1cc includes the first transition sub-surface 1c2 and the side sub-surface 1c1. Alternatively, each selected side surface 1cc includes the first transition sub-surface 1c2 and the side sub-surface 1c1, and further includes the second transition sub-surface 1c3. The plurality of first electrodes 3 are distributed at positions of the second main surface 1b respectively proximate to two opposite side edges of the second main surface 1b (the two opposite side edges corresponding to the two selected side surfaces 1cc). Each connection lead 4 passes through the first transition sub-surface 1c2 and the side sub-surface 1c1 of the selected side surface 1cc in sequence from the first main surface 1a to be electrically connected to the first electrode 3 in the plurality of first electrodes 3. The other two side surfaces 1c in the four side surfaces 1c may each include, for example, the side sub-surface 1c1, which is perpendicular to or substantially perpendicular to the first main surface 1a and the second main surface 1b, and the other two side surfaces 1c are not provided with connection leads 4 thereon For example, one side surface 1c in the four side surfaces 1c of the backplane 1 is the selected side surface 1cc. Alternatively, three side surfaces 1c in the four side surfaces 1c of the backplane 1 are the selected side surfaces 1cc. With regard to a case where the backplane 1 includes one selected side surface 1cc or three selected side surfaces 1cc, reference may be made to the above description for the case where the backplane 1 includes four selected side surfaces 1cc, and details will not be repeated here.

In some embodiments of the present disclosure, the plurality of first electrodes 3 may be arranged in the following manners.

In some embodiments, as shown in FIGS. 7A to 8A, an end of the plurality of first electrodes 3 proximate to the selected side surface 1cc is flush with or substantially flush with a side edge of the second main surface 1b proximate to the selected side surface 1cc. A distance between an end of each first electrode 3 proximate to the selected side surface 1cc and the side edge of the second main surface 1b proximate to the selected side surface 1cc is zero or substantially zero. In this way, positions of the plurality of first electrodes 3 are proximate to the side edge of the second main surface 1b as much as possible, so that an area of the display region of the display panel 10 may be expanded as much as possible.

Figure 7A:
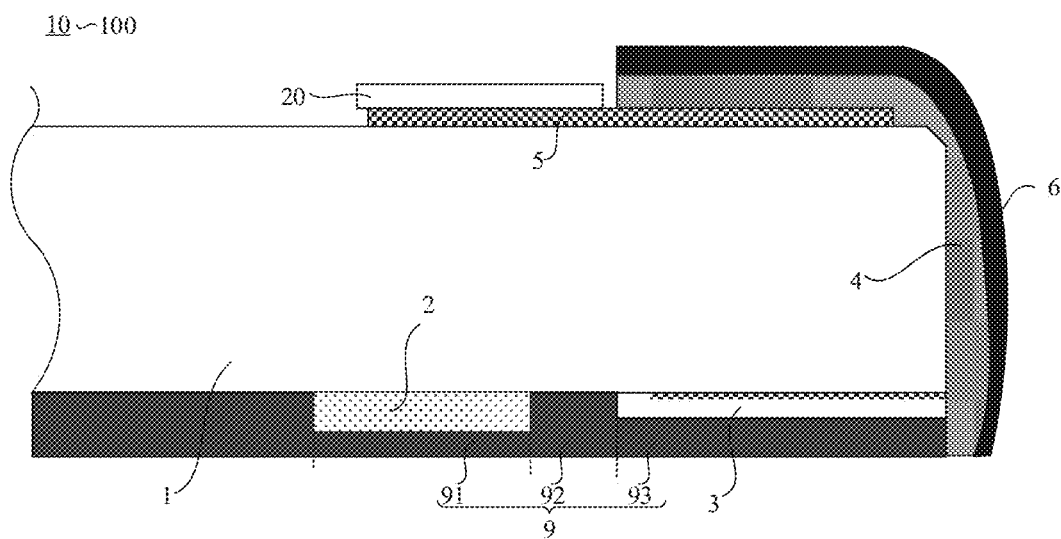
FIG. 7A is a cross-sectional view showing a structure of another display panel, in accordance with some embodiments of the present disclosure.
Figure 8A:
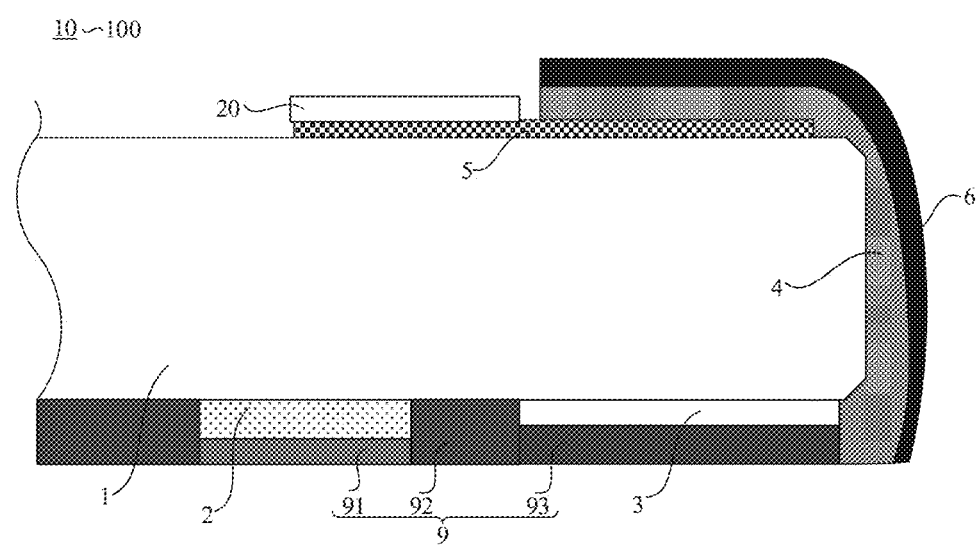
FIG. 8A is a cross-sectional view showing a structure of yet another display panel, in accordance with some embodiments of the present disclosure.

Each connection lead 4 in the plurality of connection leads 4 passes through the first transition sub-surface 1c2 and the side sub-surface 1c1 in sequence from the first main surface 1a, and extends to the side edge of the second main surface 1b proximate to the side sub-surface 1c1 to be electrically connected to the first electrode 3. Alternatively, each connection lead 4 in the plurality of connection leads 4 passes through the first transition sub-surface 1c2, the side sub-surface 1c1 and the second transition sub-surface 1c3 in sequence from the first main surface 1a, and extends to the side edge of the second main surface 1b proximate to the side sub-surface 1c1 to be electrically connected to the first electrode 3. As shown in FIGS. 7A and 8A, in the cross section of the display panel 10, each connection lead 4 has an "L" shape.

In some examples, as shown in FIGS. 7A and 8A, a manner in which each connection lead 4 is electrically connected to the first electrode 3 is that each connection lead 4 extends to the side edge of the second main surface 1b proximate to the side sub-surface 1c1 and is in contact with the end of the first electrode 3 proximate to the side sub-surface 1c1, so as to realize the electrical connection. The connection lead 4 and the first electrode 3 will not have an overlapping portion therebetween.

In some other embodiments, as shown in FIGS. 1, 2A, 3 and 5A, the end of each first electrode 3 in the plurality of first electrodes 3 proximate to the selected side surface 1cc and the side edge of the second main surface 1b proximate to the selected side surface 1cc have a distance therebetween. In order to ensure the area of the display region of the display panel 10, the distance between the end of each first electrode 3 proximate to the selected side surface 1cc and the side edge of the second main surface 1b proximate to the selected side surface 1cc is small. For example, as shown in FIGS. 2A and 5A, the end of each first electrode 3 proximate to the selected side surface 1cc and the side edge of the second main surface 1b proximate to the selected side surface 1cc have equal distances A1. For example, the distance A1 is in a range of 30 μm to 50 μm.

As shown in FIG. 5A, each connection lead 4 in the plurality of connection leads 4 further includes a third portion 43 located on the second main surface 1b. Each connection lead 4 passes through the first transition sub-surface 1c2 and the side sub-surface 1c1 in sequence from the first main surface 1a, and extends to the second main surface 1b to be electrically connected to the first electrode 3. That is, each connection lead 4 includes four portions respectively located on the first main surface 1a, the first transition sub-surface 1c2, the side sub-surface 1c1 and the second main surface 1b. Alternatively, as shown in FIGS. 5A and 6, in a case where the side surface 1c of the backplane 1 further includes the second transition sub-surface 1c3, each connection lead 4 in the plurality of connection leads 4 passes through the first transition sub-surface 1c2, the side sub-surface 1c1 and the second transition sub-surface 1c3 in sequence from the first main surface 1a, and extends to the second main surface 1b to be electrically connected to the first electrode 3. That is, each connection lead 4 includes five portions respectively located on the first main surface 1a, the first transition sub-surface 1c2, the side sub-surface 1c1, the second transition sub-surface 1c3 and the second main surface 1b. As shown in FIG. 5A, in the cross section of the display panel 10, the plurality of connection leads 4 each have a "U" shape.

In some examples, as shown in FIGS. 1 and 5A, an orthographic projection of a portion (the portion is located on the second main surface 1b) of each connection lead 4 on the second main surface 1b at least partially overlaps with an orthographic projection of the first electrode 3 electrically connected to the connection lead 4 on the second main surface 1b. That is to say, a manner in which each connection lead 4 is electrically connected to the first electrode 3 is that the connection lead 4 covers a portion of the first electrode 3 corresponding thereto, so as to realize the electrical connection. In this way, each connection lead 4 and the first electrode 3 corresponding thereto have a large contact area, so that the connection lead 4 may be sufficiently in contact with the first electrode 3, which is beneficial to signal transmission.

Alternatively, as shown in FIG. 3, the portion of each connection lead 4 extending to the second main surface 1b is in contact with an end face of the corresponding first electrode 3 proximate to the side sub-surface 1c1, so as to realize the electrical connection. There is no overlapping portion between the connection lead 4 and the first electrode 3.

As shown in FIG. 5B, the third portion 43 is the portion of the connection lead 4 located on the second main surface 1b, and includes a portion of the connection lead 4 in direct contact with the second main surface 1b. In a case where there is an overlapping portion between the connection lead 4 and the first electrode 3, the third portion 43 further includes a portion on a surface of the first electrode 3 away from the second main surface 1b. In some embodiments, a ratio of a thickness $d_3$ of the third portion 43 of each connection lead 4 to the thickness $d_2$ of the second portion 42 of each connection lead 4 is in a range of 0.6 to 1.6, inclusive. The thickness $d_3$ of the third portion 43 refers to a dimension of the third portion 43 in the direction perpendicular to the first main surface 1a. For example, the thickness $d_3$ of the third portion 43 may be a thickness at any position of the third portion 43. For example, FIG. 5B illustrates thicknesses $d_3$ of two positions of the third portion 43.

Referring to FIG. 5B, the thickness $d_2$ of the second portion 42 of each connection lead 4 is greater than the thickness $d_3$ of the third portion 43 of each connection lead 4, and a difference between the thickness $d_2$ of the second portion 42 and the thickness $d_3$ of the third portion 43 is in a certain range. It will be noted that, for each connection lead 4, a ratio of the thickness $d_3$ at any position of the third portion 43 to the thickness $d_2$ at any position of the second portion 42 is in the above range. For example, a radio of a minimum thickness $d_3$ of the third portion 43 to a maximum thickness $d_2$ of the second portion 42 is 60%. In this way, referring to FIG. 5B, the first portion 41, the second portion 42 and the third portion 43 of each connection lead have a thickness difference within a certain range, so that the uniformity of the film thickness of the connection lead 4 may be further ensured, and a difference between the thickness of the first portion 41 of the connection lead 4 and the thickness of the second portion 42 of the connection lead 4 is small, thereby further improving the connection stability of the plurality of connection leads, and realizing the effective signal transmission.

For example, the ratio of the thickness $d_3$ of the third portion 43 of each connection lead 4 to the thickness $d_2$ of the second portion 42 of each connection lead 4 is 60%, 80%, 90%, etc. For example, the thickness $d_2$ of the second portion 42 is greater than or equal to 900 nm and less than or equal to 1100 nm, and the thickness $d_3$ of the third portion 43 is greater than or equal to 660 nm and less than 900 nm. For example, the thickness $d_2$ of the second portion 42 is 1100 nm, and the thickness $d_3$ of the third portion 43 is 660 nm. Alternatively, the thickness $d_2$ of the second portion 42 is 1020 nm, and the thickness $d_3$ of the third portion 43 is 816 nm. Alternatively, the thickness $d_2$ of the second portion 42 is 1000 nm, and the thickness $d_3$ of the third portion 43 is 850 nm.

As a possible design, the ratio of the thickness $d_1$ of the first portion 41 of each connection lead 4 to the thickness $d_2$ of the second portion 42 of each connection lead 4 is in the range of 0.6 and 1.6, inclusive, the ratio of the thickness $d_3$ of the third portion 43 of each connection lead 4 to the thickness $d_2$ of the second portion 42 of each connection lead 4 is in the range of 0.6 and 1.6, inclusive, and a difference between the thickness $d_3$ of the third portion 43 and the thickness $d_1$ of the first portion 41 is within 100 nm. For example, the thickness $d_1$ of the first portion 41 of each connection lead 4 is 816 nm, the thickness $d_2$ of the second portion 42 of each connection lead 4 is 1000 nm, and the thickness $d_3$ of the third portion 43 of each connection lead 4 is 850 nm, so that thicknesses of portions of each connection lead 4 are uniform, and the uniformity of the film thickness of the plurality of connection leads 4 may be further improved, which is beneficial to improving the connection stability of the plurality of connection leads 4 and improving stability of signal transmission.

In some embodiments, as shown in FIGS. 5A, 7A, 8A and 8B, the display panel 10 further includes a plurality of second electrodes 5 disposed on the first main surface 1a. The plurality of second electrodes 5 are configured to be electrically connected to the driver chip or the flexible printed circuit. A connection lead 4 is electrically connected to a second electrode 5 in the plurality of second electrodes 5.

Figure 8B:
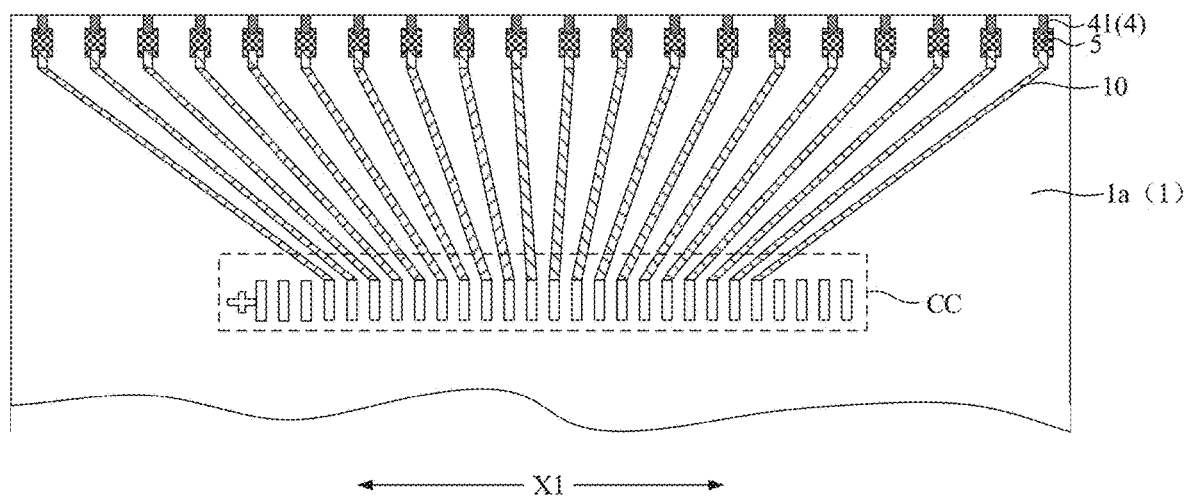
FIG. 8B is a diagram showing a back structure of a display panel, in accordance with some embodiments of the present disclosure.

The plurality of second electrodes 5 are disposed on the first main surface 1a of the backplane 1 and are configured to be electrically connected to the driver chip or the flexible printed circuit. That is, the plurality of second electrodes 5 are used to be bonded to the driver chip or the flexible printed circuit. In some examples, the first main surface 1a of the backplane 1 has the bonding region, at least a portion of the plurality of second electrodes 5 is located in the bonding region, and the plurality of second electrodes 5 are bonded to the driver chip or the flexible printed circuit in the bonding region. In some other examples, as shown in FIG. 8B, the plurality of second electrodes are electrically connected to structures in the bonding region CC through connection lines 10, and are bonded to the driver chip or the flexible printed circuit through the connection lines 10. Therefore, the driver chip or the flexible printed circuit can be disposed on the back face of the display panel 10, and be electrically connected to the front face of the display panel 10 through the plurality of second electrodes 5, the plurality of connection leads 4 and the plurality of first electrodes 3, thereby controlling the light-emitting device 2 to emit light, so as to realize display.

The number of the plurality of second electrodes 5 is the same as the number of the plurality of connection leads 4. An end of each connection lead 4 is electrically connected to the first electrode 3, and the other end thereof is electrically connected to the second electrode 5. The plurality of first electrodes 3 can be connected to the plurality of second electrodes 5 in a one-to-one correspondence manner through the plurality of connection leads 4, thereby realizing the signal transmission.

In some embodiments, as shown in FIGS. 2A and 5A, an end of the second electrode 5 proximate to the selected side surface 1cc and a side edge of the first main surface 1a proximate to the selected side surface 1cc have a distance therebetween. For example, the end of each second electrode 5 proximate to the selected side surface 1cc and the side edge of the first main surface 1a proximate to the selected side surface 1cc have equal distances. For example, the distance A2 is in a range of 400 μm to 600 μm.

As shown in FIG. 5A, in some embodiments, an orthographic projection of a portion (the portion is located on the first main surface 1*a*) of each connection lead 4 on the first main surface 1*a* at least partially overlaps with an orthographic projection of the second electrode 5 electrically connected to the connection lead 4 on the first main surface 1*a*. That is to say, the connection lead 4 covers a portion of the second electrode 5 corresponding thereto. In this way, each connection lead 4 and the second electrode 5 corresponding thereto have a large contact area, so that the connection lead 4 may be sufficiently in contact with the second electrode 5, which is beneficial to the signal transmission.

In some embodiments, as shown in FIGS. 9A to 10B, portions of the plurality of connection leads 4 located on the first main surface 1*a* of the backplane 1 is configured to be bonded to the driver chip or the flexible printed circuit. That is to say, the display panel 10 does not include the plurality of second electrodes 5, and both the driver chip and the flexible printed circuit in the display apparatus 100 are directly bonded to the portions of the plurality of connection leads 4 located on the first main surface 1*a* of the backplane 1, so that the driver chip or the flexible printed circuit can be disposed on the back face of the display panel 10, and be electrically connected to the front face of the display panel 10 through the plurality of connection leads and the plurality of first electrodes 3, thereby controlling the light-emitting device 2 to emit light, so as to realize display.

In some embodiments, the first main surface 1*a* of the backplane 1 has the bonding region. The portions of the plurality of connection leads 4 located on the first main surface 1*a* of the backplane 1 extend to the bonding region, and are configured to be bonded to the driver chip or the flexible printed circuit in the bonding region.

Figure 10A:
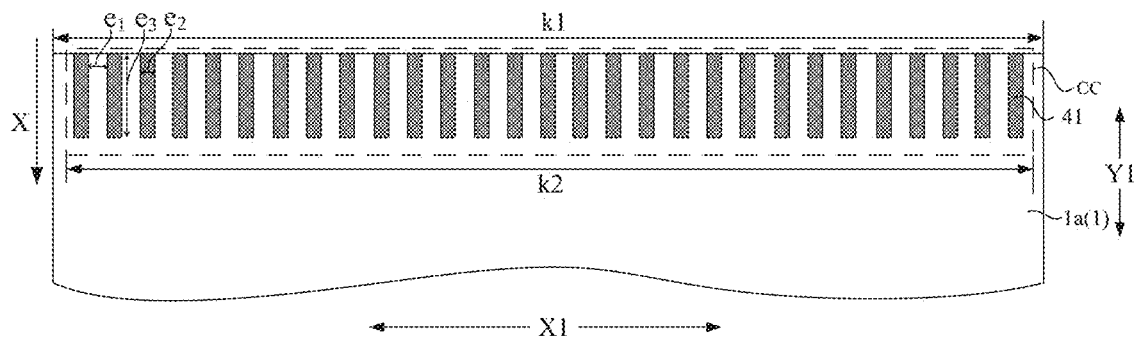
FIG. 10A is a diagram showing a back structure of another display panel, in accordance with some embodiments of the present disclosure.

In some examples, as shown in FIG. 10A, a length k2 of the bonding region CC is equal to or substantially equal to a length k1 of the side edge of the first main surface 1*a* proximate to the selected side surface 1*cc*. In a direction X from the side edge of the first main surface 1*a* proximate to the selected side surface 1*cc* to the bonding region, the portions of the plurality of connection leads 4 located on the first main surface 1*a* extend to the bonding region CC.

For example, in a case where the backplane 1 includes one selected side surface 1*cc*, the plurality of connection leads 4 are disposed on the selected side surface 1*cc* and the first main surface 1*a*, and are electrically connected to the plurality of first electrodes 3 correspondingly. The portions of the plurality of connection leads 4 located on the first main surface 1*a* are in one-to-one correspondence with positions of the plurality of first electrodes 3. For example, the plurality of connection leads 4 are parallel to each other and arranged at equal intervals. The plurality of connection leads 4 extend from the selected side surface 1*cc* to the first main surface 1*a*, and further extend to the bonding region CC of the first main surface 1*a*.

As a possible design, as shown in FIG. 10A, for example, the portions of the plurality of connection leads 4 located on the first main surface 1*a* may be set in dimensions as: a width $e_2$ of the first portion 41 of each connection lead 4 located on the first main surface 1*a* is in a range of 300 μm to 440 μm, a distance $e_1$ between portions of adjacent connection leads 4 located on the first main surface 1*a* is in a range of 40 μm to 50 μm, and a width $e_3$ of the first portion 41 of each connection lead 4 located on the first main surface 1*a* is in a range of 800 μm to 150 μm. The dimensions of the portions of the plurality of connection leads 4 located on the first main surface 1*a* are set to be in an appropriate range, so that the driver chip or the flexible printed circuit can be stably bonded to the plurality of connection leads 4. In addition, the dimensions of the portions of the plurality of connection leads 4 located on the first main surface 1*a* will not be excessively large, so that the manufacturing process of the plurality of connection leads 4 will not be excessively difficult.

In the above embodiments, the display panel 10 may be matched with a flexible printed circuit with a corresponding size or a driver chip with a corresponding size. For example, a length of the flexible printed circuit is equal to or substantially equal to a length of the side edge of the first main surface 1*a* of the backplane 1 proximate to the selected side surface 1*cc*. In this case, the dimension of the flexible printed circuit is large, and the dimensions of the portions of the plurality of connection leads 4 located on the first main surface 1*a* may be set according to the dimension of the driver chip or the flexible printed circuit that is to be bonded.

Figure 10B:
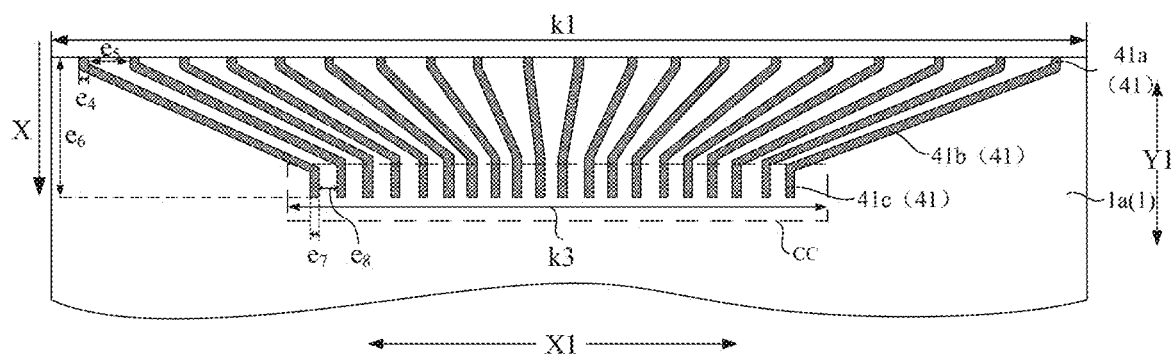
FIG. 10B is a diagram showing a back structure of yet another display panel, in accordance with some embodiments of the present disclosure.

In some other examples, as shown in FIG. 10B, a length k3 of the bonding region CC is less than the length k1 of the side edge of the first main surface 1*a* proximate to selected side surface 1*cc*. In the direction X from the side edge of the first main surface 1*a* proximate to the selected side surface 1*cc* to the bonding region, the portions of the plurality of connection leads 4 located on the first main surface 1*a* converge on the bonding region CC.

For example, in a case where the backplane 1 includes one selected side surface 1*cc*, the plurality of connection leads 4 are disposed on the selected side surface 1*cc* and the first main surface 1*a*. The portions of the plurality of connection leads 4 located on the first main surface 1*a* include first sub-portions, second sub-portions and third sub-portions, and the first portion 41 of each connection lead 4 located on the first main surface 1*a* includes a first sub-portion 41*a*, a second sub-portion 41*b* and a third sub-portion 41*c*. The second sub-portion 41*b* of each connection lead 4 connects the first sub-portion 41*a* with third sub-portion 41*c* of the connection lead 4. The first sub-portion 41*a* is closer to the side edge of the first main surface 1*a* proximate to the selected side surface 1*cc*, and the third sub-portion 41*c* is located in the bonding region CC. The third sub-portion 41*c* of each connection lead 4 is convergent inward relative to the first sub-portion 41*a* of the connection lead 4, so that the portions of the plurality of connection leads 4 located on the first main surface 1*a* exhibit a tendency of convergence toward the bonding region CC as a whole.

As a possible design, the portions of the plurality of connection leads 4 located on the selected side surface 1*cc* are parallel to each other and arranged at equal intervals, so that the first sub-portions 41*a* of the portions of the plurality of connection leads 4 located on the first main surface 1*a* are parallel to each other and arranged at equal intervals, and the third sub-portions 41*c* of the portions of the plurality of connection leads 4 located on the first main surface 1*a* are parallel to each other and arranged at equal intervals. In addition, a distance $e_8$ between third sub-portions 41*c* of portions, located on the first main surface 1*a*, of two adjacent connection leads 4 is less than a distance $e_5$ between first sub-portions 41*a* of the portions, located on the first main surface 1*a*, of the two adjacent connection leads 4, so that the portions of the plurality of connection leads 4 located on the first main surface 1*a* converge on the bonding region CC.

For example, as shown in FIG. 10B, the portions of the plurality of connection leads 4 located on the first main surface 1*a* may be set in dimensions as: a width $e_4$ of the first sub-portion 41*a* of the first portion 41, located on the first main surface 1*a*, of each connection lead 4 is in a range of 150 μm to 400 μm, the distance $e_5$ between the first sub-portions 41*a* of the first portions 41 of the two adjacent connection leads 4 is in a range of 140 µm to 300 µm, a width $e_7$ of the third sub-portion 41c of the first portion 41 of each connection lead 4 is greater than 80 µm, and the distance $e_8$ between the third sub-portions 41c of the two adjacent connection leads 4 is greater than 50 µm, where a sum of $e_7$ and $e_8$ is greater than 130 um ($e_7+e_8>130$ um), $e_7$ is less than $e_4$ ($e_7<e_4$), and $e_8$ is less than $e_5$ ($e_8<e_5$). A distance $e_6$ of the first portion 41 of each connection lead 4 located on the first main surface 1a in the direction X is in a range of 1 mm to 2 mm, inclusive.

In the above embodiments, the display panel 10 may be matched with a flexible printed circuit with a corresponding size or a driver chip with a corresponding size. For example, a flexible printed circuit with a small size may be suitable for the display panel 10, and the dimensions of the portions of the plurality of connection leads 4 located on the first main surface 1a may be set according to the dimension of the driver chip or the flexible printed circuit that is to be bonded.

In some embodiments, as shown in FIGS. 1 and 3, multiple first electrodes 3 in the plurality of first electrodes 3 proximate to a same side subsurface 1c1 extend in a direction perpendicular to the edge of the backplane where the side sub-surface 1c1 is located, and are arranged at equal intervals in a direction parallel to the edge of the backplane where the side sub-surface 1c1 is located.

Figure 7B:
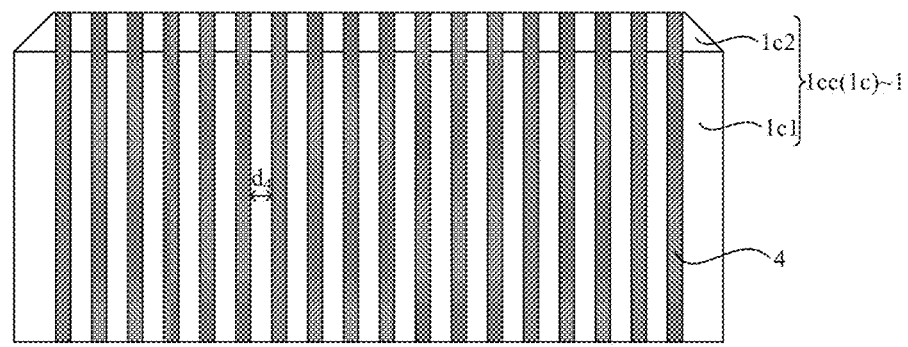
FIG. 7B is a diagram showing a structure of a side surface of the display panel shown in FIG. 7A.

As shown in FIGS. 6 and 7B, multiple connection leads 4 in the plurality of connection leads 4 disposed on a same side surface 1c are arranged at equal intervals in the direction parallel to the edge of the backplane where the side sub-surface 1c1 is located.

In a case where the display panel 10 further includes the plurality of second electrodes 5, multiple second electrodes 5 in the plurality of second electrodes 5 proximate to a same side sub-surface 1c1 extend in the direction perpendicular to the edge of the backplane where the side sub-surface 1c1 is located, and are arranged at equal intervals in the direction parallel to the edge of the backplane where the side sub-surface 1c1 is located.

The multiple first electrodes 3, the multiple connection leads 4 and the multiple second electrodes 5 are each set to be at equal intervals, so that the multiple first electrodes 3, the multiple connection leads 4 and the multiple second electrodes 5 may be distributed uniformly on the backplane, which is beneficial to a precise design of the structure of the display panel 10.

Figure 11A:
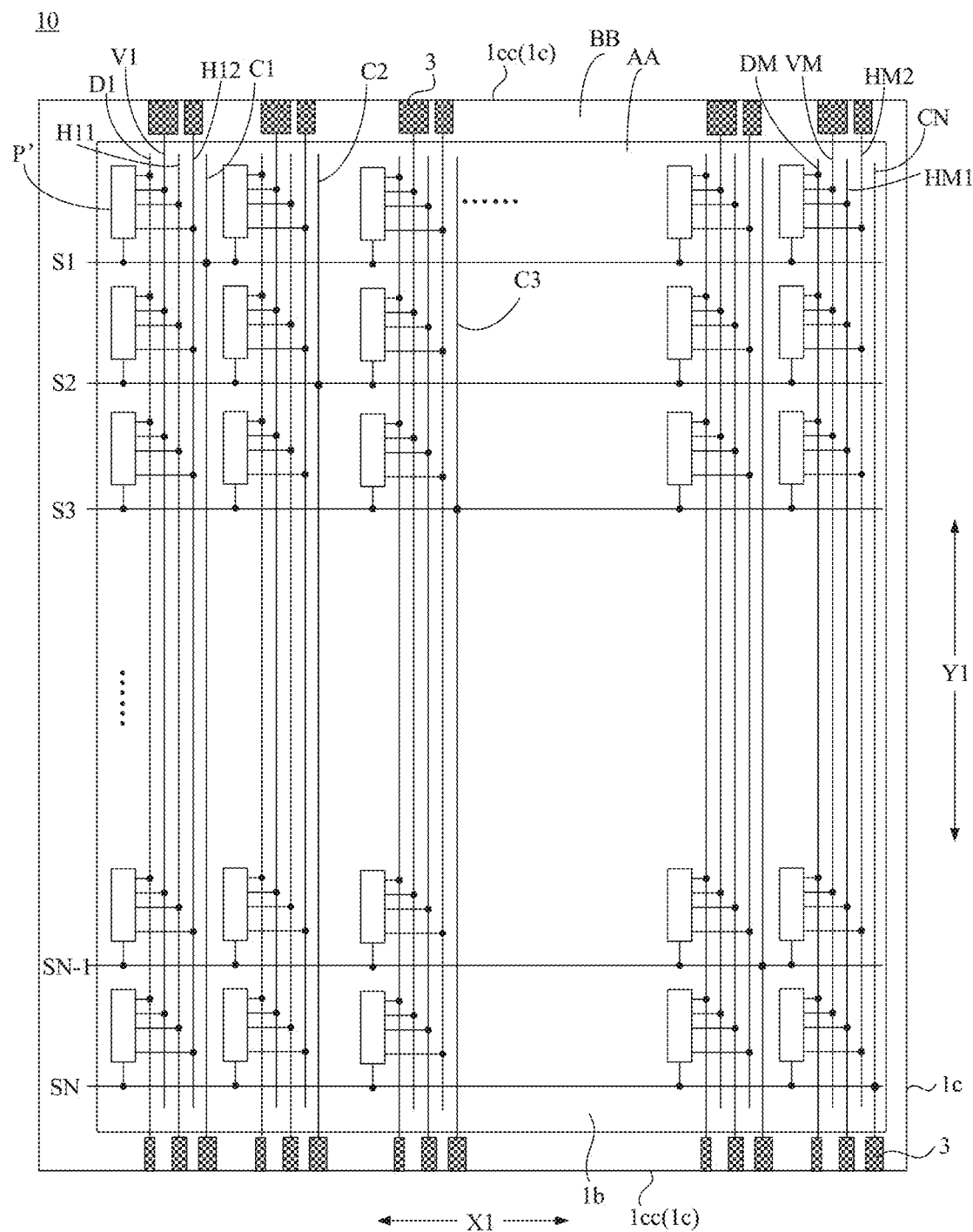
FIG. 11A is a diagram showing a front structure of yet another display panel, in accordance with some embodiments of the present disclosure.
Figure 11B:
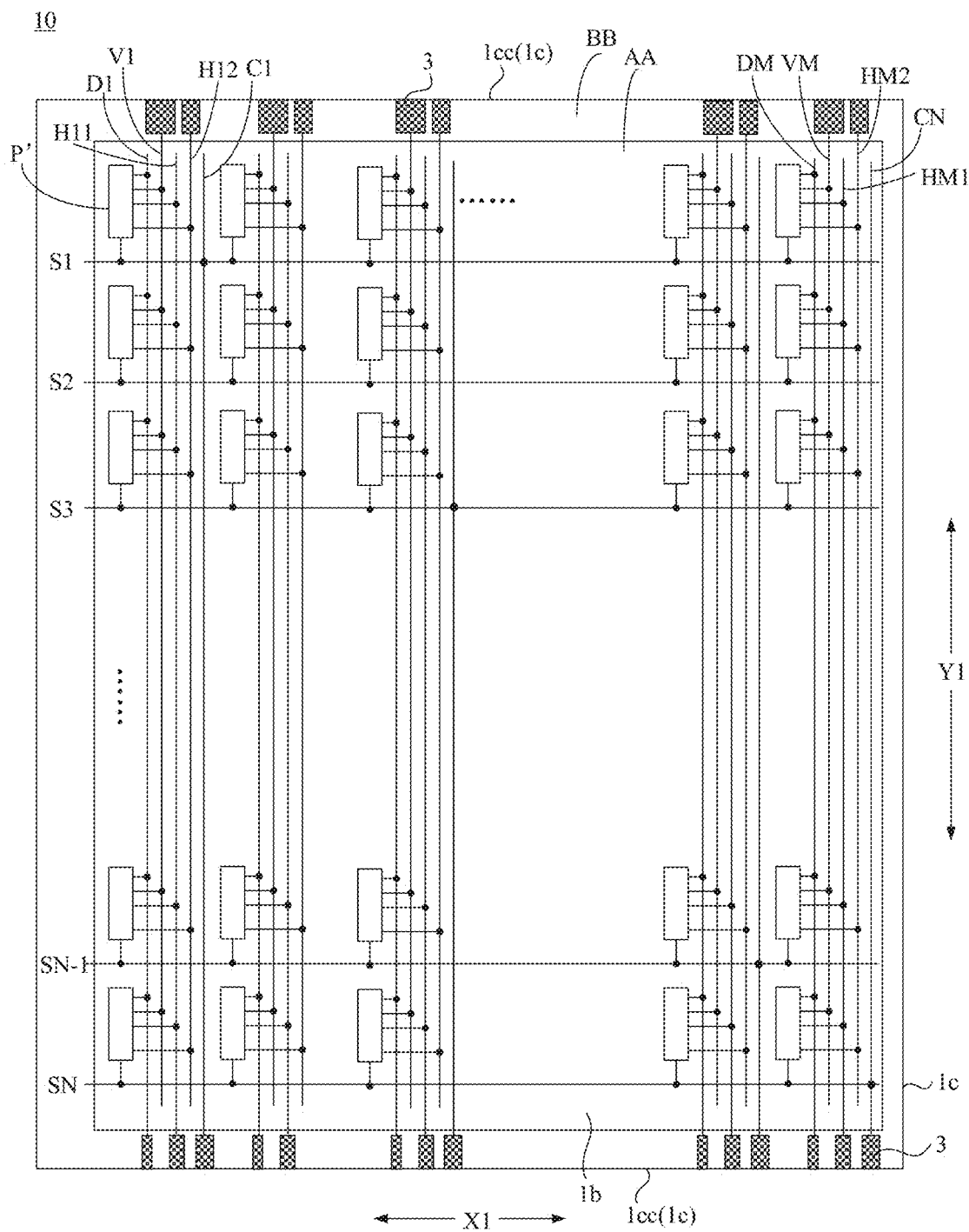
FIG. 11B is a diagram showing a front structure of yet another display panel, in accordance with some embodiments of the present disclosure.
Figure 11C:
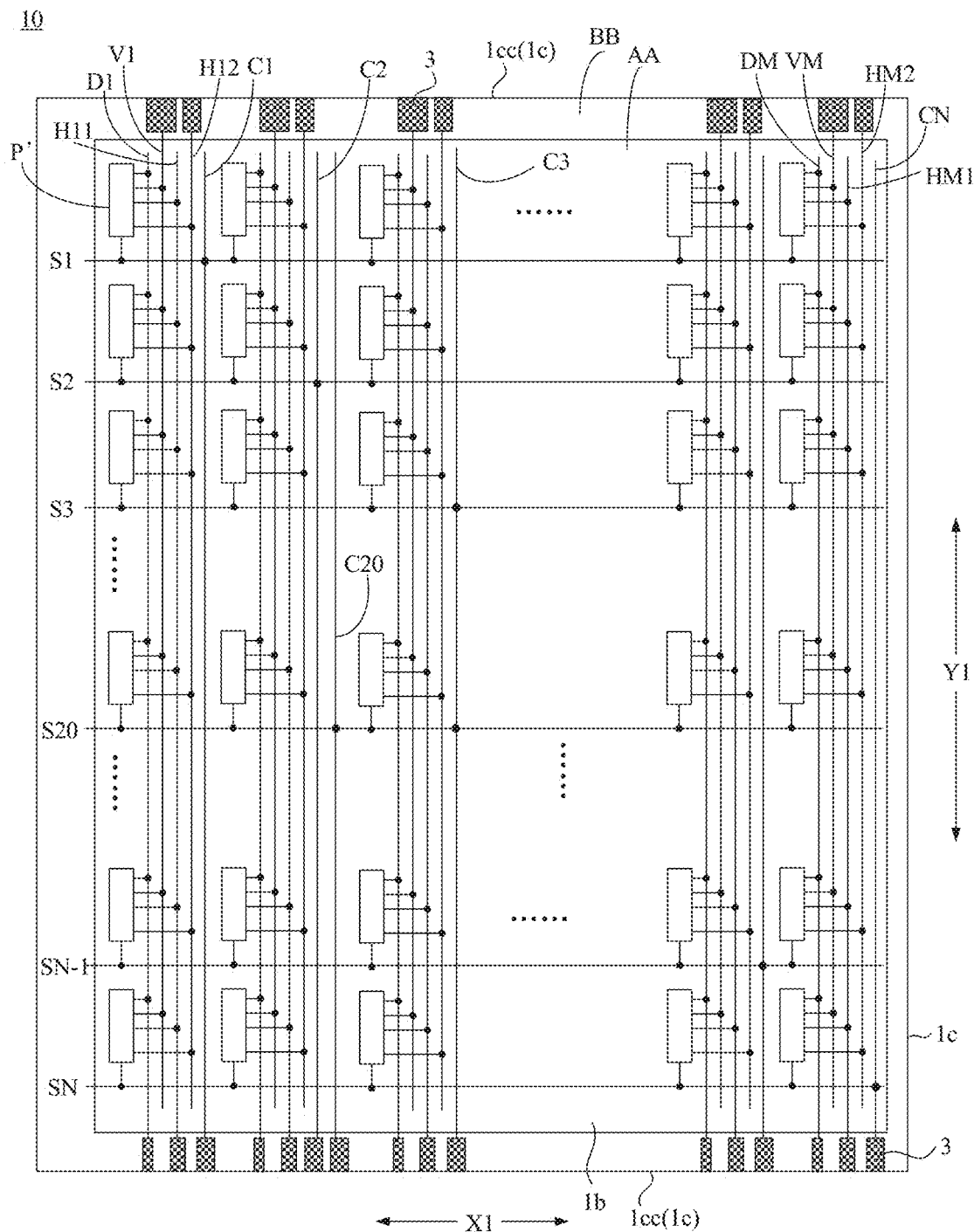
FIG. 11C is a diagram showing a front structure of yet another display panel, in accordance with some embodiments of the present disclosure.

In some embodiments, as shown in FIGS. 11A to 11C, the display panel 10 includes the display region AA and the peripheral region BB, and the plurality of pixels P' and the plurality of signal lines are disposed in the display region AA. The plurality of signal lines are electrically connected to the plurality of pixels, and the structure and the connection relationship of the plurality of pixels P' and the plurality of signal lines will be described below.

In some embodiments, the plurality of pixels P' are arranged in an array. For example, as shown in FIGS. 11A to 12B, the plurality of pixels P' are arranged in a form of N rows by M columns, and the plurality of signal lines include a plurality of data lines D1 to DM extending in a column direction Y1, a plurality of first positive signal lines H11 to HM1 extending in the column direction Y1, a plurality of second positive signal lines H12 to HM2 extending in the column direction Y1, a plurality of reference signal lines V1 to VM extending in the column direction Y1, and a plurality of scanning signal lines S1 to SN extending in a row direction X1. The plurality of signal lines further include a plurality of scanning signal transfer lines C1 to CN extending in the column direction Y1, and each scanning signal transfer line Cn is electrically connected to a scanning signal line Sn. In this way, the scanning signal transfer line Cn may provide a scanning signal for the corresponding scanning signal line Sn, so that a signal source for providing scanning signals may be disposed on two ends of the scanning signal transfer line Cn.

For example, each row of pixels P' is electrically connected to a same scanning signal line Sn, and each column of pixels P' is electrically connected to a data line Dm, a reference signal line Vm, a first positive signal line Hm1 and a second positive signal line Hm2, so as to realize reasonable wiring, and transmit corresponding signals to the pixels P' through the plurality of signal lines.

Figure 12A:
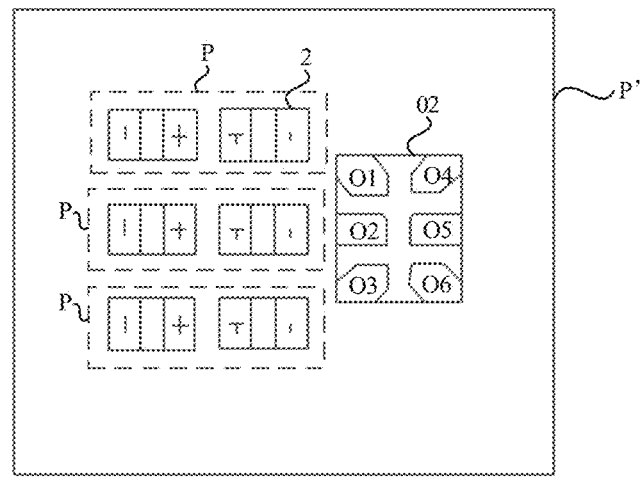
FIG. 12A is a diagram showing a structure of pixels in a display panel, in accordance with some embodiments of the present disclosure.
Figure 12B:
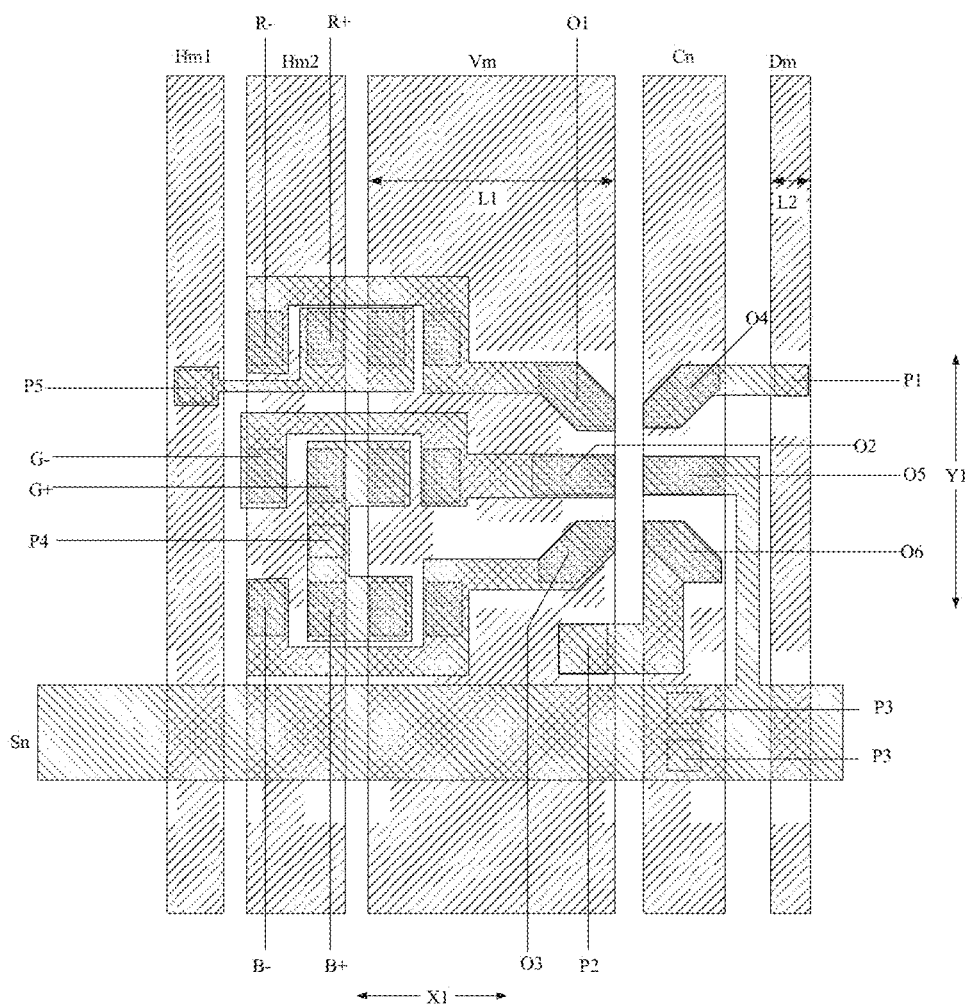
FIG. 12B is a schematic diagram of a layout structure corresponding to a pixel in a display panel, in accordance with some embodiments of the present disclosure.

As shown in FIGS. 12A and 12B, each pixel P' in the plurality of pixels P' includes sub-pixels P of at least three colors and a pixel driver chip 02 for driving each sub-pixel P to emit light. Each sub-pixel P includes at least one light-emitting device 2, and the light-emitting device 2 may be, for example, an inorganic light-emitting diode. The following will be described by considering an example in which each pixel P' includes three sub-pixels P, and each sub-pixel P include two light-emitting devices 2. In FIG. 12A, six light-emitting devices 2 are arranged in three rows by two columns, and light-emitting devices 2 in the three rows are sequentially light-emitting devices 2 of the first color, light-emitting devices 2 of the second color and light-emitting devices 2 of the third color from top to bottom.

The pixel driver chip 02 is electrically connected to a negative electrode of a light-emitting device 2 in each sub-pixel 01 driven by the pixel driver chip 02, at least one data line Dm in the plurality of data lines, at least one scanning signal line Sn in the plurality of scanning signal lines and at least one reference signal line Vm in the plurality of reference signal lines. The pixel driver chip 02 is configured to write a signal of the data line Dm into sub-pixels P of different colors in a time-division manner under control of the scanning signal lines Sn. The reference signal line Vm is used for providing a negative signal for the pixel driver chip 02, so as to produce a current path between the pixel driver chip 02 and the light-emitting device 2.

In a process of implementation, referring to FIGS. 12A and 12B, the pixel driver chip 02 has a first signal terminal O1, a second signal terminal O2, a third signal terminal O3, a fourth signal terminal O4, a fifth signal terminal O5 and a sixth signal terminal O6. The first signal terminal O1 is connected to a negative electrode R– of the light-emitting device 2 of the first color. The second signal terminal O2 is connected to a negative electrode G– of the light-emitting device 2 of the second color. The third signal terminal O3 is connected to a negative electrode B– of light-emitting device 2 of the third color. The fourth signal terminal O4 is electrically connected to the data line Dm through a via hole P1. The fifth signal terminal O5 is connected to the scanning signal line Sn. The sixth signal terminal O6 is connected to the reference signal line Vm through a via hole P2. A positive electrode R+ of the light-emitting device 2 of the first color is connected to the first positive signal line Hm1 through a via hole P5. A positive electrode G+ of the light-emitting device 2 of the second color is connected to the second positive signal line Hm2 through a via hole P4. A positive electrode B+ of the light-emitting device 2 of the third color is connected to the second positive signal line Hm2 through the via hole P4. The scanning signal line Sn is connected to the scanning signal transfer line Cn through a via hole P3.

Referring to FIGS. 11A to 11O, the plurality of first electrodes 3 are disposed at positions of the second main surface 1b of the backplane 1 proximate to two side edges. The two side edges are referred to as a first side edge (located on an upper side of the backplane 1) and a second side edge (located on a lower side of the backplane 1). The first side edge and the second side edge are arranged oppositely in the column direction Y1. It can be understood that, the display panel 10 shown in FIGS. 11A to 11C corresponds to the display panel 10 shown in FIG. 3, and the backplane 1 includes the two opposite selected side surfaces 1cc. FIGS. 11A to 11C illustrate an example in which an end of the plurality of first electrodes 3 proximate to the selected side surface 1cc is flush with or substantially flush with a side edge of the second main surface 1b proximate to the selected side surface 1cc, and thus the third portion 43 of the connection lead 4 is not shown in the figures.

The plurality of first electrodes 3 are electrically connected to the plurality of light-emitting devices 2 through the plurality of signal lines, and each first electrode 3 in the plurality of first electrodes 3 is electrically connected to a signal line extending in the column direction Y1. For example, as shown in FIGS. 11A and 11B, a part of the plurality of first electrodes 3 are disposed at a position of the first side edge that is proximate to the second main surface 1b of the backplane 1, each first electrode 3 in the part of first electrodes 3 is electrically connected to a signal line in the plurality of second positive signal lines H12 to HM2 and the plurality of reference signal lines V1 to VM, and a remaining part of the plurality of first electrodes 3 are disposed at a position of the second side edge that is proximate to the second main surface 1b of the backplane 1, each first electrode 3 in the remaining part of first electrodes is electrically connected to a signal line in the plurality of data lines D1 to DM, the plurality of first positive signal lines H11 to HM1 and the plurality of scanning signal transfer lines C1 to CN.

The plurality of pixels P' arranged in the form of N rows by M columns will be considered as an example. In some embodiments, the positions of the plurality of first electrodes 3 are arranged according to the following rules: first electrodes corresponding to and electrically connected to a column of pixels include at least four first electrodes 3, and the at least four first electrodes 3 include a first electrode 3 electrically connected to the first positive signal line Hm1, a first electrode 3 electrically connected to the second positive signal line Hm2, a first electrode 3 electrically connected to the data line Dm and a first electrode 3 electrically connected to the reference signal line Vm. Thus, first electrodes 3 electrically connected to the plurality of first positive signal lines Hm1, the plurality of second positive signal lines H12 to HM2, the plurality of data lines D1 to DM and the plurality of reference signal lines V1 to VM include at least (4×M) first electrodes 3. The number of the plurality of scanning signal transfer lines C1 to CN is equal to the number of the scanning signal lines S1 to SN, which are both N. Thus, first electrodes 3 electrically connected to the plurality of scanning signal transfer lines C1 to CN include N first electrodes 3.

Optionally, as shown in FIG. 11A, in a case where the number of pixel rows N is equal to the number of pixel columns M in the display region AA (i.e., in a case where N is equal to M (N=M)), a scanning signal transfer line Cn is correspondingly disposed on a side of each pixel column, and only one scanning signal transfer line Cn is disposed between every two adjacent pixel columns. For example, a scanning signal transfer line C2 corresponding to and electrically connected to a scanning signal line S2 is disposed on the right side of the second column of pixels, and a first electrode 3 electrically connected to the scanning signal transfer line C2 is disposed at a position corresponding to the second column of pixels in the peripheral region BB. In this way, the number of first electrodes corresponding to each pixel column is 5.

Optionally, as shown in FIG. 11B, in a case where the number of pixel rows N is less than the number of pixel columns M in the display region AA (i.e., in a case where N is less than M (N<M)), a scanning signal transfer line Cn is correspondingly disposed on a side of some pixel columns, the number of the some pixel columns is N, and there is no scanning signal transfer line Cn on a side of the other pixel columns, the number of the other pixel columns is (M−N). In this case, there is no scanning signal transfer line Cn between two adjacent pixel columns in the other pixel columns. For example, there is no scanning signal transfer line on the right side of the second column of pixels, and the scanning signal transfer line C2 corresponding to and electrically connected to the scanning signal line S2 is disposed on a side of another pixel column, so that there is no first electrode 3 disposed at the position corresponding to the second column of pixels in the peripheral region BB. In this way, the number of first electrodes corresponding to the some pixel columns (e.g., the first column of pixels and the third column of pixels) is 5, and the number of first electrodes corresponding to the other pixel columns (e.g., the second column of pixels) is 4.

Optionally, as shown in FIG. 11C, in a case where the number of pixel rows N is greater than the number of pixel columns M in the display region AA (i.e., in a case where N is greater than M (N>M)), at least one scanning signal transfer line Cn is correspondingly disposed on the side of each pixel column. A single scanning signal transfer line Cn is correspondingly disposed on a side of some pixel columns, two or more scanning signal transfer lines Cn are disposed on a side of the other pixel columns, and two scanning signal transfer lines Cn are disposed between some two adjacent pixel columns. For example, a scanning signal transfer line C2 corresponding to and electrically connected to a scanning signal line S2, and another scanning signal transfer line C20 corresponding to and electrically connected to another scanning signal line S20 are both disposed on the right side of the second column of pixels, so that a first electrode 3 electrically connected to the scanning signal transfer line C2 and another first electrode 3 electrically connected to the scanning signal transfer line C20 are both disposed at the position corresponding to the second column of pixels in the peripheral region BB. In this way, the number of first electrodes corresponding to the some pixel columns (e.g., the first column of pixels and the third column of pixels) is 5, and the number of first electrodes corresponding to the other pixel columns (e.g., the second column of pixels) is 6.

It can be understood that, the plurality of first electrodes in FIGS. 11A to 11O may be further moved toward the inside of the display region AA. For example, the plurality of first electrodes are disposed between two adjacent pixels P' in a row of pixels P' that is closest to the selected side surface 1cc, thereby further narrowing the size of the peripheral region BB, so as to make the non-display region of the display panel narrower.

Referring to FIG. 12B, in some embodiments, since signal lines connected to a pixel P' provide different signals, the signal lines connected to the pixel P' have different widths. A width of the first electrode 3 is the same or substantially the same as a width of a signal line electrically connected thereto. The width of the signal line refers to a width of the signal line in a direction perpendicular to an extending direction (e.g., the column direction Y1) of the body of the signal line, that is, the width of the signal line is a dimension of the signal line in the row direction X1. The width of the first electrode 3 refers to a dimension of the first electrode 3 in the row direction X1. For example, a width of a first electrode electrically connected to a reference signal line Vm is equal to a width of the reference signal line Vm; alternatively, the width of the first electrode 3 is slightly greater than the width of the reference signal line Vm. As shown in FIG. 12B, the width L1 of the reference signal line Vm is greater than a width L2 of the data line Dm, so that the width of the first electrode 3 electrically connected to the reference signal line Vm is greater than the width of the first electrode 3 electrically connected to the data line Dm. As shown in FIGS. 3, 11A and 11B, the plurality of first electrodes 3 have different widths, and the width of each first electrode 3 corresponds to a width of a signal line electrically connected to the first electrode 3, and widths of first electrodes 3 that are electrically connected to signal lines with different widths are different.

Further, referring to FIG. 3, in a case where each connection lead 4 further includes the third portion 43 located on the second main surface 1b of the backplane 1, a width of the third portion 43 is the same or substantially the same as a width of a signal line electrically connected to the third portion 43. The width of the third portion 43 is a dimension of the third portion 43 in the row direction X1. That is, there is a corresponding relationship among the widths of the signal line, the first electrode 3 and the third portion 43 of the connection lead 4 that are electrically connected in sequence.

In the above embodiments, a distance between two adjacent first electrodes 3 is designed based on a criterion of avoiding signal crosstalk, which is not limited in the embodiments of the present disclosure.

In some embodiments, the width of the first portion 41 of each connection lead 4 is equal to or substantially equal to the width of the third portion 43 of each connection lead 4. Referring to FIGS. 8B, 10A and 10B, the width of the first portion 41 is a dimension of the first portion 41 in the row direction X1.

Further, there is an overlapping region between orthographic projections of the first portion 41 and the third portion of each connection lead 4 on the first main surface 1a of the backplane 1. For example, as shown in FIG. 8B, the orthographic projection of the first portion 41 of each connection lead 4 on the first main surface 1a of the backplane 1 is substantially coincide with the orthographic projection of the third portion 43 of the connection lead 4 on the first main surface 1a of the backplane 1. As shown in FIG. 10A, the orthographic projection of the first portion 41 of each connection lead 4 on the first main surface 1a of the backplane 1 is substantially coincide with the orthographic projection of the third portion 43 of the connection lead 4 on the first main surface 1a of the backplane 1. As shown in FIG. 10B, an orthographic projection of the first sub-portion 41a of the first portion 41 of each connection lead 4 on the first main surface 1a of the backplane 1 is substantially coincide with the orthographic projection of the third portion 43 of the connection lead 4 on the first main surface 1a of the backplane 1. That is, the width of the first portion 41 of each connection lead 4 is equal to or substantially equal to the width of the third portion 43 of the connection lead 4, and a position of the first portion 41 of each connection lead 4 on a main surface of the backplane corresponds to a position of the third portion 43 of the connection lead 4 on another main surface of the backplane, and the two main surfaces are opposite.

In some embodiments, a width of the second portion 42 of each connection lead 4 is greater than the width of the first portion 41 of the connection lead 4, and is greater than the width of the third portion 43 of the connection lead 4.

In some other embodiments, the width of the second portion 42 of each connection lead 4 is equal to or substantially equal to the width of the first portion 41 of the connection lead 4, and is equal to or substantially equal to the width of the third portion 43 of the connection lead 4.

As a possible design, as shown in FIGS. 6 and 7B, second portions 42 of connection leads 4 located on the same selected side surface 1cc are arranged at equal intervals in the direction parallel to the edge of the backplane where a side sub-surface of the selected side surface 1cc is located. However, the widths of the second portions 42 of the connection leads 4 may not be necessarily the same. For example, a distance between second portions 42 of every two adjacent connection leads 4 is $d_4$, and the width of the second portion 42 of each connection lead 4 is substantially directly proportional to the width of the third portion 43 of the connection lead 4.

In some examples, the portions of the plurality of connection leads 4 located on the first main surface 1a, the portions of the plurality of connection leads 4 located on the selected side surface 1cc, and the portions of the plurality of connection leads 4 located on the second main surface 1b are formed through different processes. For example, a metal layer is formed on the selected side surface 1cc through a sputtering process, and a laser etching process is performed on the metal layer to obtain the portions of the plurality of connection leads 4 located on the selected side surface 1cc. In this case, the metal layer may be cut into a plurality of portions through the laser etching process, so as to obtain a plurality of second portions 42. The precision of the laser etching process is set to be a specific value such as $d_4$, so that the portions of the plurality of connection leads, arranged at equal intervals, located on the selected side surface 1cc may be obtained. In this way, it is beneficial to controlling the process precision and reducing the difficulty of manufacturing.

As another possible design, the distance between second portions 42 of every two adjacent connection leads 4 may be different. For example, the distance may be equal to the distance between the first portions 41 of two adjacent connection leads 4.

In some embodiments, a distance between two adjacent connection leads 4 in connection leads 4 located on a selected side surfaces 1cc is different from another distance between two adjacent connection leads 4 in connection leads 4 located on another selected side surface 1cc. The first portion 41, the second portion 42 and the third portion 43 of each connection lead 4 are connected to each other and have corresponding positions, the width of the third portion 43 is related to the width of the first electrode 3 electrically connected to the third portion 43, and the distance between adjacent third portions 43 is related to the distance between first electrodes 3 respectively electrically connected to the adjacent third portions 43. Therefore, in a case where first electrodes 3 corresponding to different selected side surfaces 1cc have different widths and different distances each between adjacent first electrodes 3, the distance between two adjacent connection leads 4 in the connection leads 4 located on the selected side surfaces 1cc is different from the another distance between two adjacent connection leads 4 in the connection leads 4 located on the another selected side surface 1cc.

In some embodiments, the plurality of connection leads 4 may be formed through, for example, an electroplating process, an evaporation process, or a silver adhesive pad printing process. Alternatively, the plurality of connection leads 4 may be obtained by forming a metal layer on the first main surface 1a and the selected side surface 1cc of the backplane 1 through a sputtering process and forming patterns through an etching process. The etching process may be, for example, a wet etching process or a laser etching process. In a case where the plurality of connection leads 4 are obtained through the laser etching process, there may be a case that other structures of the display panel 10 are adversely affected caused by an excessive power and an excessive energy of laser etching. In particular, when a portion of the metal layer located on the first main surface 1a of the backplane 1 is etched, if the laser energy is too large, the laser will penetrate the backplane 1, and a structure on the second main surface 1b of the backplane 1 may produce a bulge.

Figure 9A:
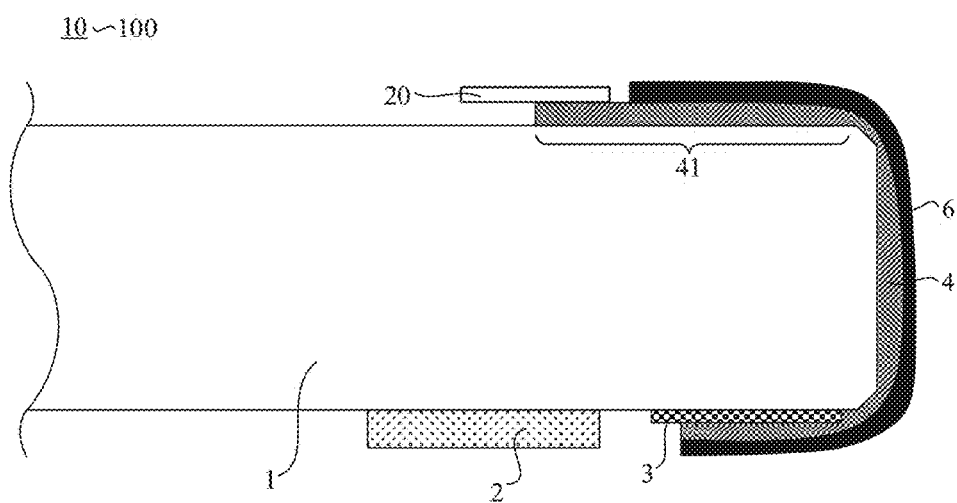
FIG. 9A is a cross-sectional view showing a structure of yet another display panel, in accordance with some embodiments of the present disclosure.
Figure 9B:
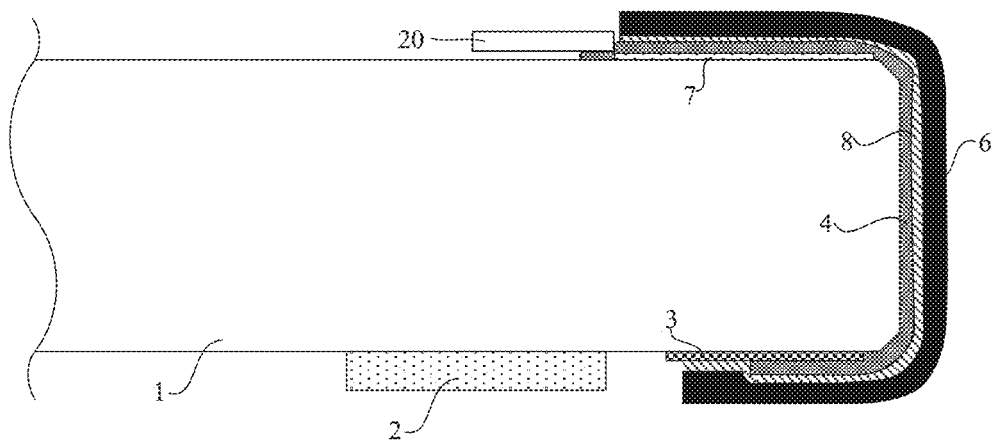
FIG. 9B is a cross-sectional view showing a structure of yet another display panel, in accordance with some embodiments of the present disclosure.

Based on this, as shown in FIG. 9B, the display panel 10 further includes an energy absorbing film 7. The energy absorbing film 7 is disposed on a side proximate to the first main surface 1a of the backplane 1 relative to the plurality of connection leads 4. The energy absorbing film 7 may be in direct contact with the first main surface 1a. That is to say, before the metal layer is formed, the energy absorbing film 7 is formed on the first main surface 1a of the backplane 1.

The energy absorbing film 7 is configured to absorb at least a part of laser energy in the laser etching process. In this way, in the process of obtaining the plurality of connection leads 4 through the laser etching process, especially when the portion of the metal layer located on the first main surface 1a of the backplane 1 is etched, the energy absorbing film 7 can absorb a part of laser energy, so as to avoid the bulge produced on the structure on the second main surface 1b of the backplane 1 due to the excessive laser energy, and reduce the adverse effect on the second main surface 1b of the backplane 1 caused by the laser etching process.

As a possible design, the second main surface 1b of the backplane 1 and the plurality of connection leads 4 may have an energy absorbing film therebetween. Alternatively, the selected side surface 1cc of the backplane 1 and the plurality of connection leads 4 may have an energy absorbing film therebetween. As a result, potential adverse effects on other structures of the backplane 1 may be reduced in the process of forming the plurality of connection leads 4 through the laser etching process.

In some examples, a material of the energy absorbing film is selected from inorganic materials that are capable of absorbing laser energy. For example, the material of the energy absorbing film includes at least one of tin dioxide ($SnO_2$) and zinc oxide (ZnO). That is, the material of the energy absorbing film is $SnO_2$, ZnO, or a mixed material of $SnO_2$ and ZnO.

Figure 13:
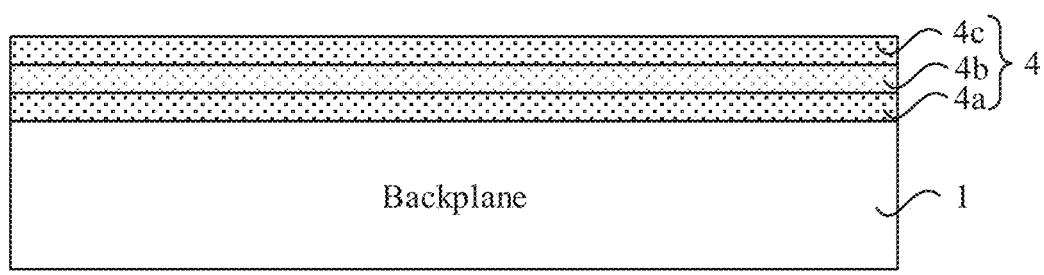
FIG. 13 is a diagram showing a structure of a connection lead in a display panel, in accordance with some embodiments of the present disclosure.

In some embodiments, as shown in FIG. 13, each connection lead 4 includes a first buffer conductive pattern 4a, a main conductive pattern 4b and a second buffer conductive pattern 4c that are sequentially stacked, and the first buffer conductive pattern 4a is closer to the backplane 1 than the main conductive pattern 4b. The adhesion between the first buffer conductive pattern 4a and the backplane 1 is larger than the adhesion between the main conductive pattern 4b and the backplane 1. The oxidation resistance of the second buffer conductive pattern 4c is larger than the oxidation resistance of the main conductive pattern 4b.

The first buffer conductive pattern 4a, the main conductive pattern 4b and the second buffer conductive pattern 4c are all capable of conduct electricity, and the main conductive pattern 4b has strong conductivity and low resistivity, and the material of the main conductive pattern 4b is, for example, copper (Cu). On a basis of ensuring that the plurality of connection leads 4 have strong conductivity and low signal losses to realize stable signal transmission, the first buffer conductive pattern 4a and the second buffer conductive pattern 4c are respectively arranged on two sides of the main conductive pattern 4b of each connection lead 4. As a result, the adhesion between the plurality of connection leads 4 and the backplane 1 is enhanced, so that the plurality of connection leads 4 are not prone to fall off. In addition, the oxidation resistance of the plurality of connection leads 4 is enhanced, so that the plurality of connection leads 4 are not prone to be corroded by moisture and oxygen, and the service life thereof may be prolonged.

In some examples, the material of the first buffer conductive pattern 4a is selected from materials with strong adhesion, such as a material having strong adhesion with glass. The material of the second buffer conductive pattern 4c is selected from materials with strong oxidation resistance. For example, the material of the first buffer conductive pattern 4a is the same as the material of the second buffer conductive pattern 4c, and the materials of the first buffer conductive pattern 4a and the second buffer conductive pattern 4c include at least one of titanium (Ti), germanium (Ge), molybdenum (Mo) and molybdenum-niobium (MoNb) alloy. For example, the materials of the first buffer conductive pattern 4a and the second buffer conductive pattern 4c are both Ti, Ge, Mo, MoNb, a mixed material of Ti and Ge, or a mixed material of Ti, Ge and Mo.

In some embodiments, as shown in FIGS. 5A, 7A, and 8A to 9B, the display panel 10 further includes a first protective adhesive layer 6, and the first protective adhesive layer 6 covers the plurality of connection leads 4. The first protective adhesive layer 6 is disposed on a side of the plurality of connection leads 4 away from the backplane 1. For example, the first protective adhesive layer 6 may fill gap regions between the plurality of connection leads 4 and cover a surface of the plurality of connection leads 4. It can be understood that, if the portions of the plurality of connection leads 4 located on the first main surface 1a of the backplane 1 need to be exposed to be bonded to the driver chip 20, it is necessary to avoid the first protective adhesive layer 6 covering the portions of the connection leads 4 to be connected to the driver chip 20. In addition, an orthographic projection of the first protective adhesive layer 6 on any surface of the display panel is generally equal to or larger than an orthographic projection of the connection leads 4 on any surface of the display panel. As shown in FIGS. 5A, 9A and 9B, in the cross section of the display panel 10, the plurality of connection leads 4 each have the "U" shape, and the first protective adhesive layer 6 also has an "U" shape. As shown in FIGS. 7A and 8A, in the cross section of the display panel 10, the plurality of connection leads 4 each have the "L" shape, and the first protective adhesive layer 6 also has an "L" shape.

The first protective adhesive layer 6 is configured to protect the plurality of connection leads 4, and play a role of electrical insulation and corrosion prevention of moisture and oxygen, so as to avoid problems of external damage, peeling, line breakage, oxidation and the like.

In some examples, a material of the first protective adhesive layer 6 is an insulating material with corrosion resistance and strong adhesion. For example, the first protective adhesive layer 6 is an over coating (OC) adhesive. For example, the material of the first protective adhesive layer 6 may include a dark OC adhesive, or a dark ink layer. The ink has high hardness and good corrosion resistance, which can protect the plurality of connection leads.

In some embodiments, as shown in FIG. 5B, in a direction perpendicular to the side sub-surface $1c1$ of the selected side surface $1cc$, a thickness $d_5$ of the first protective adhesive layer 6 is greater than or equal to 1 μm, and is less than or equal to 4.6 μm. For example, the thickness $d_5$ of the first protective adhesive layer is 1.5 μm, 2 μm or 3 μm. In the cross section of the display panel shown in FIG. 5B, the thickness $d_5$ of the first protective adhesive layer is not uniform everywhere. In the front view of the display panel 1 shown in FIG. 3, the first protective adhesive layer is disposed on the selected side surface $1cc$ of the backplane 1 and covers the plurality of connection leads 4. In some examples, considering the first protective adhesive layer corresponding to the selected side surface $1cc$ that is located on the top of the backplane 1 shown in FIG. 3 as an example, in the row direction X1, a thickness of a middle portion of the first protective adhesive layer 6 is greater than thicknesses of portions on two sides of the first protective adhesive layer 6, so that the first protective adhesive layer 6 presents a shape thicker in the middle and thinner on the two sides. For example, the thickness of the middle portion of the first protective adhesive layer 6 is 4.58 μm, and the thickness of the portions on the two sides may be, for example, 1.5 μm, 3.31 μm or 3.56 μm.

It will be noted that, the above nonuniform thickness is caused by the manufacturing process (e.g., a spraying process, a deposition process, etc.) of the first protective adhesive layer, and does not affect the function of the first protective adhesive layer 6, as long as the first protective adhesive layer can cover the plurality of connection leads 4, and the first protective adhesive layer 6 is thick enough to make the first protective adhesive layer 6 effectively protect the plurality of connection leads 4. The thickness of the first protective adhesive layer is uniform everywhere under permitted process conditions.

As a possible design, as shown in FIG. 9B, in a case where the first protective adhesive layer 6 is the dark ink layer, the display panel 10 further includes a silicon nitride film layer 8 disposed between the plurality of connection leads 4 and the first protective adhesive layer 6. The silicon nitride material has high compactness and high oxidation resistance after film-formation. The silicon nitride film layer 8 and the dark ink layer are both arranged on a side of the plurality of connection leads 4 facing away from the backplane 1, so that the plurality of connection leads 4 may be further protected, and it is possible to prevent the plurality of connection leads 4 from being corroded. Moreover, the dark ink layer is disposed on the outside, so that it is possible to ensure that the first protective adhesive layer 6 has sufficient hardness to avoid falling off due to collision, thereby enhancing the protective effect for the plurality of connection leads 4.

In some embodiments, as shown in FIGS. 7A and 8A, the display panel 10 further includes a second protective adhesive layer 9 disposed on a side of the plurality of light-emitting devices 2 facing away from the backplane 1. The second protective adhesive layer 9 includes a portion 91 covering the plurality of light-emitting devices 2 and a portion 92 filling gap regions between the plurality of light-emitting devices 2. In some embodiments, as shown in FIG. 8A, the portion 92 filling the gap regions between the plurality of light-emitting devices 2 is made of a dark adhesive, so that contrast reduction caused by a fact that external ambient light is reflected after reaching the display panel may be avoided. The portion 91 covering the plurality of light-emitting devices 2 is made of an adhesive with high light transmittance, which may prevent the plurality of light-emitting devices 2 from being damaged in subsequent processes and ensure light-exiting efficiency of the plurality of light-emitting devices 2.

In some embodiments, as shown in FIG. 7A, in a case where the light-emitting device 2 is the inorganic light-emitting diode, the portion 91 of the second protective adhesive layer 9 covering the plurality of light-emitting devices 2 and the portion 92 of the second protective adhesive layer 9 filling the gap regions between the plurality of light-emitting devices 2 may adopt the adhesive with the same material quality and the same color. Light emitted by the inorganic light-emitting diode has strong brightness, and a thickness of the portion of the second protective adhesive layer covering the plurality of light-emitting devices 2 is less than a thickness of the portion of the second protective adhesive layer filling the gap regions between the plurality of light-emitting devices 2. Therefore, it is possible to ensure high contrast without affecting the display effect. For example, the material of the second protective adhesive layer 9 may be black silica gel or black resin. For example, the black silica gel may be applied on the side of the plurality of light-emitting devices 2 facing away from the backplane 1 to cover the plurality of light-emitting devices 2, and a surface of the black silica gel may be planished to ensure the uniformity and light transmittance of the second protective adhesive layer 9.

In some examples, as shown in FIGS. 7A and 8A, the second protective adhesive layer 9 further includes a portion 93 covering the plurality of first electrodes 3. For example, in a case where the connection leads 4 each covers a portion of a respective first electrode 3 to realize electrical connection, the second protective adhesive layer 9 covers the other portion of each first electrode 3 in the plurality of first electrodes 3. The first protective adhesive layer 6 may be in contact with the second protective adhesive layer 9. For example, as shown in FIGS. 7A and 8A, in a case where there is no overlapping region between the connection lead 4 and the first electrode 3 electrically connected thereto, the second protective adhesive layer 9 covers the plurality of first electrodes 3, and the second protective adhesive layer 9 is flush with or substantially flush with a side edge of the second main surface $1b$ of the backplane 1. The connection lead 4 may extend to an end face of the second protective adhesive layer 9 flush with the side edge of the second main surface $1b$ of the backplane 1, so that the connection lead 4 can be in sufficient contact with the first electrode 3, and the first protective adhesive layer 6 is not in contact with the second protective adhesive layer 9.

Some embodiments of the present disclosure further provide a display apparatus 100. As shown in FIGS. 5A, 7A, 8A, 9A, 9B and 14, the display apparatus 100 includes the display panel 10 and the driver chip 20.

The driver chip 20 is disposed on the first main surface $1a$ of the backplane 1 of the display panel 10, and the driver chip 20 is electrically connected to the plurality of first electrodes 3 of the display panel 10 through the plurality of connection leads 4 of the display panel 10. In some embodiments, as shown in FIGS. 5A, 7A and 8A, in a case where the display panel 10 further includes the plurality of second electrodes 5, the plurality of second electrodes 5 are respectively electrically connected to the plurality of connection leads 4. The driver chip 20 is electrically connected to the plurality of second electrodes 5, so as to be electrically connected to the plurality of connection leads 4 through the plurality of second electrodes 5. It can be understood that, a thickness at a position where the second electrode 5 is bonded to the driver chip 20 may be equal to a thickness at another position of the second electrode 5; alternatively, the thickness at the position where the second electrode 5 is bonded to the driver chip 20 may be less than the thickness at the another position of the second electrode 5.

In some other embodiments, as shown in FIGS. 9A and 9B, in a case where the display panel 10 does not include the plurality of second electrodes 5, the driver chip 20 is directly electrically connected to the portions of the plurality of connection leads 4 located on the first main surface 1*a* of the backplane 1. It can be understood that, a thickness at a position where the connection leads 4 are bonded to the driver chip 20 may be equal to a thickness at another position of the connection leads 4; alternatively, the thickness at the position where the connection leads 4 are bonded to the driver chip 20 may be less than the thickness at the another position of the connection leads 4.

In the display apparatus 100 provided by the embodiments of the present disclosure, since the display panel 10 is provided therein with the plurality of connection leads 4 each connecting the first main surface 1*a* and the second main surface 1*b* of the backplane 1, the bonding region may be transferred to the back face of the display panel 10, and the driver chip 20 may be electrically connected to the front face of the display panel 10 through the plurality of connection leads 4, so as to control the display panel for display. As a result, an area of the peripheral region of the display panel 10 may be reduced, the bezel of the display apparatus 100 may be reduced, and the screen-to-body ratio may increase, thereby improving the display effect.

Figure 14:
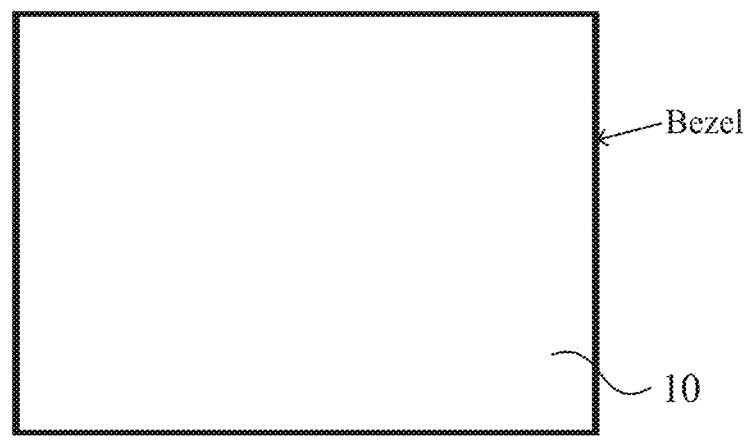
FIG. 14 is a diagram showing a structure of a display apparatus, in accordance with some embodiments of the present disclosure.

As shown in FIG. 14, the display apparatus 100 has a narrow bezel. For example, in the display panel 10, an overall thickness of a structure (including the plurality of connection leads 4 and the first protective adhesive layer 6) disposed on the selected side surface 1*cc* of the backplane 1 is in a range of 1 μm to 4 μm, inclusive, and the size of the bezel of the display apparatus 100 is much less than 1 mm.

Figure 15:
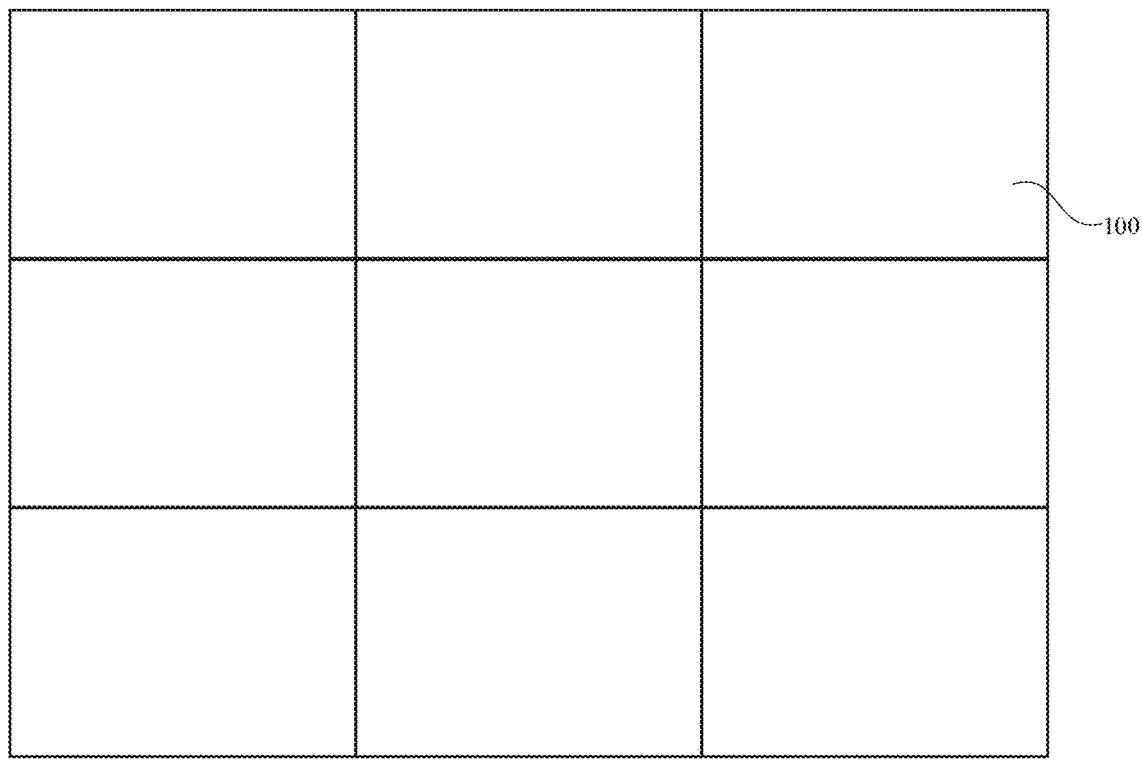
FIG. 15 is a diagram showing a structure of a tiled display apparatus, in accordance with some embodiments of the present disclosure.

Some embodiments of the present disclosure further provide a tiled display apparatus 1000. As shown in FIG. 15, the tiled display apparatus 1000 includes a plurality of display apparatuses 100 as provided by the embodiments of the present disclosure, and the plurality of display apparatuses 100 are tiled and assembled. Since each display apparatus 100 used for tiling has the bezel with a small size, a seam between two adjacent display apparatuses 100 is difficult to be found by naked eyes within a viewing distance when actually watching the tiled display apparatus 1000, and thus a good display effect may be presented.

Since the display apparatus provided by the embodiments of the present disclosure is a display apparatus with an ultra-narrow bezel, the seam between two adjacent display apparatuses is small in a case where the plurality of display apparatuses are applied to the tiled display apparatus, so that the image displayed by the tiled display apparatus is complete and the display effect of the tiled display apparatus is good.

In some embodiments, the width of the seam between two adjacent display apparatuses is in a range of 0.4 mm to 0.9 mm, inclusive, so that when the tiled display apparatus displays, the seam is difficult to be found when the tiled display apparatus is viewed by naked eyes. Thus, the display quality of the tiled display apparatus may be improved.

Figure 16A:
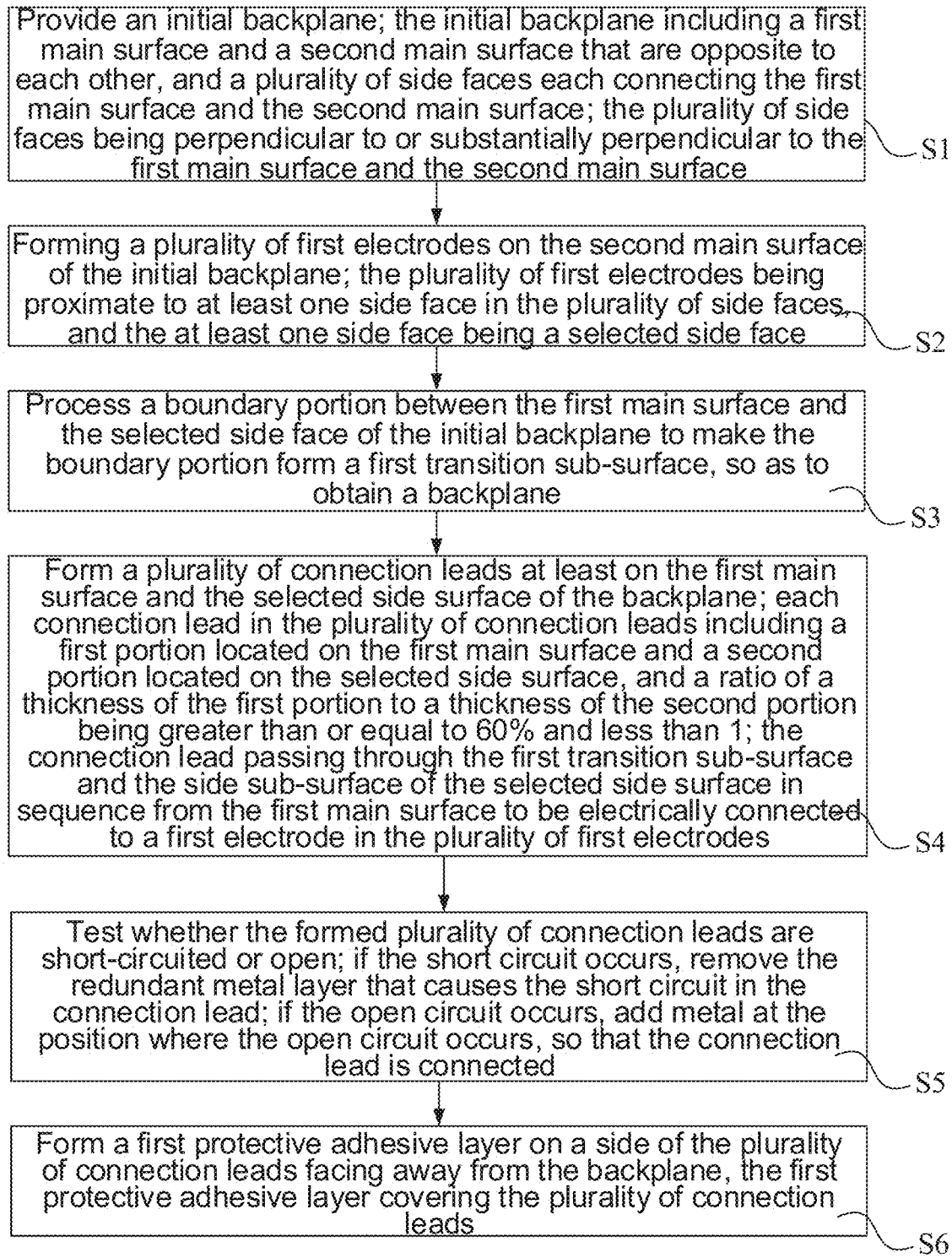
FIG. 16A is a flow diagram of a method for manufacturing a display panel, in accordance with some embodiments of the present disclosure.
Figure 16B:
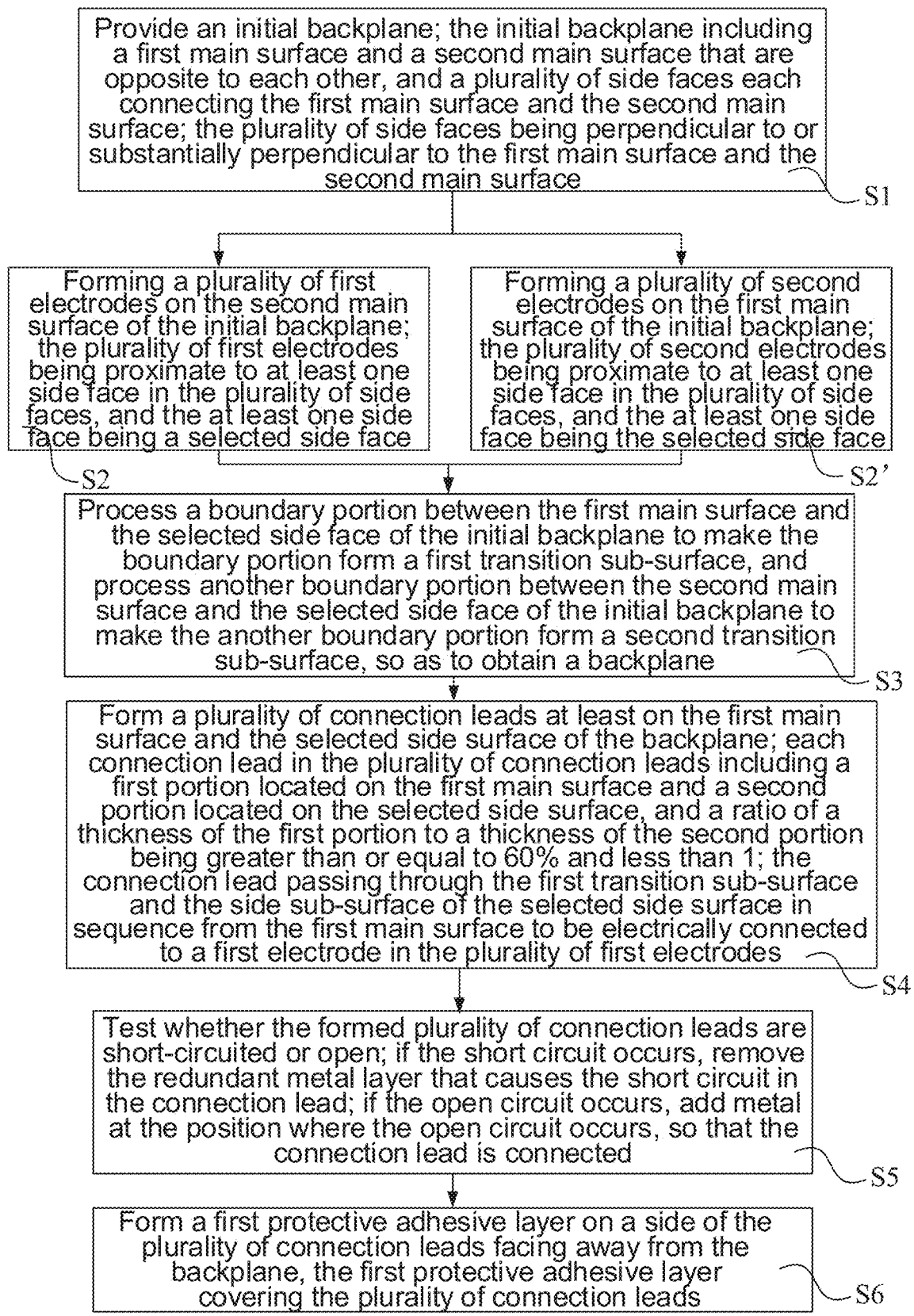
FIG. 16B is a flow diagram of another method for manufacturing a display panel, in accordance with some embodiments of the present disclosure.

Some embodiments of the present disclosure further provide a method for manufacturing a display panel. The method is used to manufacture the display panel as described in the embodiments of the present disclosure. As shown in FIGS. 16A and 16B, the method includes the following steps.

Figure 17A:
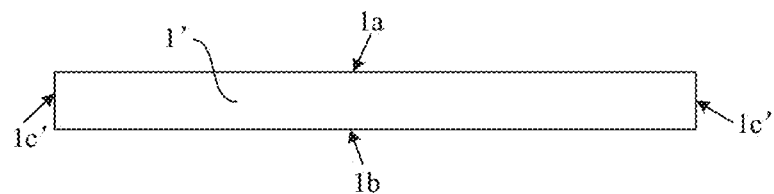
FIGS. 17A to 17F are diagrams showing a process of a method for manufacturing a display panel, in accordance with some embodiments of the present disclosure.

In S1, an initial backplane 1' is provided. As shown in FIG. 17A, the initial backplane 1' includes a first main surface 1*a* and a second main surface 1*b* that are opposite to each other, and a plurality of side faces 1*c'* each connecting the first main surface 1*a* and the second main surface 1*b*. The plurality of side faces 1*c'* are perpendicular to or substantially perpendicular to the first main surface 1*a* and the second main surface 1*b*.

The initial backplane 1' refers to a substrate on which a driving circuit layer has been formed. For example, the initial backplane 1' includes a substrate and the driving circuit layer disposed on a surface of the substrate, and a surface of the driving circuit layer away from the substrate is the second main surface 1*b* of the initial backplane 1'. The substrate is, for example, a glass substrate.

In S2, as shown in FIG. 173, a plurality of first electrodes 3 are formed on the second main surface 1*b* of the initial backplane 1'. The plurality of first electrodes 3 are proximate to at least one side face 1*c'* in the plurality of side faces 1*c'*, and the at least one side face 1*c'* is a selected side face 1*cc'*.

The at least one side face 1*c'* is a side face 1*c'* for providing a plurality of connection leads 4 thereon in subsequent steps, and the at least one side face 1*c'* is referred to as the selected side face 1*cc'*. The plurality of first electrodes 3 are proximate to a side edge, connected to the selected side face 1*cc*, in side edges of the second main surface 1*b*. For example, the initial backplane 1' has four side faces 1*c'*, in which one side face 1*c'*, two side faces 1*c'*, or three side faces 1*c'* may be the selected side face(s) 1*cc'*, or the four side faces 1*c'* are all selected side faces 1*cc'*. The plurality of first electrodes 3 are formed at a position of the second main surface 1*b* of the initial backplane 1' proximate to the selected side face 1*cc'*.

Figure 17B:
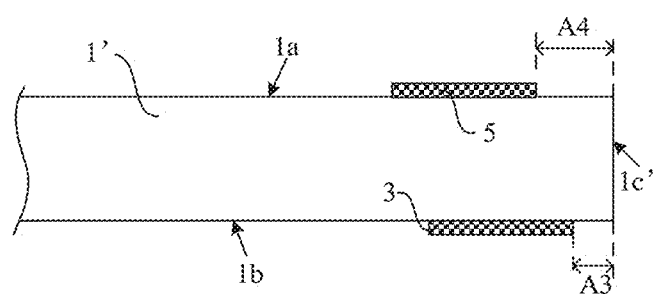

For example, there is a first preset distance A3 between an end of each first electrode 3 proximate to the selected side face 1*cc'* and a side edge of the second main surface 1*b* of the initial backplane 1' proximate to the selected side face 1*cc'*. The first preset distance A3 is set in consideration of ensuring an area of the display region of the display panel formed eventually, and thus the first preset distance A3 should not be excessively large. In addition, it is necessary to reserve a space for subsequently forming a chamfer and a fillet. As shown in FIG.17B, for example, the first preset distance A3 is in a range of 50 μm to 80 μm, inclusive.

In some embodiments, the plurality of first electrodes 3 and the driving circuit layer located on the second main surface 1*b* may be formed through a same film-forming process or a same patterning process.

Figure 17C:
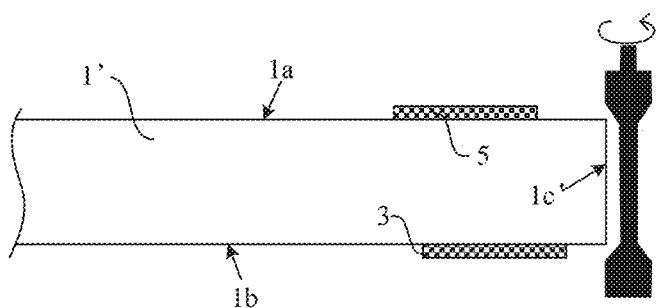
Figure 17D:
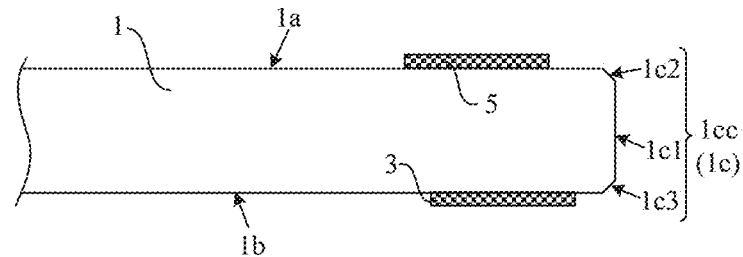

In S3, as shown in FIGS. 17C and 17D, a boundary portion between the first main surface 1*a* and the selected side face 1*cc'* of the initial backplane 1' is processed to make the boundary portion form a first transition sub-surface 1*c*2 and make the selected side face 1*cc'* form a side sub-surface 1*c*1 so as to obtain a backplane 1 The backplane 1 includes a plurality of side surfaces 1*c* each connecting the first main surface 1*a* and the second main surface 1*b*. At least one side surface 1*c* in the plurality of side surfaces 1*c* is a selected side surface 1*cc*. The selected side surface 1*cc* includes the side sub-surface 1*c*1 perpendicular to or substantially perpendicular to the first main surface 1a and the second main surface 1b, and the first transition sub-surface 1c2 connecting the side sub-surface 1c1 and the first main surface 1a. The at least one side surface 1c is referred to as the selected side surface 1cc. The first main surface 1a and the second main surface 1b of the initial backplane 1' are the first main surface 1a and the second main surface 1b of the backplane 1.

In a cross section of the backplane 1 perpendicular to the first main surface 1a and perpendicular to an edge of the backplane where the side sub-surface 1c1 is located, an included angle between a tangent at any point on the first transition sub-surface 102 and the first main surface 1a is greater than 90°, and an included angle between the tangent at any point on the first transition sub-surface 1c2 and the side sub-surface 1c1 is greater than 90°.

In some embodiments, as shown in FIGS. 16B, 17C and 17D, S3 further includes: processing a boundary portion between the second main surface 1b and the selected side face 1cc' of the initial backplane 1' to form a second transition sub-surface 1c3 connecting the second main surface 1b and the selected side face 1cc', so as to obtain the backplane. The selected side surface 1cc in the plurality of side surfaces 1c of the backplane further includes a second transition sub-surface 1c3. In the cross section of the backplane perpendicular to the second main surface 1b and perpendicular to the edge of the backplane where the side sub-surface 1c1 is located, an included angle between a tangent at any point on the second transition sub-surface 1c3 and the second main surface 1b is greater than 90°, and an included angle between a tangent at any point on the second transition sub-surface 1c3 and the side sub-surface 1c1 is greater than 90°.

In some examples, a chamfering process is used to grind the boundary portion between the first main surface 1a and the selected side face 1cc' of the initial backplane 1' to form the first transition sub-surface 1c2. Alternatively, the chamfering process is further used to grind the boundary portion between the second main surface 1b and the selected side surface 1cc' of the initial backplane 1' to form the second transition sub-surface 1c3.

For example, the first transition sub-surface 1c2 and the second transition sub-surface 1c3 are each a plane surface or a curved surface.

In a process of using the chamfering process to grind the edge, there may be pits, burrs and other defects. For example, the formed first transition sub-surface 1c2 and the formed second transition sub-surface 1c3 each have a plurality of pits, a diameter of each pit or a length of a diagonal of each pit is within 10 um. The influence of the plurality of pits on the overall flatness of the first transition sub-surface 1c2 and the second transition sub-surface 1c3 may be negligible.

In some embodiments, after S3, the method further includes: cleaning a surface of the formed backplane, so as to remove debris and oil stains existing on the surfaces of the backplane that has been ground. For example, the cleaning method may be wet cleaning, ion source cleaning, ozone cleaning, and the like. For example, in a case where the wet cleaning is used, a weak base solution of 5% potassium hydroxide (KOH) may be used to clean the surfaces of the backplane, so that the surface activity of the backplane may be improved while the oil stains are removed, thereby improving the adhesion between a metal layer and the backplane (e.g., the adhesion between the metal and the glass substrate) in the subsequent process.

Figure 17E:
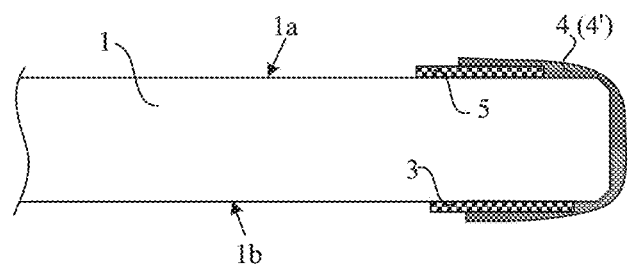
Figure 17F:
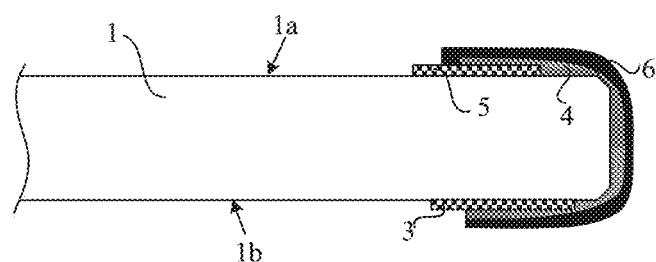

In S4, as shown in FIG. 17E, the plurality of connection leads 4 are formed at least on the first main surface 1a and the at least one side surface 1c of the backplane. Each connection lead 4 in the plurality of connection leads 4 passes through the first transition sub-surface 1c2 and the side sub-surface 1c1 of the selected side surface 1cc in sequence from the first main surface 1a of the backplane to be electrically connected to a first electrode 3 in the plurality of first electrodes 3.

In some embodiments, the plurality of connection leads 4 may be formed not only on the first main surface 1a and the selected side surface 1cc of the backplane, but also on the second main surface 1b of the backplane.

In a case where the selected side surface 1cc of the backplane further includes the second transition sub-surface 1c3, each connection lead 4 in the plurality of connection leads 4 passes through the first transition sub-surface 1c2, the side sub-surface 1c1 and the second transition sub-surface 1c3 of the side surface 1c in sequence from the first main surface 1a of the backplane to be electrically connected to the first electrode 3 in the plurality of first electrodes 3.

Figure 19:
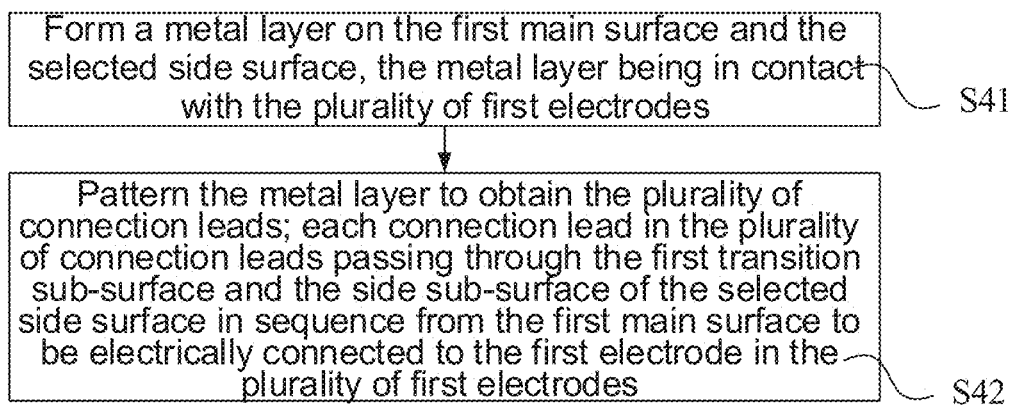
FIG. 19 is a flow diagram of yet another method for manufacturing a display panel, in accordance with some embodiments of the present disclosure.

In some embodiments, as shown in FIG. 19, forming the plurality of connection leads 4 in S4 includes the following steps.

In S41, as shown in FIG. 17E, a metal layer 4' is formed on the first main surface 1a and the selected side surface 1cc of the backplane, the metal layer is in contact with the plurality of first electrodes 3.

For example, the metal layer is formed on the first main surface 1a of the backplane, and the first transition sub-surface 1c2 and the side sub-surface 1c1 of the selected side surface 1cc of the backplane. Alternatively, the metal layer is formed on the first main surface 1a of the backplane, and the first transition sub-surface 1c2, the side sub-surface 1c1 and the second transition sub-surface 1c3 of the selected side surface 1cc of the backplane.

In a case where there is a distance between an end of the first electrode 3 proximate to the side sub-surface 1c1 and a side edge of the second main surface 1b proximate to the side sub-surface 1c1, the metal layer is further formed on the second main surface 1b of the backplane, so that the metal layer is in contact with the plurality of first electrodes 3. For example, the metal layer may cover the plurality of first electrodes 3, so that there is a large contact area between the metal layer and the plurality of first electrodes 3.

In a case where the end of the first electrode 3 proximate to the side sub-surface 1c1 is flush with or substantially flush with the side edge of the second main surface 1b proximate to the side sub-surface 1c1 the metal layer is only formed on the first main surface 1a and the at least one side surface 1c of the backplane, and is not formed on the second main surface 1b of the backplane.

For example, the metal layer may be deposited by an electroplating process, an evaporation process, a silver adhesive pad printing process, or a sputtering process (e.g., a multi-arc magnetron sputtering process), so as to form the metal layer on the first main surface 1a and the at least one side surface 1c of the backplane.

In some embodiments, the metal layer includes a first metal layer, a second metal layer and a third metal layer, and the above process is used to sequentially deposit the first metal layer, the second metal layer and the third metal layer, so as to obtain three metal layers that are stacked. The first metal layer is closer to the backplane than the second metal layer. For example, thicknesses of the first metal layer and the second metal layer are each in a range of 30 nm to 100 nm, inclusive.

The adhesion between the first metal layer and the backplane is larger than the adhesion between the second metal layer and the backplane. The oxidation resistance of the third metal layer is greater than the oxidation resistance of the second metal layer. For example, a material of the first metal layer is the same as a material of the third metal layer, and the materials of the first metal layer and the third metal layer include at least one of Ti, Ge, Mo, and MoNb. A material of the second metal layer has strong conductivity. For example, the material of the second metal layer is Cu.

In S42, the metal layer is patterned to obtain the plurality of connection leads 4. Each connection lead 4 in the plurality of connection leads 4 passes through the first transition sub-surface 1c2 and the side sub-surface 1c1 of the selected side surface 1cc in sequence from the first main surface 1a of the backplane to be electrically connected to the first electrode 3 in the plurality of first electrodes 3.

In some examples, a laser etching process with high process precision is used to pattern the metal layer, so as to obtain the plurality of connection leads 4.

In some embodiments, for the above method of using the laser etching process to pattern the metal layer, before S41, the method further includes the following step. In S40, an energy absorbing film is formed on the first main surface 1a of the backplane. For example, the energy absorbing film is formed through a deposition process, and the material of the energy absorbing film may include at least one of $SnO_2$ and ZnO. The energy absorbing film can absorb a part of laser energy in the laser etching process, so as to avoid a bulge produced on a structure on the second main surface 1b of the backplane due to the excessive laser energy, and reduce the adverse effect on the second main surface 1b of the backplane caused by the laser etching process.

In some examples, the energy absorbing film may also be formed on the selected side surface 1cc of the backplane, so as to avoid the effect of the laser etching process on other structures of the backplane.

In some other examples, a wet etching process is used to pattern the metal layer, so as to obtain the plurality of connection leads 4.

For example, a pad printing process is used to print insulating ink on the surface of the metal layer to form a protective layer with patterns, so as to protect portions of the metal layer that do not need to be etched. An automatic optical inspection equipment is used for observation and adjustment to ensure that the protective layer formed by the insulating ink is aligned with the plurality of first electrodes. The metal layer is etched, so as to retain the portions of the metal layer that are covered by the insulating ink, and form the plurality of connection leads 4.

In some cases, as shown in FIGS. 18A to 18F, the method for manufacturing the display panel may be as follows. Before forming the plurality of first electrodes 3 on the second main surface 1b of the initial backplane 1' in S2, a metal layer 4' is formed on the first main surface 1a, the second main surface 1b and the selected side face 1cc' of the initial backplane 1'. The metal layer 4' covers the selected side face 1cc' of the initial backplane 1', and a portion of the first main surface 1a of the initial backplane 1' proximate to the selected side face 1cc' and a portion of the second main surface 1b of the initial backplane 1' proximate to the selected side face 1cc'. After forming the metal layer, S2 in which the plurality of first electrodes 3 are formed on the second main surface 1b of the initial backplane 1' is performed. The plurality of first electrodes 3 are proximate to the selected side face 1cc' in the plurality of side faces 1c', and the plurality of first electrodes 3 are in contact with the metal layer. For example, the plurality of first electrodes 3 may cover a portion of the metal layer, so that there is a large contact area between the plurality of first electrodes 3 and the metal layer. That is to say, the plurality of first electrodes 3 are located on a side of the metal layer away from the initial backplane 1'. In some examples, the plurality of first electrodes 3 and the driving circuit layer located on the second main surface 1b may be formed through a same film-forming process or a same patterning process.

In some embodiments, in a case where the display panel further includes the plurality of second electrodes 5 disposed on the first main surface 1a of the backplane 1, before forming the plurality of second electrodes 5, the metal layer 4' is formed on the first main surface 1a, the second main surface 1b and the selected side face 1cc' of the initial backplane 1'. After forming the metal layer, S2' in which the plurality of second electrodes 5 are formed on the first main surface 1a of the initial backplane 1' is performed. The plurality of second electrodes 5 are proximate to the at least one selected side face 1cc' in the plurality of side faces 1c'. In the direction perpendicular to the first main surface 1a, positions of the plurality of second electrodes 5 are in one-to-one correspondence with positions of the plurality of first electrodes 3, and the plurality of second electrodes 5 are in contact with the metal layer. For example, the plurality of second electrodes 5 may cover a portion of the metal layer, so that there is a large contact area between the plurality of second electrodes 5 and the metal layer. That is to say, the plurality of second electrodes 5 are located on a side of the metal layer away from the initial backplane 1'.

Figure 18A:
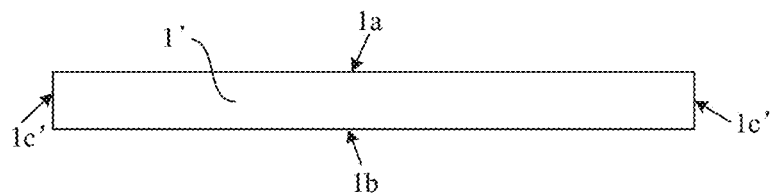
FIGS. 18A to 18F are diagrams showing a process of another method for manufacturing a display panel, in accordance with some embodiments of the present disclosure.
Figure 18B:
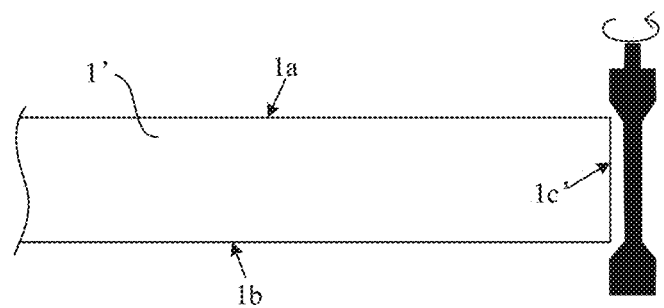
Figure 18C:
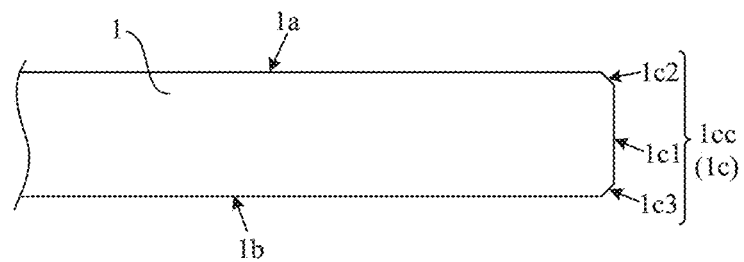
Figure 18D:
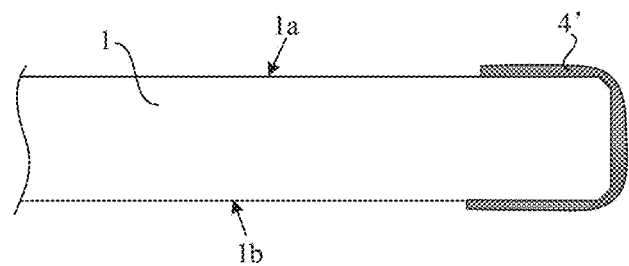

In some embodiments, as shown in FIGS. 18B and 18C, before the metal layer 4' is formed, the method further includes S3: processing the boundary portion between the first main surface 1a and the selected side face 1cc' of the initial backplane 1' to make the boundary portion form the first transition sub-surface 1c2 and make the selected side face 1cc' form the side sub-surface 1c1, so as to obtain the backplane 1. Therefore, the metal layer 4' is formed on the first main surface 1a, the second main surface 1b and the selected side surface 1cc of the backplane 1.

After the plurality of first electrodes 3 and the plurality of second electrodes 5 are obtained, S42 in which the metal layer 4' is patterned to form the plurality of connection leads 4 is performed. Each connection lead 4 in the plurality of connection leads 4 passes through the first transition sub-surface 1c2 and the side sub-surface 1c1 of the selected side surface 1cc in sequence from the first main surface 1a of the backplane 1 to be electrically connected to the first electrode 3 in the plurality of first electrodes 3. Alternatively, each connection lead 4 is further electrically connected to the second electrode 5. The method for patterning the metal layer 4' may be the laser etching process or the wet etching process as described above, and details will not be repeated here.

Figure 18E:
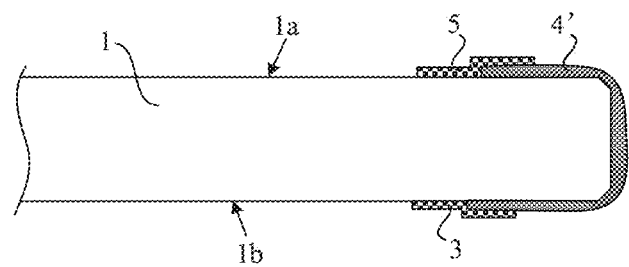
Figure 18F:
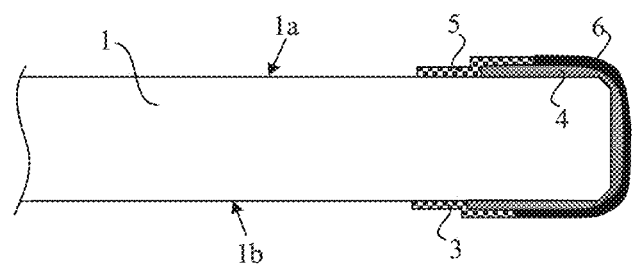

For example, referring to FIGS. 18E and 18F, in the display panel obtained by using the above method, each first electrode 3 is located on a side of a connection lead 4 electrically connected thereto away from the backplane 1, and each second electrode 5 is located on a side of a connection lead 4 electrically connected thereto away from the backplane 1.

Figure 20:
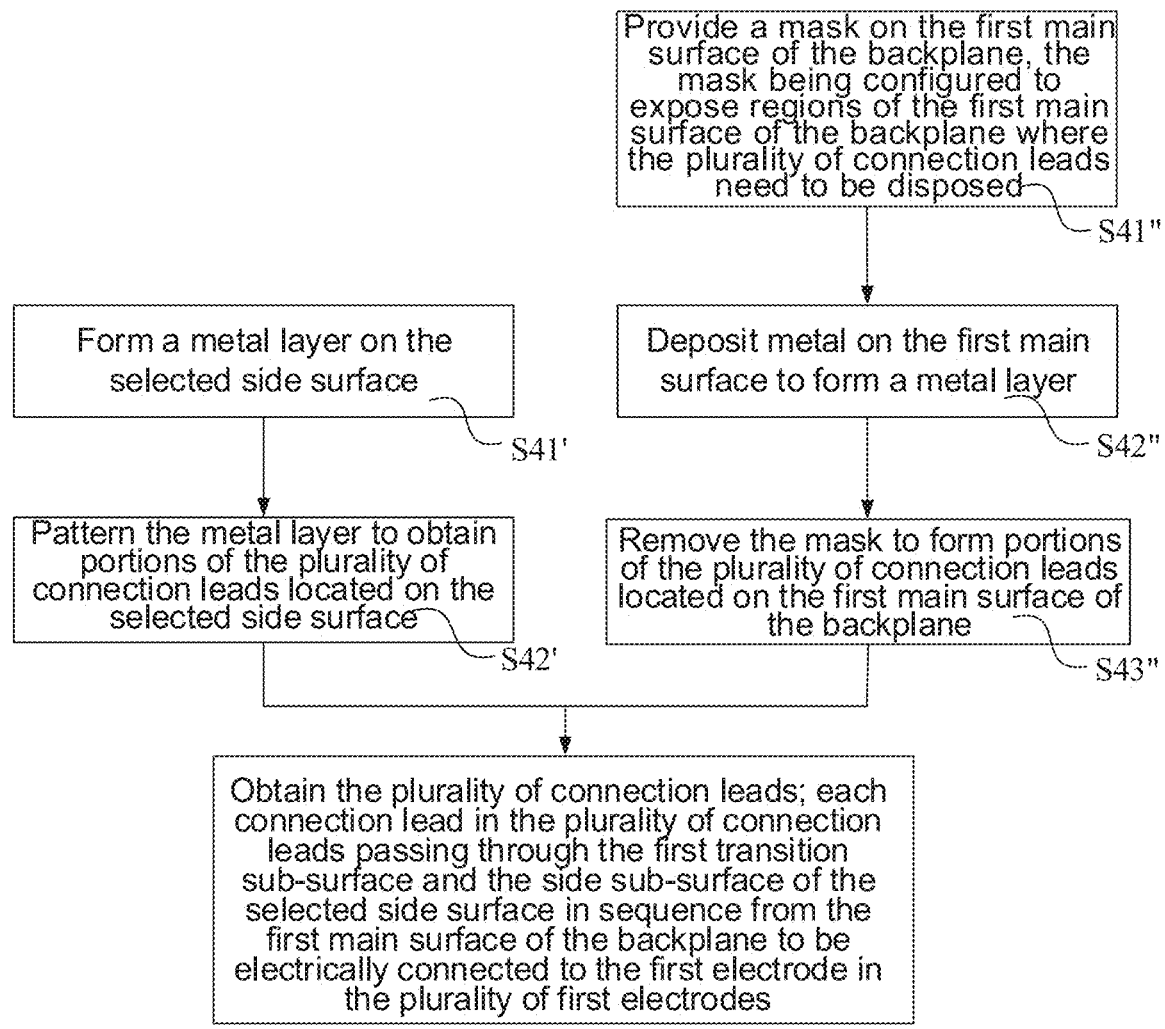
FIG. 20 is a flow diagram of yet another method for manufacturing a display panel, in accordance with some embodiments of the present disclosure.

In some other embodiments, as shown in FIG. 20, forming the plurality of connection leads 4 in S4 includes: forming portions of the plurality of connection leads 4 located on the selected side surface of the backplane 1, and forming portions of the plurality of connection leads 4 located on the first main surface 1a (and the second main surface 1b) of the backplane 1.

Forming the portions of the plurality of connection leads 4 located on the selected side surface of the backplane includes the following steps.

In S41', a metal layer is formed on the selected side surface 1cc of the backplane.

In S42', the metal layer is patterned to obtain the portions of the plurality of connection leads 4 located on the selected side surface 1cc of the backplane 1.

For the implementations of S41' and S42', reference may be made to the above descriptions of S41 and S42, and details will not be repeated here.

Forming the portions of the plurality of connection leads 4 located on the first main surface 1a (and the second main surface 1b) of the backplane 1 includes the following steps.

Figure 21A:
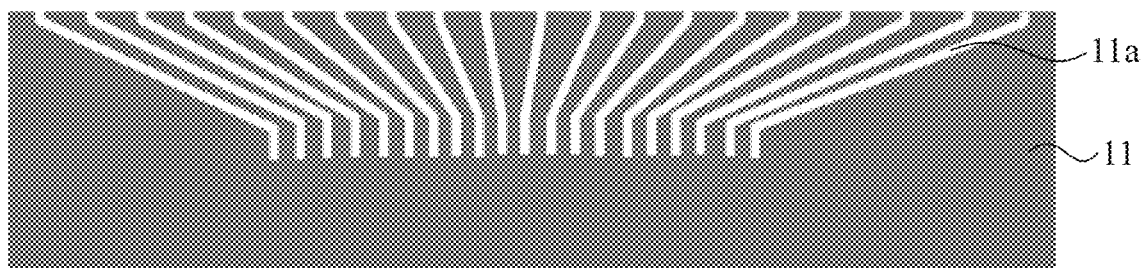
FIG. 21A is a diagram showing a structure of a mask used in a method for manufacturing a display panel, in accordance with some embodiments of the present disclosure.

In S41", as shown in FIGS. 21A and 21B, a mask 11 is provided on the first main surface 1a of the backplane, the mask is configured to expose regions of the first main surface 1a of the backplane where the plurality of connection leads 4 need to be disposed.

The mask is, for example, a mask for magnetron sputtering. For example, a material of the mask includes a polyimide or Teflon material. Patterns included in the mask can shelter regions of the first main surface 1a of the backplane where a metal layer does not need to be formed. For example, the mask may be attached to the first main surface 1a of the backplane, and exposed regions of the first main surface 1a is regions where the plurality of connection leads 4 are formed subsequently. The exposed regions of the first main surface 1a correspond to the portions of the plurality of connection leads 4 located on the selected side surface of the backplane.

In S42", metal is deposited on the first main surface 1a of the backplane to form the metal layer.

For example, the metal layer may be deposited by an electroplating process, an evaporation process, a silver adhesive pad printing process, or a sputtering process (e.g., a multi-arc magnetron sputtering process), so as to form the metal layer on the first main surface 1a of the backplane. The metal layer covers the regions of the first main surface 1a of the backplane exposed by the mask.

For example, FIGS. 21A and 21B illustrate structures of two types of masks 11. The mask 11 has a plurality of openings 11a, and the plurality of openings 11a expose the regions of the first main surface 1a of the backplane where the metal needs to be deposited. The mask 11 shown in FIG. 21A does not have a bezel 11b, and the mask 11 shown in FIG. 21B has a bezel 11b. In a case where the metal layer is formed by using the sputtering process in S42", the mask 11 shown in FIG. 21A may be suitable for various of sputtering angles, and the mask 11 shown in FIG. 21A may be suitable for a situation where the backplane 1 is placed horizontally to deposit the metal. The mask 11 with the bezel 11b helps to improve the overall flatness of the formed metal layer.

It can be understood that, the shape of the openings 11a of the mask 11 is a shape of a pattern of the portions of the plurality of connection leads 4 located on the first main surface 1a of the backplane 1. The pattern of the metal layer obtained by using the two types of masks 11 illustrated in FIGS. 21A and 21B is the same as the pattern of the portions of the plurality of connection leads 4 located on the first main surface 1a of the backplane 1 shown in FIG. 10B.

In some embodiments, the metal layer includes a first metal layer, a second metal layer, and a third metal layer. For the descriptions about the first metal layer, the second metal layer, and the third metal layer, reference may be made to the above descriptions, and details will not be repeated here.

In S43", the mask 11 is removed to form the portions of the plurality of connection leads 4 located on the first main surface 1a of the backplane 1.

In some embodiments, in a case where the plurality of connection leads 4 further includes portions of the plurality of connection leads 4 disposed on the second main surface 1b of the backplane, it is also possible to form the portions of the plurality of connection leads 4 located on the second main surface 1b of the backplane 1 by providing a mask with a corresponding pattern on the second main surface 1b of the backplane and then depositing the metal. For the steps, reference may be made to the above descriptions of S41", S42" and S43", and details will not be repeated here.

It will be noted that, a sequence of a group of S41' and S42' and a group of S41", S42" and S43" is not limited. For example, S41' (forming the metal layer on the at least one side surface 1c (the selected side surface) of the backplane) and S42" (depositing the metal on the first main surface 1a of the backplane to form the metal layer) may be performed simultaneously, so as to improve the manufacturing efficiency.

Finally, the formed portions of the plurality of connection leads 4 located on the selected side surface 1cc of the backplane 1 are respectively in contact with the portions of the plurality of connection leads 4 located on the first main surface 1a of the backplane 1, and are further respectively in contact with the portions of the plurality of connection leads 4 located on the second main surface 1b of the backplane 1, so as to obtain the plurality of connection leads 4. Each connection lead 4 in the plurality of connection leads 4 passes through the first transition sub-surface 1c2 and the side sub-surface 1c1 of the selected side surface 1cc in sequence from the first main surface 1a of the backplane to be electrically connected to the first electrode 3 in the plurality of first electrodes 3.

The above method of using the mask to form the portions of the plurality of connection leads 4 located on the first main surface 1a (and the second main surface 1b) of the backplane 1 does not need to use the laser etching process. In this way, it may avoid the adverse effect on the structures on the second main surface 1b and the first main surface 1a of the backplane due to excessive high laser energy when the laser etching process is used.

In some other embodiments, as shown in FIG. 22, forming the plurality of connection leads 4 in S4 includes the following steps.

In S4-1, a flexible mask 12 is disposed on the first main surface 1a and the selected side surface 1cc of the backplane 1, and the flexible mask 12 is configured to expose regions of the first main surface 1a and the selected side surface 1cc of the backplane where the plurality of connection lead 4 need to be disposed.

Figure 23:
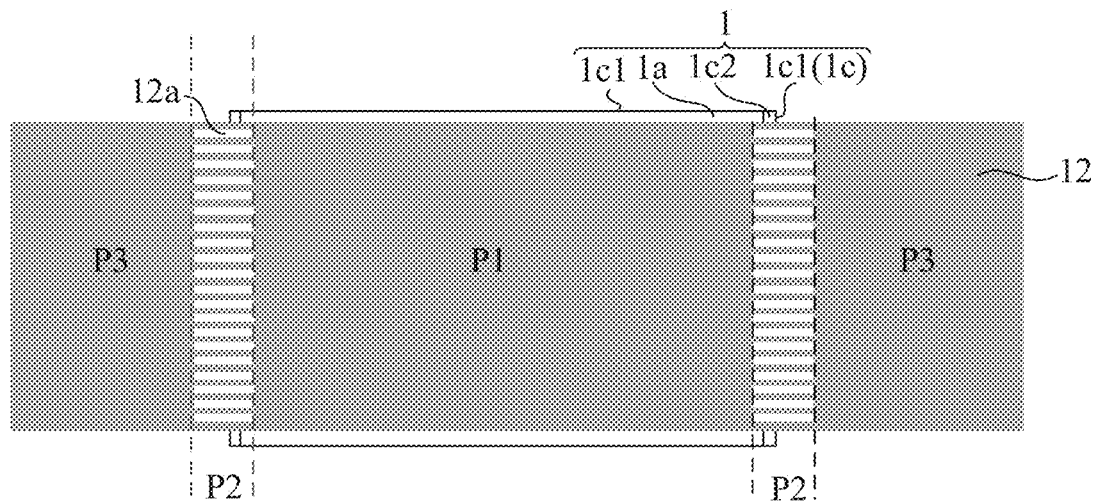
FIG. 23 is a diagram showing a structure of yet another mask used in a method for manufacturing a display panel, in accordance with some embodiments of the present disclosure.

As shown in FIG. 23, the flexible mask 12 includes a first portion P1, second portions P2 and third portions P3, and the flexible mask 12 may be attached to the surface of the backplane 1. For example, the first portion P1 is disposed on the first main surface 1a of the backplane 1, the second portions P2 are each disposed on the first main surface 1a and the at least one side surface 1c (e.g., two opposite side surfaces 1c of the backplane) of the backplane 1, and the third portions P3 are each disposed on the second main surface 1b of the backplane 1. The second portion P2 can be bent, so that the second portion P2 can be attached to the first main surface 1a of the backplane 1, and the first transition sub-surface 1c2 and the side sub-surface 1c1 of the selected side surface 1cc (or further attached to the second transition sub-surface 1c3 of the selected surface 1cc) of the backplane 1, and the third portion P3 can be attached to the second main surface 1b of the backplane. The second portion P2 has a plurality of openings 12a, and the plurality of openings 12a expose regions of the first main surface 1a and the at least one side surface 1c of the backplane where the metal needs to be deposited.

In S4-2, metal is deposited on the first main surface 1a and the selected side surface 1cc of the backplane to form a metal layer.

For example, the metal layer may be deposited by an electroplating process, an evaporation process, a silver adhesive pad printing process, or a sputtering process (e.g., a multi-arc magnetron sputtering process), so as to form the metal layer on both the first main surface 1a and the at least one side surface 1c of the backplane. The metal layer covers the regions of the first main surface 1a and the at least one side surface 1c of the backplane exposed by the flexible mask 12.

In some embodiments, the metal layer includes a first metal layer, a second metal layer, and a third metal layer. For the descriptions about the first metal layer, the second metal layer, and the third metal layer, reference may be made to the above descriptions, and details will not be repeated here.

In S4-3, the flexible mask is removed to form the plurality of connection leads 4. Each connection lead 4 in the formed plurality of connection leads 4 passes through the first transition sub-surface 1c2 and the side sub-surface 1c1 of the selected side surface 1cc in sequence from the first main surface 1a of the backplane to be electrically connected to the first electrode 3 in the plurality of first electrodes 3.

For example, the flexible mask is irradiated by an ultraviolet (UV) lamp, so that the viscosity of the material bonding the flexible mask 12 to the backplane 1 is reduced, and the flexible mask 12 is removed from the backplane 1.

In some embodiments, in a case where the plurality of connection leads 4 further includes the portions disposed on the second main surface 1b of the backplane, the flexible mask 12 is further configured to expose regions of the second main surface 1b of the backplane where the plurality of connection leads 4 need to be disposed. For example, the second portion P2 of the flexible mask 12 may be attached to the first main surface 1a, the second main surface 1b, the first transition sub-surface 1c2 and the side sub-surface 1c1 of the selected side surface 1cc of the backplane 1, and the plurality of openings 12a expose the regions of the first main surface 1a, the at least one side surface 1c and the second main surface 1b of the backplane where the metal needs to be deposited. Thus, each connection lead 4 in the formed plurality of connection leads 4 passes through the first transition sub-surface 1c2 and the side sub-surface 1c1 of the side surface 1c in sequence from the first main surface 1a of the backplane, and extends to the second main surface 1b of the backplane 1 to be electrically connected to the first electrode 3 in the plurality of first electrodes 3.

The above method of using the flexible mask to form the plurality of connection leads 4 does not need to use the laser etching process. In this way, it may avoid the adverse effect on the structures on the second main surface 1b and the first main surface 1a of the backplane due to the excessive high laser energy when the laser etching process is used. In addition, since the flexible mask can be bent and attached to the selected side surface 1cc of the backplane, it is possible to form portions of the plurality of connection leads 4 respectively located on the first main surface 1a, the at least one side surface 1c and the second main surface 1b of the backplane at one time, so as to improve the manufacturing efficiency.

In some embodiments, as shown in FIGS. 16A and 16B, the method for manufacturing the display panel further includes the following steps.

In S5, whether the formed plurality of connection leads are short-circuited or open is tested. If the short circuit occurs, the redundant metal layer that causes the short circuit in the connection lead 4 is removed. For example, the redundant metal layer may be removed by using the laser etching process. If the open circuit occurs, metal is added at the position where the open circuit occurs, so that the connection lead 4 is connected. For example, a silver printing process may be used for repairing the connection lead 4 where the open circuit occurs.

In S6, a first protective adhesive layer 6 is formed on a side of the plurality of connection leads 4 facing away from the backplane, and the first protective adhesive layer 6 covers the plurality of connection leads 4.

The first protective adhesive layer 6 is configured to protect the plurality of connection leads 4, and play a role of electrical insulation and corrosion prevention of moisture and oxygen. In some examples, the material of the first protective adhesive layer 6 is an insulating material with corrosion resistance and high adhesion. For example, the first protective adhesive layer 6 is an over coating (OC) adhesive or an ink layer. In some examples, the first protective adhesive layer 6 may be formed by using a spraying process or a deposition process.

In some embodiments, as shown in FIGS. 5A, 7A and 8A, the display panel further includes the plurality of second electrodes 5 disposed on the first main surface 1a of the backplane. Based on this, as shown in FIG. 16B, the method for manufacturing the display panel further includes: before S3, S2' in which the plurality of second electrodes 5 are formed on the first main surface 1a of the initial backplane 1' is performed. The plurality of second electrodes 5 are proximate to at least one selected side face 1cc' in the plurality of side faces 1c'. In the direction perpendicular to the first main surface 1a, positions of the plurality of second electrodes 5 are in one-to-one correspondence with positions of the plurality of first electrodes 3.

For example, one side face 1c' in the four side faces 1c' of the initial backplane 1' is the selected side face 1cc', and the plurality of first electrodes 3 and the plurality of second electrodes 5 are both proximate to the selected side surface 1cc. That is, the plurality of second electrodes 5 are formed at positions of the first main surface 1a of the initial backplane proximate to the selected side face 1cc'. An orthographic projection of each first electrode 3 on the first main surface 1a at least partially overlaps with an orthographic projection of a corresponding second electrode 5 on the first main surface 1a.

For example, as shown in FIG. 17B, there is a second preset distance A4 between an end of each second electrode 5 proximate to the selected side face 1cc' and a side edge of the second main surface 1b of the initial backplane 1' proximate to the selected side face 1cc'. The second electrode 5 is disposed on the first main surface 1a of the initial backplane 1', that is, on the back face of the manufactured display panel, and the plurality of second electrodes 5 are configured to be bonded to the driver chip or the flexible printed circuit. Therefore, the effect of positions of the plurality of second electrodes 5 on the area of the display region of the display panel may be negligible. As a result, a distance between the plurality of second electrodes 5 and the side edge of the first main surface 1a may be designed to be large. For example, the second preset distance A4 between the end of each second electrode 5 proximate to the selected side face 1cc' and the side edge of the second main surface 1b of the initial backplane proximate to the selected side face 1cc' is in a range of 400 μm to 600 μm, inclusive. In some cases, in a direction perpendicular to the first main surface 1a of the backplane 1, the positions of the plurality of second electrodes 5 are substantially in one-to-one correspondence with the positions of the plurality of first electrodes 3, and the second preset distance A4 may be equal to or substantially equal to the first preset distance A3. For example, the second preset distance A4 is in a range of 50 μm to 80 μm, inclusive.

In a case where the plurality of second electrodes 5 are formed on the first main surface 1a of the initial backplane 1', in S4 in which the plurality of connection leads 4 are formed, S41 includes: forming the metal layer on the first main surface 1a and the at least one side surface 1c of the backplane, and the metal layer is in contact with the plurality of first electrodes 3 and the plurality of second electrodes 5. In addition S42' includes: forming the metal layer on the first main surface 1a and the at least one side surface 1c of the backplane and on a surface of a shielding layer, and the metal layer is in contact with the plurality of first electrodes 3 and the plurality of second electrodes 5. As shown in FIG. 17E, each connection lead 4 in the finally formed plurality of connection leads 4 is further electrically connected to the second electrode 5.

It will be noted that, the sequence of forming the plurality of first electrodes 3 in S2 and forming the plurality of second electrodes 5 in S2' is not limited.

The manufacture of the plurality of light-emitting devices in the display panel is described below. For example, the plurality of light-emitting devices are mini light-emitting diodes (LED), and the mini light-emitting diodes are generally referred to as mini LED chips.

In some embodiments, the manufacturing of the plurality of light-emitting devices is after the manufacturing of the plurality of connection leads 4 located on the side face 1c'. That is, after the plurality of connection leads 4 are formed on the first main surface 1a and the at least one side surface 1c of the backplane, the plurality of light-emitting devices are formed on the second main surface 1b of the backplane, and the plurality of light-emitting devices are electrically connected to the plurality of first electrodes 3. For example, the plurality of mini LED chips are transferred to the second main surface 1b of the backplane. In this way, it is possible to avoid the damage caused on the plurality of light-emitting devices in the process of forming the plurality of connection leads 4.

In some other embodiments, the manufacturing of the plurality of light-emitting devices is before the manufacturing of the plurality of connection leads 4 located on the side face 1c'. For example, before S3 (S3 is referred to as the step of chamfering below), the plurality of light-emitting devices are formed on the second main surface 1b of the initial backplane 1', and the plurality of light-emitting devices are electrically connected to the plurality of first electrodes 3.

In this case, the process for manufacturing the display panel further includes: forming a second protective adhesive layer 9 on a side of the plurality of first electrodes 3 and the plurality of light-emitting devices facing away from the initial backplane 1'.

For example, the method for forming the second protective adhesive layer 9 is as follows: coating the second main surface 1b of the initial backplane 1' with a material of the second protective adhesive layer, and planishing a surface of the formed second protective adhesive layer 9, so as to form the second protective adhesive layer 9 on the whole surface of the second main surface 1b of the initial backplane 1'. The second protective adhesive layer 9 covers the plurality of light-emitting devices 2 and the plurality of first electrodes 3, and fills gap regions between the plurality of light-emitting devices 2 and gap regions between the plurality of first electrodes 3. Alternatively, an whole second protective adhesive layer 9 is attached to the second main surface 1b of the initial backplane 1', and the surface of the second protective adhesive layer is planished, so that the second protective adhesive layer 9 covers the plurality of light-emitting devices 2 and the plurality of first electrodes 3, and fills the gap regions between the plurality of light-emitting devices 2 and the gap regions between the plurality of first electrodes 3. As shown in FIGS. 7A and 8A, the second protective adhesive layer 9 can protect the plurality of light-emitting devices 2 and the plurality of first electrodes 3, so as to prevent the plurality of light-emitting devices 2 and the plurality of first electrodes 3 from being damaged in subsequent processes. For example, a chamber where the second protective adhesive layer is formed is not the same chamber as a chamber where the second protective adhesive layer is cut, and the second protective adhesive layer 9 can prevent the plurality of light-emitting devices 2 and the plurality of first electrodes 3 from being damaged in a process of being transferred between the chambers, and prevent the plurality of light-emitting devices 2 from being damaged in a process of forming the plurality of connection leads 4.

When the plurality of connection leads 4 are formed in S4, the formed plurality of connection leads 4 need to be respectively electrically connected to the plurality of first electrodes 3. Therefore, before S4, the second protective adhesive layer needs to be cut to expose portions of the plurality of first electrodes 3. For example, in a case where the initial backplane 1' has a process edge, the initial backplane 1' and the second protective adhesive layer 9 are cut at a position of ends of the plurality of first electrodes 3 facing the selected side face 1cc' of the initial backplane 1', so as to cut off the process edge of the initial backplane 1', and expose the ends of the plurality of first electrodes 3 facing the selected side face 1cc' of the initial backplane 1'. In this case, the exposed ends of the plurality of first electrodes 3 are flush with or substantially flush with the second protective adhesive layer. Moreover, the exposed ends of the plurality of first electrodes 3 are flush with or substantially flush with a side edge of the initial backplane 1' that has been cut. In a case where the initial backplane 1' has no process edge, the second protective adhesive layer 9 is cut to expose the ends of the plurality of first electrodes 3 facing the selected side face 1cc' of the initial backplane In some embodiments, a black adhesive material may be used to coat the gap regions between the plurality of light-emitting devices 2, and an adhesive material with high light transmittance may be used to coat a surface of the plurality of light-emitting devices 2 facing away from the backplane 1, so that the second protective adhesive layer 9 is formed. In this way, it may improve contrast of the display panel and ensure light-exiting efficiency of the plurality of light-emitting devices 2 while preventing the plurality of light-emitting devices 2 from being damaged in subsequent processes.

Alternatively, the material of the second protective adhesive layer 9 may be black silica gel or black resin. For example, the black silica gel is applied on a side of the plurality of light-emitting devices 2 and the plurality of first electrodes 3 facing away from the backplane 1 to cover the plurality of light-emitting devices 2 and the plurality of first electrodes 3, and a surface of the black silica gel is planished, so that a portion of the black silica gel covering the surface of the plurality of light-emitting devices 2 is planished to be thin (e.g., a thickness thereof is less than 1 mm). As a result, the black silica gel may protect the plurality of light-emitting devices 2 and the plurality of first electrodes 3, and may further ensure the light transmittance of the portion covering the surface of the plurality of light-emitting devices 2, and thus the light-exiting effect of the light-emitting devices 2 is not affected.

As a possible design, in some embodiments of the present disclosure, for the method of forming the metal layer by depositing the metal in S4 in which the plurality of connection leads 4 are formed, the embodiments of the present disclosure provides a high-efficiency method for depositing metal, which is suitable for S41 in FIG. 19, S41' and S42" in FIGS. 20, and S4-2 in FIG. 22. The description will be made by considering an example where the method for manufacturing the display panel further includes forming the plurality of second electrodes 5 on the first main surface 1a of the initial backplane and the finally formed display panel further includes the plurality of second electrodes 5. For convenience of description, the backplane 1, the plurality of first electrodes 3 and the plurality of second electrodes 5 are taken as a whole hereinafter, which is referred to as an integral backplane 21. A first main surface 1a and a second main surface 1b of the integral backplane 21 are the first main surface 1a and the second main surface 1b of the backplane 1, respectively. A high-efficiency method for manufacturing the plurality of connection leads 4 includes the following steps.

Figure 24A:
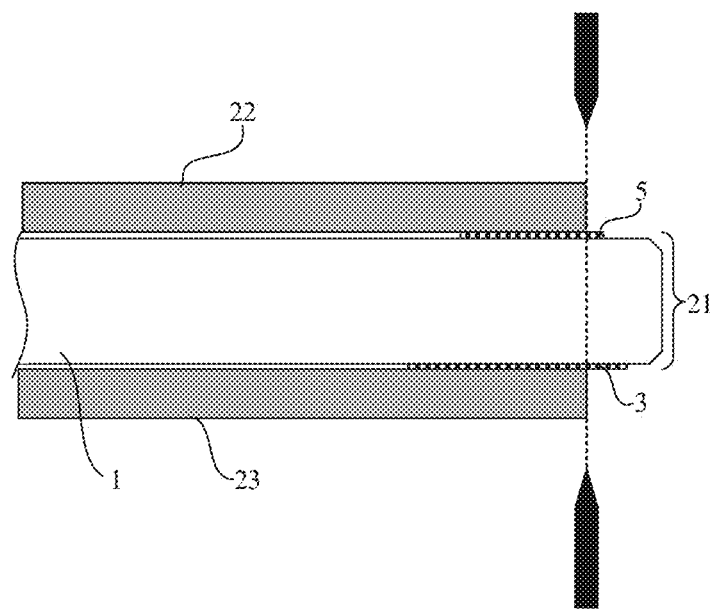
FIG. 24A is a diagram showing a step of attaching protective films in a method for manufacturing a display panel, in accordance with some embodiments of the present disclosure.
Figure 24B:
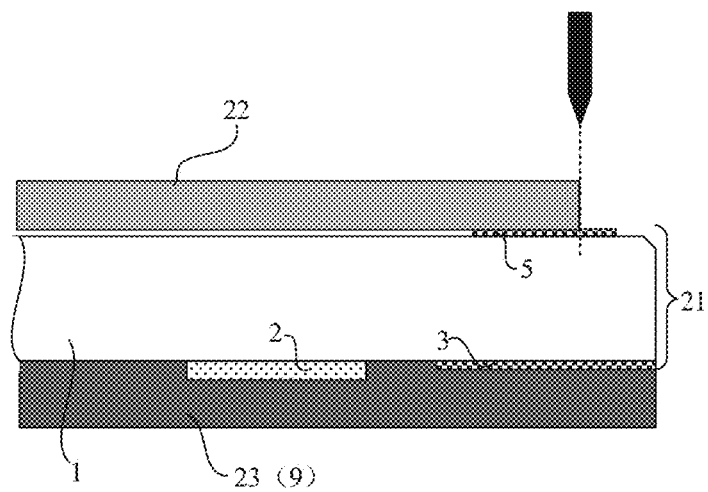
FIG. 24B is a diagram showing another step of attaching protective films in a method for manufacturing a display panel, in accordance with some embodiments of the present disclosure.

In S411, as shown in FIGS. 24A and 24B, a first protective film 22 and a second protective film 23 are respectively attached to the first main surface 1a and the second main surface 1b of the integral backplane 21, and the first protective film 22 and the second protective film 23 are cut, so that the first protective film 22 covers portions of the plurality of second electrodes 5, and other portions of the plurality of second electrodes 5 proximate to the selected side surface 1cc are exposed, and the second protective film 23 covers portions of the plurality of first electrodes 3, and other portions or ends of the plurality of first electrodes 3 proximate to the selected side surface 1cc are exposed.

Lengths of the exposed portions of the first electrodes 3 and the exposed portions of the second electrodes 5 may be designed according to actual situations. In some examples, as shown in FIG. 24A, the portion of the first electrode 3 with ⅔ length thereof and the portion of the second electrode 5 with ⅔ length thereof are both blocked, and the other portion of the first electrode 3 with ⅓ length thereof and the other portion of the second electrode 5 with ⅓ length thereof are exposed.

For a case where the manufacturing of the plurality of light-emitting devices is before the manufacturing of the plurality of connection leads 4 located on the side face 1c' in the process for manufacturing the display panel described above, that is, before S3 (the step of chamfering), the plurality of light-emitting devices are formed on the second main surface 1b of the initial backplane 1', and the plurality of light-emitting devices are electrically connected to the plurality of first electrodes 3.

In this case, as described above, the process for manufacturing the display panel further includes: forming the second protective adhesive layer 9 on the side of the plurality of first electrodes 3 and the plurality of light-emitting devices facing away from the initial backplane 1'. For example, the second protective adhesive layer 9 is black resin. As shown in FIG. 24B, the second protective adhesive layer 9 may further be used as the second protective film 23 without re-attaching the second protective film. In this way, in FIG. 24B, for example, the portion of the first electrode 3 with ⅔ length thereof is blocked, the other portion of the first electrode 3 with ⅓ length is exposed, and only an end face of the second electrode 5 facing the selected side face 1cc' of the backplane is exposed.

It will be noted that, in FIGS. 24A and 24B, there is a gap between the shown first protective film 22 and the backplane, and there is a gap between the shown second protective film 23 and the backplane 1. In fact, the thickness of the plurality of first electrodes 3 and the thickness of the plurality of second electrodes 5 are very small, and the first protective film 22 and the second protective film 23 are each in contact with the backplane, and attached to a respective surface of the backplane.

By arranging the first protective film 22 and the second protective film 23, the portions of the plurality of second electrodes 5 proximate to the selected side surface 1cc and the portions of the plurality of first electrodes 3 proximate to the selected side surface 1cc are exposed. In this way, in the subsequent process of depositing the metal layer, the metal layer may cover the exposed portions of the first electrodes 3 and the second electrodes 5 to form electrical contact, so as to prevent redundant metal from covering the plurality of first electrodes 3 and the plurality of second electrodes 5 in large areas, which may cause short circuit.

In S412, a layup structure design is performed on the integral backplane 21 attached with the first protective film 22 and the second protective film 23, so as to form a single tooling module 27. For example, as shown in FIGS. 25 to 26B, a lower cover plate 25 is disposed on a side of the second protective film 23 away from the integral backplane 21, and an upper cover plate 24 is disposed on a side of the first protective film 22 away from the integral backplane 21, so that the first protective film 22, the second protective film 23, the integral backplane 21, the upper cover plate 24 and the lower cover plate 25 constitute the single tooling module 27.

Figure 25:
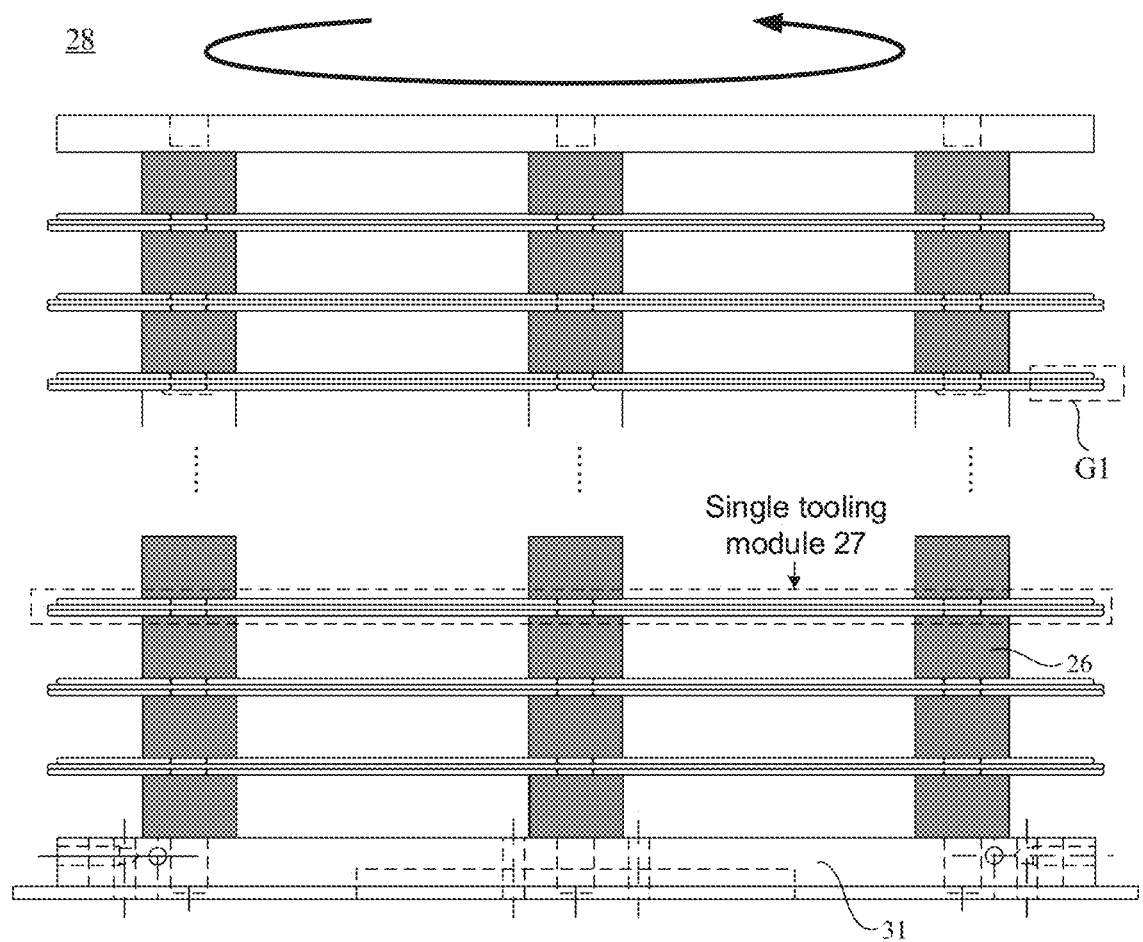
FIG. 25 is a diagram showing a structure of an integral tooling structure in a method for manufacturing a display panel, in accordance with some embodiments of the present disclosure.
Figure 26A:
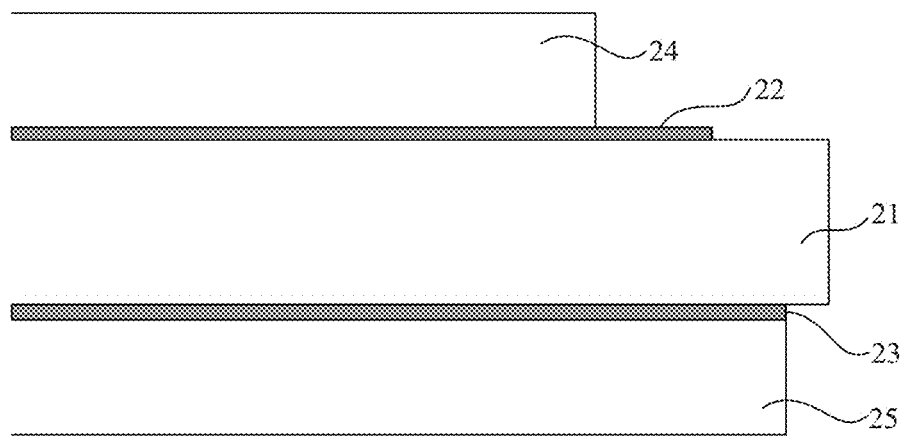
FIG. 26A is an enlarged view of a region G1 of the integral tooling structure shown in FIG. 25.
Figure 26B:
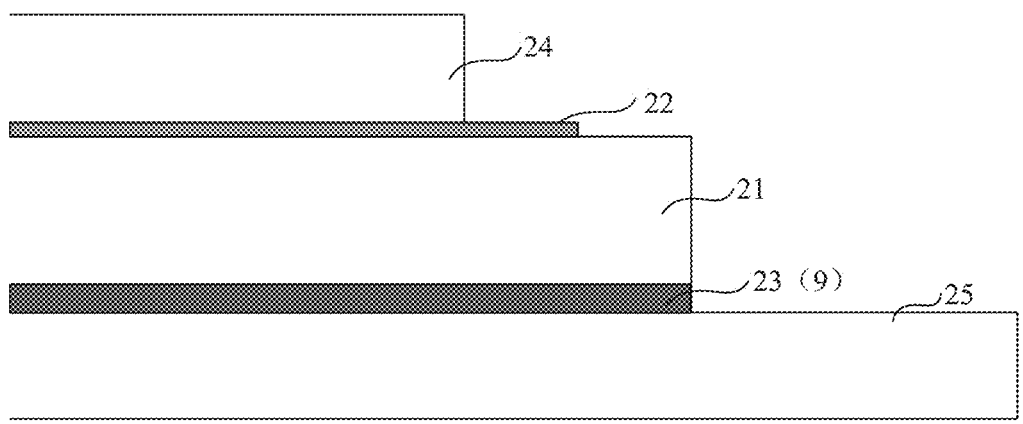
FIG. 26B is another enlarged view of a region G1 of the integral tooling structure shown in FIG. 25.

For example, FIGS. 26A and 26B are each a partial enlarged view of a region G1 of the single tooling module 27 in FIG. 25. As shown in FIG. 26A, the lower cover plate 25 is substantially flush with the second protective film 23, and the upper cover plate 24 is retracted inwardly by a range of 0.5 mm to 1 mm relative to the first protective film 22. For example, as shown in FIG. 26B, for a case where the second protective adhesive layer 9 (e.g., black resin) is further used as the second protective film 23, the lower cover plate 25 extends outwardly by a range of 1 mm to 2 mm relative to the second protective film 22, and the upper cover plate 24 is retracted inwardly by a range of 0.5 mm to 1 mm relative to the first protective film 22. With such design, it is possible to ensure that the formed metal layer has a certain thickness during the subsequent sputtering the metal layer, and further prevent metal ions from entering a tiny gap between the integral backplane 21 and the first protective film 22 or entering into a tiny gap between the integral backplane 21 and the second protective film 23, which may cause the short circuit.

In S413, a plurality of single tooling modules 27 are assembled into an integral tooling module 28, and a metal layer is sputtered on the integral tooling module 28.

For example, as shown in FIG. 25, the plurality of single tooling modules 27 are assembled by positioning columns 26, so as to form the integral tooling module 28. The integral tooling module 28 is placed on a turntable 31, so that the integral tooling module 28 rotates due to the action of the turntable 31, and thus metal is sputtered on the integral tooling module 28. For example, a metal target is located at a side face of the integral tooling module 28, and in a process of the metal target sputtering metal, the integral tooling module 28 is in rotation, so that the metal layer may be formed on exposed regions of the selected side surface 1cc and the first main surface 1a of each of backplanes of the plurality of single tooling modules. In addition, the formed metal layer on the surface of each of the backplanes of the plurality of single tooling modules has substantially the same thickness.

Since the metal target is located at the side face of the integral tooling module 28, a large amount of metal is sputtered on the selected side surface 1cc of the backplane 1, and the thickness of the formed metal layer on the selected side surface 1cc of the backplane is large. In order to improve the uniformity of an overall thickness of the metal layer, it is possible to adjust relative positions of the metal target and the integral tooling module to improve the uniformity of the thickness of the formed metal layer. For example, a ratio of a thickness of the formed metal layer on the exposed region of the first main surface 1a of the backplane to a thickness of the formed metal layer on the selected side surface 1cc of the backplane is controlled to be in a range of 0.6 and 1.6, so that a thickness difference between different positions is not excessively large.

In some embodiments, if the metal layer needs to be formed only on one or two side surfaces 1c of the backplane, that is, in a case where the formed display panel only includes one or two selected side surfaces 1cc, before sputtering the metal layer on the integral tooling module, other side surfaces 1c of the backplane need to be sheltered, so as to prevent the other side surfaces 1c from being covered by the metal layer.

After the display panel is obtained by the method for manufacturing the display panel in some embodiments of the present disclosure, the driver chip or the flexible printed circuit is bonded to the first main surface of the backplane, so as to obtain the display apparatus with an ultra-narrow bezel.

For example, the driver chip or the flexible printed circuit may be bonded to the plurality of second electrodes or bonded to portions of the plurality of connection leads located on the first surface of the backplane, so that the driver chip or the flexible printed circuit may be disposed on the back face of the display panel.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
    a backplane, the backplane including a first main surface and a second main surface that are opposite to each other, and a plurality of side surfaces each connecting the first main surface and the second main surface; at least one side surface in the plurality of side surfaces being a selected side surface;
    a plurality of light-emitting devices disposed on the second main surface of the backplane;
    a plurality of first electrodes disposed on the second main surface of the backplane; the plurality of first electrodes being closer to the selected side surface than the plurality of light-emitting devices, and the plurality of first electrodes being electrically connected to the plurality of light-emitting devices; and
    a plurality of connection leads disposed at least on the first main surface and the selected side surface of the backplane; each connection lead in the plurality of connection leads including a first portion located on the first main surface and a second portion located on the selected side surface, and a ratio of a thickness of the first portion to a thickness of the second portion being in a range of 0.6 to 1.6, inclusive; the connection lead passing through the selected side surface from the first main surface to be electrically connected to a first electrode in the plurality of first electrodes, and the connection lead being not in contact with an end of the first electrode of the plurality of first electrodes away from the selected side surface.

2. The display panel according to claim 1, wherein the selected side surface includes a side sub-surface substantially perpendicular to the first main surface and the second main surface, and a first transition sub-surface connecting the first main surface and the side sub-surface;
    in a cross section of the backplane perpendicular to the first main surface and perpendicular to an edge of the backplane where the side sub-surface is located, an included angle between a tangent at any point on the first transition sub-surface and the first main surface is greater than 90°, and another included angle between the tangent at any point on the first transition sub-surface and the side sub-surface is greater than 90°; and
    the connection lead passes through the first transition sub-surface and the side sub-surface of the selected side surface in sequence from the first main surface to be electrically connected to the first electrode in the plurality of first electrodes.

3. The display panel according to claim 2, wherein an end of the first electrode proximate to the selected side surface is substantially flush with a side edge of the second main surface proximate to the selected side surface; and
    the connection lead passes through the first transition sub-surface and the side sub-surface of the selected side surface in sequence from the first main surface, and extends to the side edge of the second main surface proximate to the selected side surface to be electrically connected to the first electrode.

4. The display panel according to claim 2, wherein an end of the first electrode proximate to the selected side surface and a side edge of the second main surface proximate to the selected side surface have a distance therebetween;
    the connection lead further includes a third portion located on the second main surface, and a ratio of a thickness of the third portion to the thickness of the second portion is in a range of 0.6 and 1.6, inclusive; and
    the connection lead passes through the first transition sub-surface and the side sub-surface of the selected side surface in sequence from the first main surface, and extends to the second main surface to be electrically connected to the first electrode.

5. The display panel according to claim 2, wherein the selected side surface further includes a second transition sub-surface connecting the side sub-surface and the second main surface;

in the cross section of the backplane perpendicular to the first main surface and perpendicular to the edge of the backplane where the side sub-surface is located, an included angle between a tangent at any point on the second transition sub-surface and the second main surface is greater than 90°, and an included angle between the tangent at any point on the second transition sub-surface and the side sub-surface is greater than 90°; and the connection lead passes through the first transition sub-surface, the side sub-surface and the second transition sub-surface of the selected side surface in sequence from the first main surface to be electrically connected to the first electrode.

6. The display panel according to claim 1, further comprising a plurality of second electrodes disposed on the first main surface, wherein each connection lead in the plurality of connection leads is electrically connected to a second electrode in the plurality of second electrodes; or the display panel further comprising the plurality of second electrodes disposed on the first main surface, wherein each connection lead in the plurality of connection leads is electrically connected to the second electrode in the plurality of second electrodes; and orthographic projections, on the first main surface, of a first electrode and a second electrode that are electrically connected to a same connection lead at least partially overlap.

7. The display panel according to claim 1, wherein the first main surface of the backplane has a bonding region; and portions of the plurality of connection leads located on the first main surface extend to the bonding region.

8. The display panel according to claim 7, wherein a length of the bonding region is substantially equal to a length of a side edge of the first main surface proximate to the selected side surface; and in a direction from the side edge of the first main surface proximate to the selected side surface to the bonding region, the portions of the plurality of connection leads located on the first main surface extend to the bonding region; or the length of the bonding region is less than the length of the side edge of the first main surface proximate to the selected side surface; and in the direction from the side edge of the first main surface proximate to the selected side surface to the bonding region, the portions of the plurality of connection leads located on the first main surface converge on the bonding region.

9. The display panel according to claim 1, further comprising a plurality of signal lines disposed on the second main surface of the backplane; the plurality of first electrodes are electrically connected to the plurality of light-emitting devices through the plurality of signal lines;

a width of the first electrode is substantially same as a width of a signal line electrically connected thereto; and the connection lead further includes a third portion located on the second main surface, a width of the third portion is substantially same as a width of a signal line electrically connected thereto.

10. The display panel according to claim 9, wherein a width of the first portion of the connection lead is substantially same as the width of the third portion of the connection lead; and a width of the second portion of the connection lead is greater than the width of the first portion of the connection lead and greater than the width of the third portion of the connection lead.

11. The display panel according to claim 2, wherein the at least one side surface as the selected side surface includes at least two side surfaces as selected side surfaces; portions of at least part of the plurality of connection leads located on a same selected side surface are arranged at equal intervals in a direction parallel to an edge of the backplane where a side sub-surface of the same selected side surface is located; and a distance between two adjacent connection leads in connection leads located on a selected side surface in the at least two side surfaces is different from another distance between two adjacent connection leads in connection leads located on another selected side surface in the at least two side surfaces.

12. The display panel according to claim 1, further comprising an energy absorbing film disposed between the backplane and the plurality of connection leads; or the display panel further comprising the energy absorbing film disposed between the backplane and the plurality of connection leads, a material of the energy absorbing film including at least one of tin dioxide and zinc oxide.

13. The display panel according to claim 1, wherein each connection lead in the plurality of connection leads includes a first buffer conductive pattern, a main conductive pattern and a second buffer conductive pattern that are sequentially stacked, and the first buffer conductive pattern is closer to the backplane than the main conductive pattern; adhesion between the first buffer conductive pattern and the backplane is greater than adhesion between the main conductive pattern and the backplane; and oxidation resistance of the second buffer conductive pattern is greater than oxidation resistance of the main conductive pattern; or each connection lead in the plurality of connection leads includes the first buffer conductive pattern, the main conductive pattern and the second buffer conductive pattern that are sequentially stacked, and the first buffer conductive pattern is closer to the backplane than the main conductive pattern; the adhesion between the first buffer conductive pattern and the backplane is greater than the adhesion between the main conductive pattern and the backplane; and the oxidation resistance of the second buffer conductive pattern is greater than the oxidation resistance of the main conductive pattern; a material of the first buffer conductive pattern is same as a material of the second buffer conductive pattern, and the material of the first buffer conductive pattern and the material of the second buffer conductive pattern each include at least one of titanium, germanium, molybdenum and molybdenum-niobium alloy.

14. The display panel according to claim 1, further comprising a first protective adhesive layer, the first protective adhesive layer covering the plurality of connection leads; and/or the display panel further comprising a second protective adhesive layer disposed on a side of the plurality of light-emitting devices facing away from the backplane, the second protective adhesive layer covering the plurality of light-emitting devices and the plurality of first electrodes, and filling gap regions between the plurality of light-emitting devices and the plurality of first electrodes.

15. A display apparatus, comprising:
the display panel according to claim 1; and a driver chip, the driver chip being disposed on the first main surface of the backplane of the display panel, and the driver chip being electrically connected to the plurality of first electrodes in the display panel through the plurality of connection leads in the display panel.

16. The display apparatus according to claim 15, wherein the display panel further includes a plurality of second electrodes disposed on the first main surface, each connection lead in the plurality of connection leads is electrically connected to a second electrode in the plurality of second electrodes, and the driver chip is electrically connected to the plurality of second electrodes; or the driver chip is electrically connected to a portion of each of the plurality of connection leads located on the first main surface of the backplane.

17. A tiled display apparatus comprising a plurality of display apparatuses according to claim 15, and the plurality of display apparatuses being tiled together.

18. A method for manufacturing a display panel, comprising:

providing an initial backplane, wherein the initial backplane includes a first main surface and a second main surface that are opposite to each other, and a plurality of side faces each connecting the first main surface and the second main surface; the plurality of side faces are substantially perpendicular to the first main surface and the second main surface;

forming a plurality of first electrodes on the second main surface of the initial backplane, wherein the plurality of first electrodes are proximate to at least one side face in the plurality of side faces, and the at least one side face is a selected side face;

processing a boundary portion between the first main surface and the selected side face of the initial backplane to make the boundary portion form a first transition sub-surface, so as to obtain a backplane, wherein the backplane includes the first main surface and the second main surface, and a plurality of side surfaces each connecting the first main surface and the second main surface, the plurality of side surfaces are formed by the plurality of side faces, and at least one side surface formed by the selected side face in the plurality of side surfaces is a selected side surface; the selected side surface includes the side sub-surface substantially perpendicular to the first main surface and the second main surface, and the first transition sub-surface connecting the first main surface and the side sub-surface; in a cross section of the backplane perpendicular to the first main surface and perpendicular to an edge of the backplane where the side sub-surface is located, an included angle between a tangent at any point on the first transition sub-surface and the first main surface is greater than 90°, and an included angle between a tangent at any point on the first transition sub-surface and the side sub-surface is greater than 90°; and forming a plurality of connection leads at least on the first main surface and the selected side surface of the backplane, wherein each connection lead in the plurality of connection leads includes a first portion located on the first main surface and a second portion located on the selected side surface, and a ratio of a thickness of the first portion to a thickness of the second portion is in a range of 0.6 to 1.6, inclusive; the connection lead passes through the first transition sub-surface and the side sub-surface of the selected side surface in sequence from the first main surface to be electrically connected to a first electrode in the plurality of first electrodes, and the connection lead is not in contact with an end of the first electrode of the plurality of first electrodes away from the selected side surface.

19. The method according to claim 18, wherein forming the plurality of connection leads at least on the first main surface and the selected side surface of the backplane includes:

forming a metal layer at least on the first main surface and the selected side surface, the metal layer being in contact with the plurality of first electrodes; and patterning the metal layer to form the plurality of connection leads.

20. The method according to claim 18, wherein the plurality of connection leads include portions located on the selected side surface and portions located on the first main surface; forming the plurality of connection leads at least on the first main surface and the selected side surface of the backplane includes:

forming a metal layer on the selected side surface;

patterning the metal layer to obtain the portions of the plurality of connection leads located on the selected side surface;

providing a mask on the first main surface, the mask being configured to expose regions of the first main surface where the plurality of connection leads need to be disposed;

depositing metal on the first main surface to form another metal layer; and removing the mask to form the portions of the plurality of connection leads located on the first main surface, so as to obtain the plurality of connection leads; the portions of the plurality of connection leads located on the first main surface being electrically connected to the portions of the plurality of connection leads located on the selected side surface.

* * * * *